US012641784B2

(12) United States Patent
Zhang et al.

(10) Patent No.: US 12,641,784 B2
(45) Date of Patent: May 26, 2026

(54) MEMORY DEVICES AND METHODS FOR FORMING THE SAME

(71) Applicant: YANGTZE MEMORY TECHNOLOGIES CO., LTD., Wuhan (CN)

(72) Inventors: Kun Zhang, Wuhan (CN); Yuancheng Yang, Wuhan (CN); Wenxi Zhou, Wuhan (CN); Zhiliang Xia, Wuhan (CN); Dongxue Zhao, Wuhan (CN); Tao Yang, Wuhan (CN); Lei Liu, Wuhan (CN); Di Wang, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 579 days.

(21) Appl. No.: 18/092,777

(22) Filed: Jan. 3, 2023

(65) Prior Publication Data

US 2024/0215235 A1      Jun. 27, 2024

(30) Foreign Application Priority Data

Dec. 26, 2022      (CN) .......................... 202211686619.3

(51) Int. Cl.
| | |
|---|---|
| *H10B 41/40* | (2023.01) |
| *H01L 23/528* | (2006.01) |
| *H10B 41/27* | (2023.01) |
| *H10B 43/27* | (2023.01) |
| *H10B 43/40* | (2023.01) |

(52) U.S. Cl.
CPC ......... *H10B 41/40* (2023.02); *H01L 23/5283* (2013.01); *H10B 41/27* (2023.02); *H10B 43/27* (2023.02); *H10B 43/40* (2023.02)

(58) Field of Classification Search
CPC ........ H10B 41/40; H10B 41/27; H10B 43/27; H01L 23/5283
See application file for complete search history.

(56) References Cited

U.S. PATENT DOCUMENTS

| | | | | |
|---|---|---|---|---|
| 10,354,980 | B1 * | 7/2019 | Mushiga | .............. H01L 23/5226 |
| 10,651,153 | B2 * | 5/2020 | Fastow | .................. G11C 16/08 |
| 12,016,172 | B2 * | 6/2024 | Harada | .................. G11C 11/40 |
| 12,108,589 | B2 * | 10/2024 | Sakui | ..................... H10B 12/05 |
| 12,170,258 | B2 * | 12/2024 | Yang | ..................... H10B 63/34 |
| 12,363,883 | B2 * | 7/2025 | Sakui | ................. G11C 11/4091 |
| 12,369,300 | B2 * | 7/2025 | Kakumu | ............... G11C 11/404 |
| 2005/0280061 | A1 * | 12/2005 | Lee | ..................... H10B 12/315 257/296 |

(Continued)

FOREIGN PATENT DOCUMENTS

WO      WO-2022162870 A1 *  8/2022  ............. H10B 12/00

*Primary Examiner* — Joseph C. Nicely
(74) *Attorney, Agent, or Firm* — BAYES PLLC

(57) ABSTRACT

A memory device includes an array of memory cells disposed on a first side of a first semiconductor layer, and a pad-out structure disposed on the array of memory cells. Each of the memory cells includes a semiconductor body extending in a first direction, a first terminal in contact with the first side of the first semiconductor layer and a second terminal are formed at both ends of the semiconductor body; a word line extending in a second direction perpendicular to the first direction; and a plate line extending in the second direction.

20 Claims, 63 Drawing Sheets

(56) References Cited

U.S. PATENT DOCUMENTS

| | | | | |
|---|---|---|---|---|
| 2017/0330623 A1* | 11/2017 | Kim | | G11C 11/5628 |
| 2019/0043836 A1* | 2/2019 | Fastow | | H01L 25/0657 |
| 2019/0081068 A1* | 3/2019 | Huang | | H10B 43/27 |
| 2020/0286842 A1* | 9/2020 | Sanuki | | H01L 24/09 |
| 2020/0409592 A1* | 12/2020 | Yang | | G11C 16/0483 |
| 2021/0135010 A1* | 5/2021 | Yamazaki | | H10B 43/27 |
| 2022/0328089 A1* | 10/2022 | Sakui | | G11C 11/4023 |
| 2022/0328488 A1* | 10/2022 | Sakui | | G11C 11/4097 |
| 2022/0359521 A1* | 11/2022 | Sakui | | H10B 12/05 |
| 2022/0366986 A1* | 11/2022 | Sakui | | G11C 16/0483 |
| 2022/0367467 A1* | 11/2022 | Harada | | H10B 12/20 |
| 2022/0367469 A1* | 11/2022 | Sakui | | H10B 12/05 |
| 2023/0005865 A1* | 1/2023 | Liu | | H01L 24/80 |
| 2023/0039991 A1* | 2/2023 | Kakumu | | G11C 16/14 |
| 2023/0046352 A1* | 2/2023 | Harada | | H10B 12/20 |
| 2023/0120181 A1* | 4/2023 | Sakui | | G11C 11/4094 365/189.011 |
| 2023/0145678 A1* | 5/2023 | Shirota | | H10B 12/33 365/129 |
| 2023/0328983 A1* | 10/2023 | Yeom | | H10B 43/27 |
| 2024/0206148 A1* | 6/2024 | Zhang | | H10B 43/27 |
| 2024/0206181 A1* | 6/2024 | Wang | | H10B 41/40 |
| 2024/0212753 A1* | 6/2024 | Zhang | | H10B 80/00 |
| 2024/0215234 A1* | 6/2024 | Wang | | H10B 41/27 |
| 2024/0215273 A1* | 6/2024 | Yang | | H10B 43/40 |

* cited by examiner

100

101

200

300

301

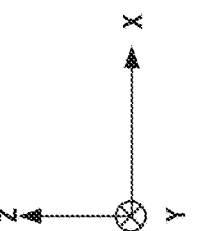
FIG. 7

104

490

402

414

412

492
408

410

410

410

410

406

404

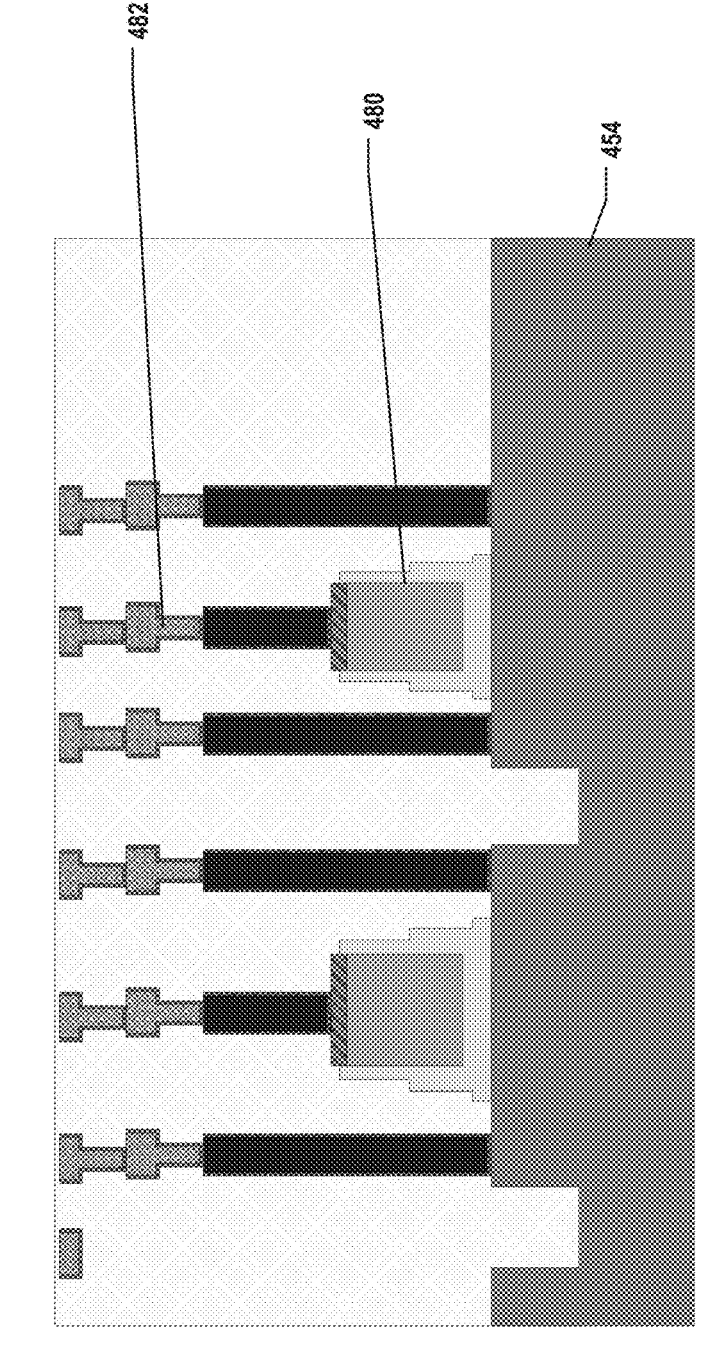
FIG. 11
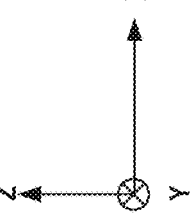

1400

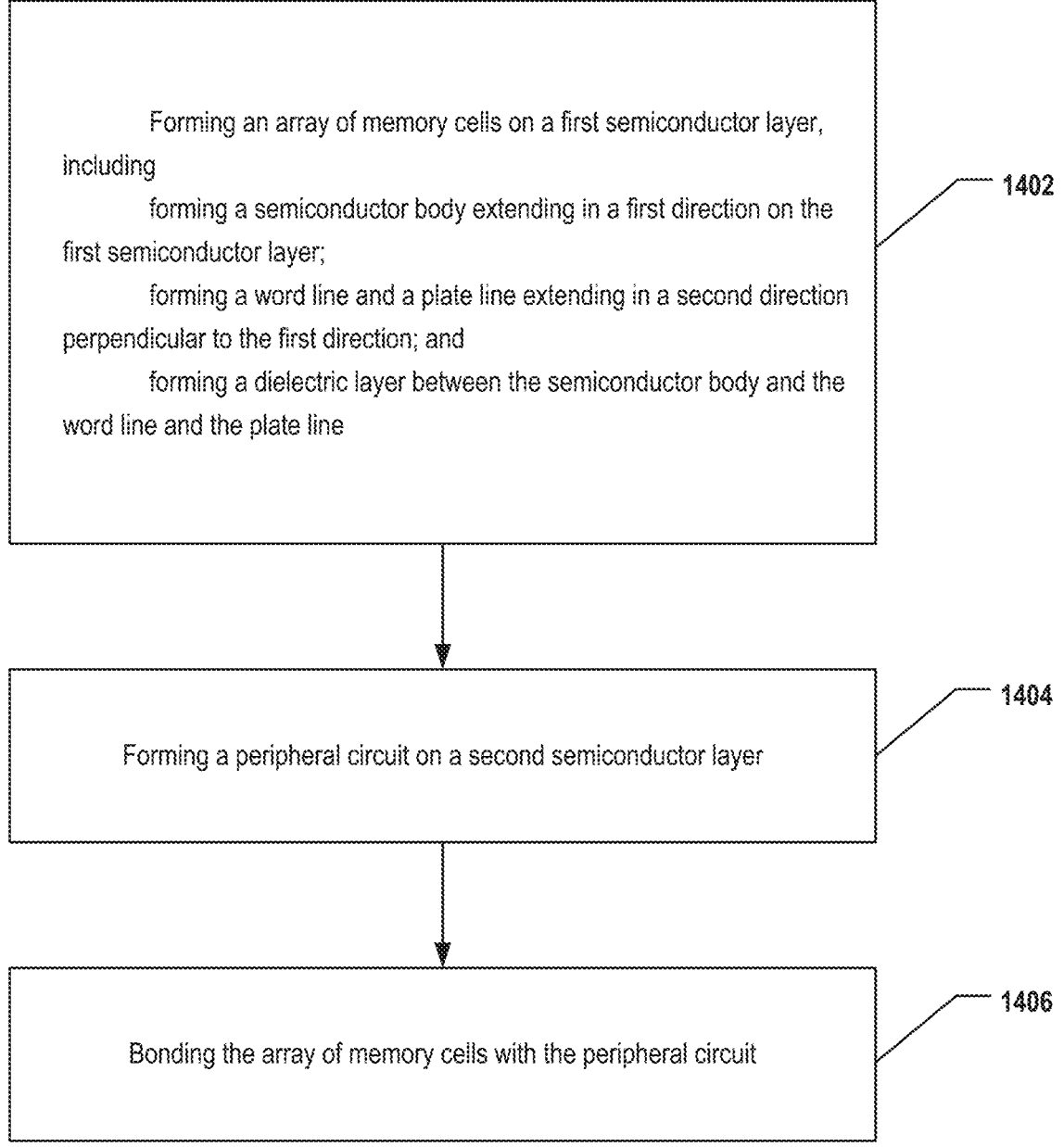

Forming an array of memory cells on a first semiconductor layer, including forming a semiconductor body extending in a first direction on the first semiconductor layer;

forming a word line and a plate line extending in a second direction perpendicular to the first direction; and forming a dielectric layer between the semiconductor body and the word line and the plate line

1402

Forming a peripheral circuit on a second semiconductor layer

1404

Bonding the array of memory cells with the peripheral circuit

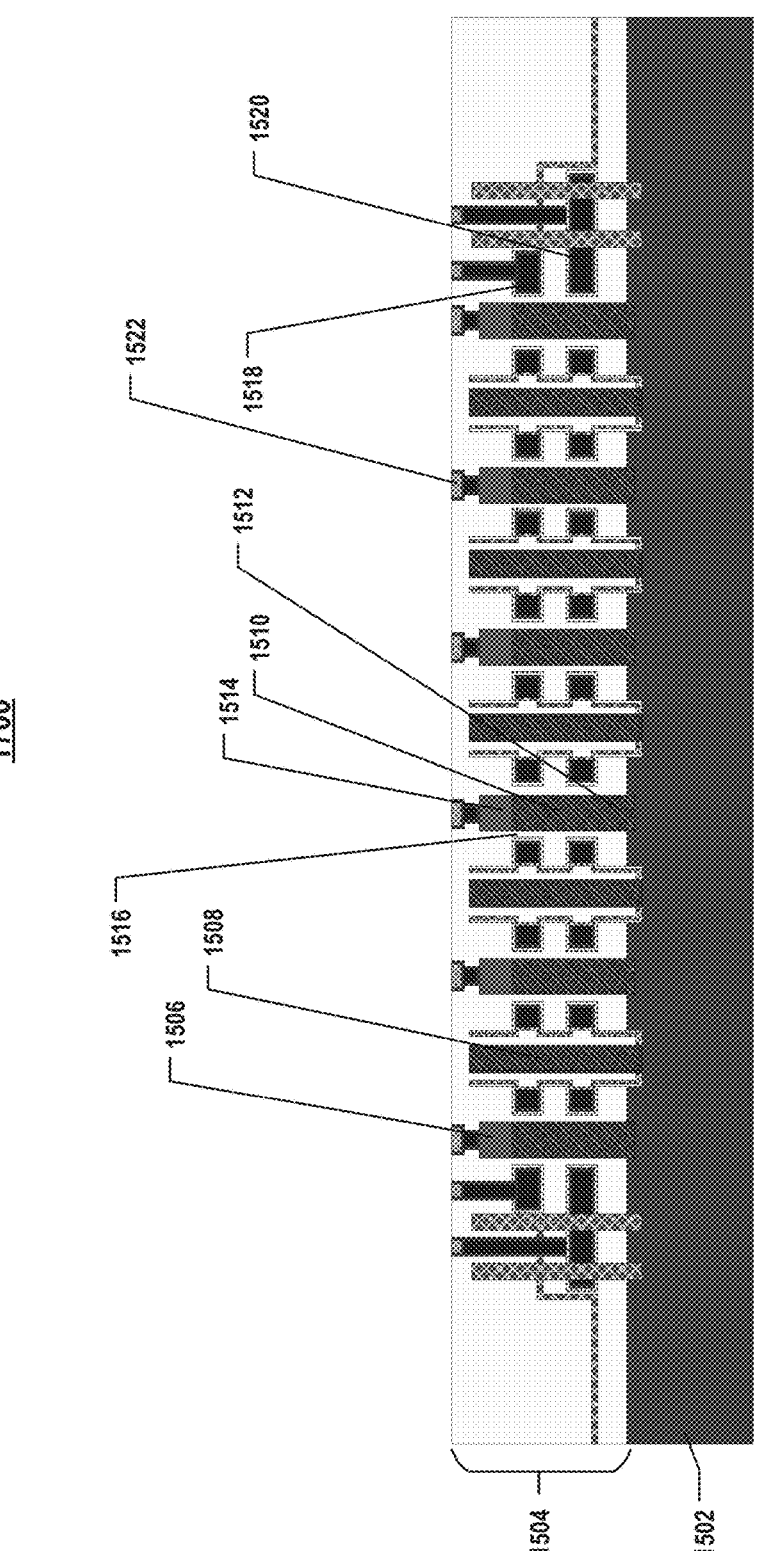
1700
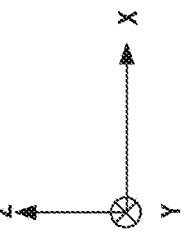
FIG. 17

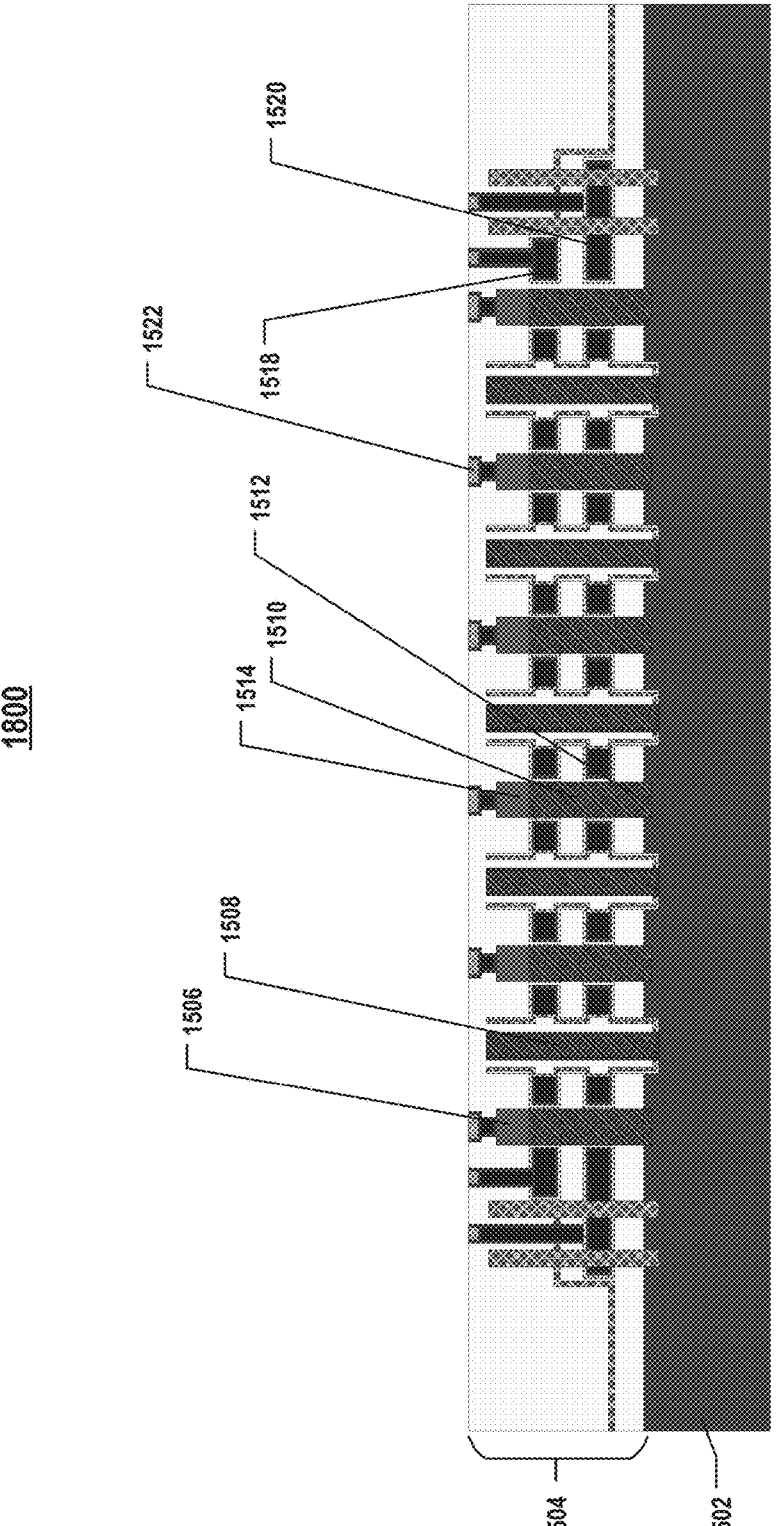
1800
FIG. 18
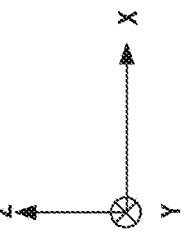

2000
1570
1520
1522
1518
1512
1510
1514
1508
1506
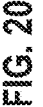
1504
1502
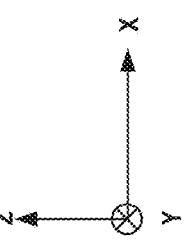
FIG. 20

2200

2201

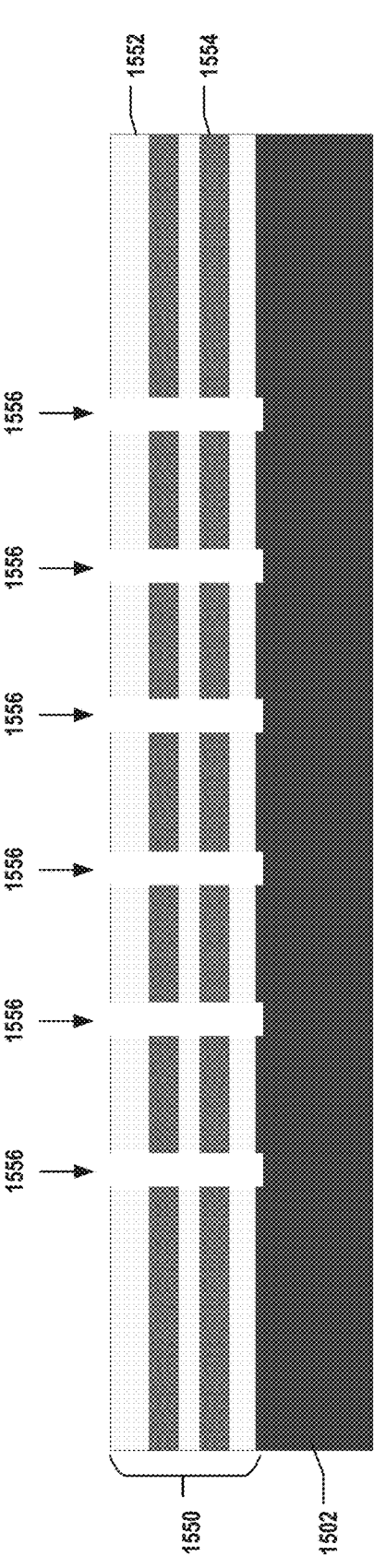
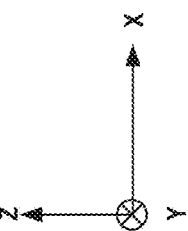
FIG. 23

1500

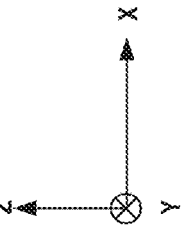
FIG. 26

1500

1520

1518

1512

1510

1514

1516

1508

1506

1504

1502

3100

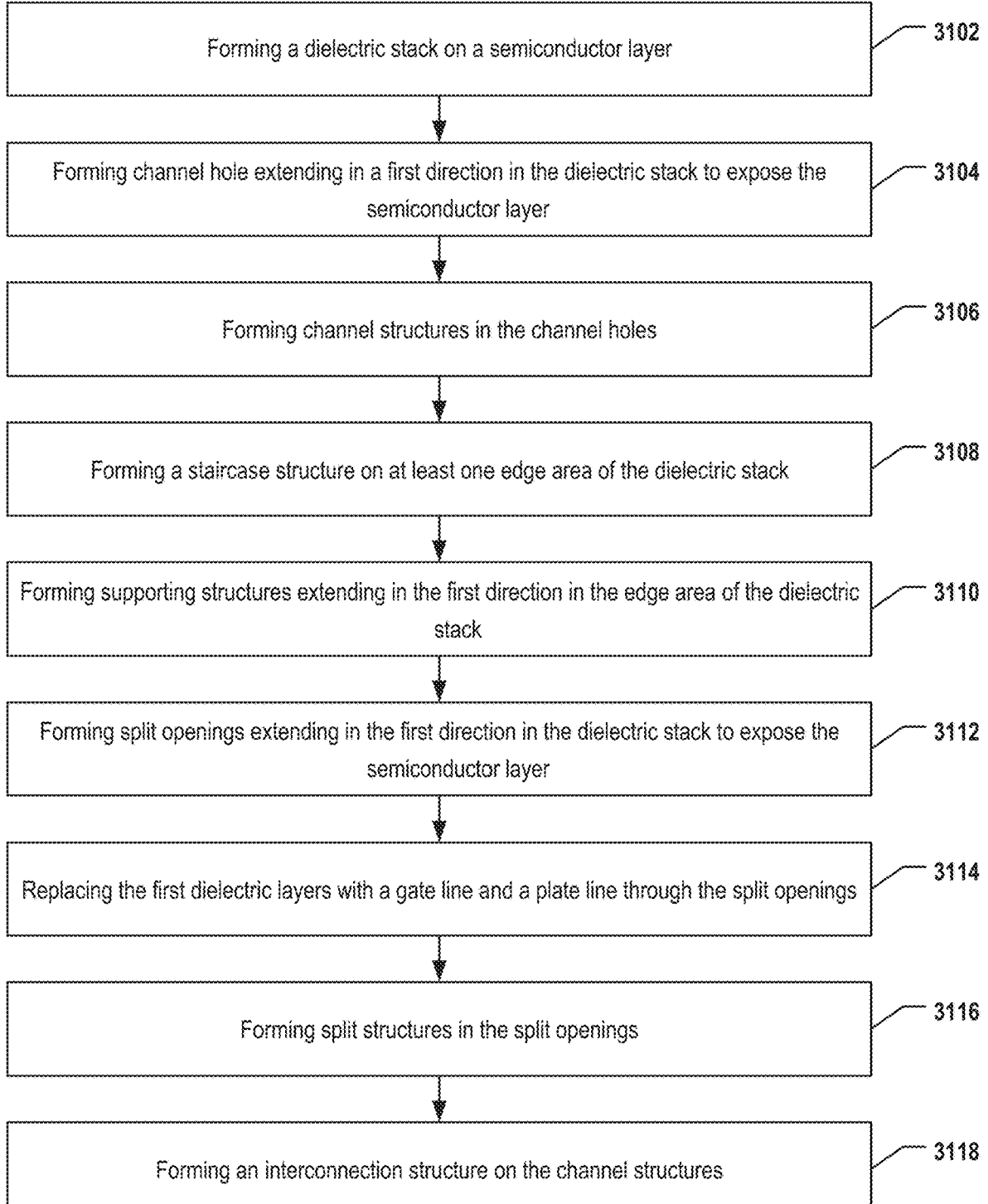

Forming a dielectric stack on a semiconductor layer — 3102

Forming channel hole extending in a first direction in the dielectric stack to expose the semiconductor layer — 3104

Forming channel structures in the channel holes — 3106

Forming a staircase structure on at least one edge area of the dielectric stack — 3108

Forming supporting structures extending in the first direction in the edge area of the dielectric stack — 3110

Forming split openings extending in the first direction in the dielectric stack to expose the semiconductor layer — 3112

Replacing the first dielectric layers with a gate line and a plate line through the split openings — 3114

Forming split structures in the split openings — 3116

Forming an interconnection structure on the channel structures — 3118

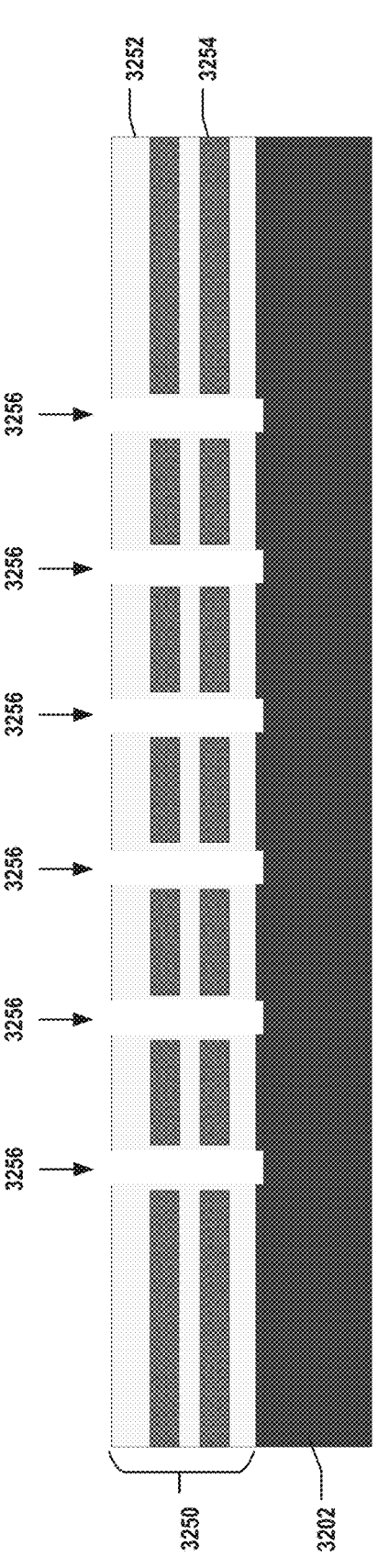
FIG. 38
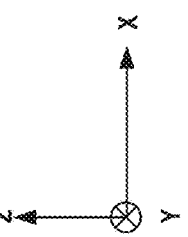

3200

3254

3258

3252

3260

3212

3214

3210

3260

3216

3260

3206

3260

3260

3250

3202

3200

3220

3218

3212

3210

3214

3216

3208

3206

3204

3202

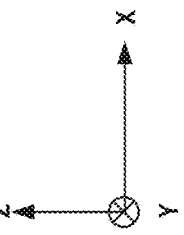
FIG. 43

4600

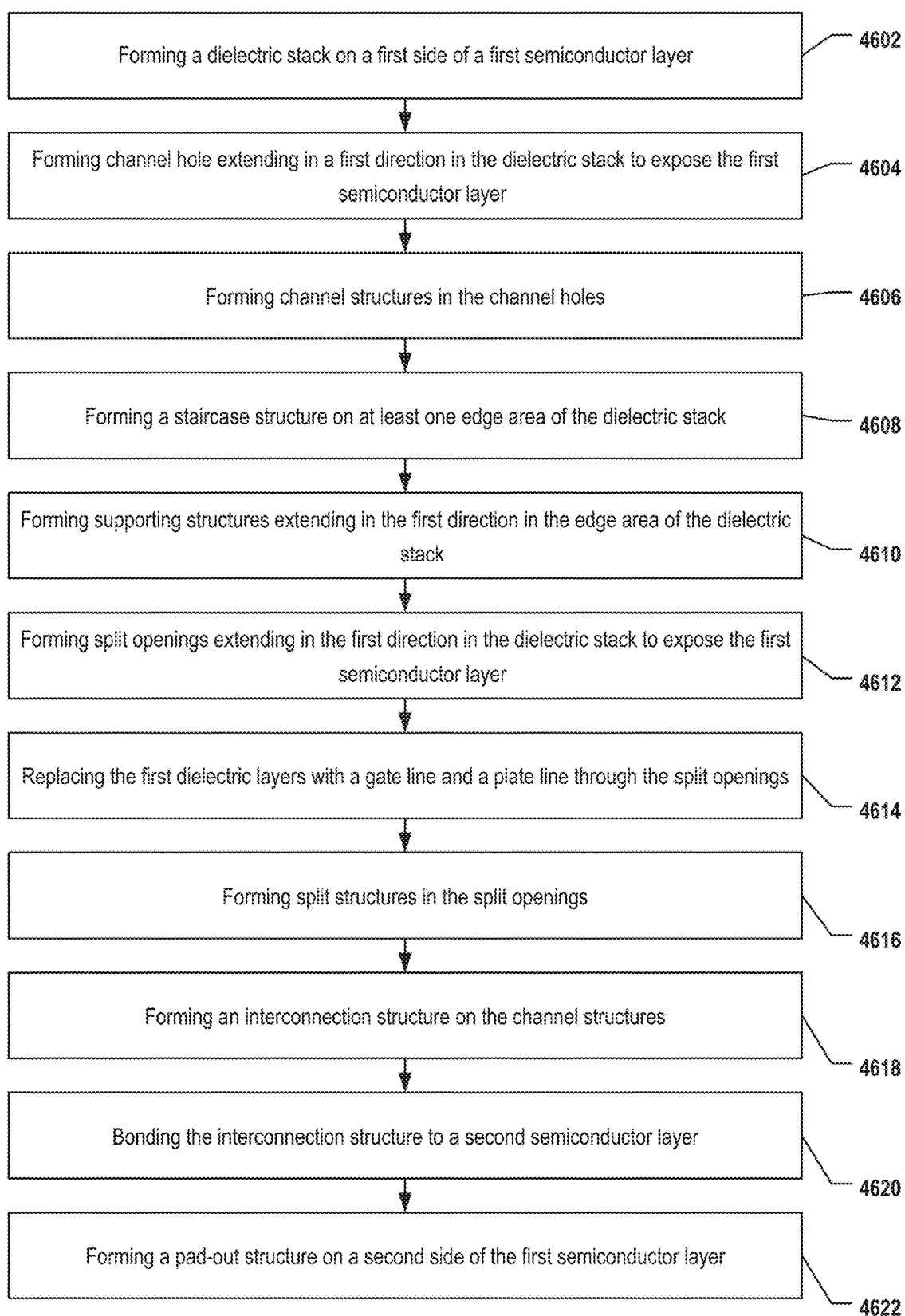

Forming a dielectric stack on a first side of a first semiconductor layer — 4602

Forming channel hole extending in a first direction in the dielectric stack to expose the first semiconductor layer — 4604

Forming channel structures in the channel holes — 4606

Forming a staircase structure on at least one edge area of the dielectric stack — 4608

Forming supporting structures extending in the first direction in the edge area of the dielectric stack — 4610

Forming split openings extending in the first direction in the dielectric stack to expose the first semiconductor layer — 4612

Replacing the first dielectric layers with a gate line and a plate line through the split openings — 4614

Forming split structures in the split openings — 4616

Forming an interconnection structure on the channel structures — 4618

Bonding the interconnection structure to a second semiconductor layer — 4620

Forming a pad-out structure on a second side of the first semiconductor layer — 4622

FIG. 46

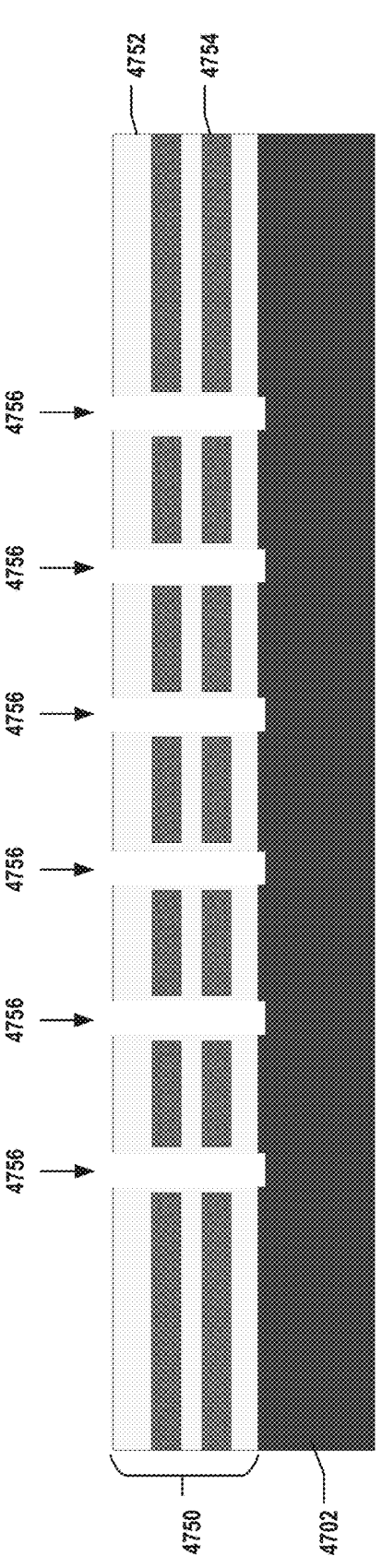
4700
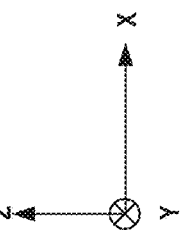
FIG. 53

4700

4758

4752

4762

4760

3212

4760

4714

4710

4760

4716

4760

4706

4760

4750

4702

4700

4770

4720

4722

4718

4712

4710

4714

4716

4708

4706

4704

4702

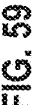
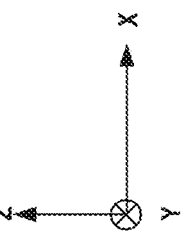
FIG. 59

6200

6300

MEMORY DEVICES AND METHODS FOR FORMING THE SAME

CROSS-REFERENCE TO RELATED APPLICATIONS

This application claims the benefit of priority to Chinese Application No. 202211686619.3, filed Dec. 26, 2022, which is incorporated herein by reference in its entirety.

BACKGROUND

The present disclosure relates to memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, a memory device is disclosed. The memory device includes an array of memory cells disposed on a first side of a first semiconductor layer, and a pad-out structure disposed on the array of memory cells. Each of the memory cells includes a semiconductor body extending in a first direction, a first terminal in contact with the first side of the first semiconductor layer and a second terminal are formed at both ends of the semiconductor body; a word line extending in a second direction perpendicular to the first direction; and a plate line extending in the second direction.

In some implementations, the pad-out structure is in contact with the second terminal. In some implementations, the pad-out structure is disposed on a second side of the first semiconductor layer. In some implementations, the second terminal is in contact with a second semiconductor layer.

In some implementations, the memory device further includes a first dielectric layer disposed between the semiconductor body and the word line and the plate line. In some implementations, the word line and the plate line are in direct contact with the semiconductor body.

In some implementations, the word line includes a conductive layer, an adhesion layer over the conductive layer, and a high dielectric constant dielectric layer over the adhesion layer. The high dielectric constant dielectric layer is in direct contact with the semiconductor body.

In some implementations, the memory device further includes a split structure extending in the first direction between two memory cells.

In some implementations, the split structure includes a split core; and a second dielectric layer surrounding the split core. The second dielectric layer is disposed between a first end of the split core and the first semiconductor layer.

In some implementations, the split structure includes a split core; and a second dielectric layer surrounding the split core. A first end of the split core is in contact with the first semiconductor layer.

In a further aspect, a memory device is disclosed. The memory device includes an array of memory cells disposed on a first side of a first semiconductor layer, and a peripheral circuit. Each of the memory cells includes a semiconductor body extending in a first direction, a first terminal in contact with the first side of the first semiconductor layer and a second terminal are formed at both ends of the semiconductor body; a word line extending in a second direction perpendicular to the first direction; and a plate line extending in the second direction. The peripheral circuit disposed on a first side of a second semiconductor layer. A second side of the second semiconductor layer is in contact with the array of memory cells.

In some implementations, the second side of the second semiconductor layer is in contact with the second terminal.

In some implementations, the memory device further includes a pad-out structure disposed on a second side of the first semiconductor layer.

In some implementations, the memory device further includes a pad-out structure disposed under the first side of the second semiconductor layer.

In some implementations, the memory device further includes a first pad-out structure disposed on a second side of the first semiconductor layer; a second pad-out structure disposed under the first side of the second semiconductor layer; and a contact structure extending in the first direction in contact with the first pad-out structure and the second pad-out structure.

In some implementations, the memory device further includes a split structure extending in the first direction between two memory cells.

In still a further aspect, a method for forming a memory device is disclosed. An array of memory cells is formed on a first side of a first semiconductor layer. A semiconductor body is formed extending in a first direction on the first semiconductor layer. A word line and a plate line are formed extending in a second direction perpendicular to the first direction. A second semiconductor layer is formed on the array of memory cells. A peripheral circuit is formed on the second semiconductor layer.

In some implementations, a first terminal in contact with the first semiconductor layer and a second terminal away from the first semiconductor layer are formed at both ends of the semiconductor body. The second semiconductor layer is formed on the array of memory cells. A first side of the second semiconductor layer is in contact with the second terminal.

In some implementations, a pad-out structure is formed on a second side of the first semiconductor layer.

In some implementations, a split structure is formed extending in the first direction between two memory cells.

In still a further aspect, a system is disclosed. The system includes a memory device configured to store data and a memory controller. The memory device includes an array of memory cells disposed on a first side of a first semiconductor layer, and a pad-out structure disposed on the array of memory cells. Each of the memory cells includes a semiconductor body extending in a first direction, a first terminal in contact with the first side of the first semiconductor layer and a second terminal are formed at both ends of the semiconductor body; a word line extending in a second direction perpendicular to the first direction; and a plate line extending in the second direction. The memory controller is coupled to the memory device and is configured to control operations of the memory device through the plate line and the word line.

In still a further aspect, a system is disclosed. The system includes a memory device configured to store data and a memory controller. The memory device includes an array of memory cells disposed on a first side of a first semiconductor layer, and a peripheral circuit. Each of the memory cells includes a semiconductor body extending in a first direction, a first terminal in contact with the first side of the first semiconductor layer and a second terminal are formed at both ends of the semiconductor body; a word line extending in a second direction perpendicular to the first direction; and a plate line extending in the second direction. The peripheral circuit disposed on a first side of a second semiconductor layer. A second side of the second semiconductor layer is in contact with the array of memory cells. The memory controller is coupled to the memory device and is configured to control operations of the memory device through the plate line and the word line.

BRIEF DESCRIPTION OF THE DRAWINGS

The accompanying drawings, which are incorporated herein and form a part of the specification, illustrate implementations of the present disclosure and, together with the description, further serve to explain the present disclosure and to enable a person skilled in the pertinent art to make and use the present disclosure.

FIGS. 6-13 illustrate a fabrication process for forming a memory device, according to some aspects of the present disclosure.

FIG. 14 illustrates a flowchart of a method for forming a memory device, according to some aspects of the present disclosure.

FIGS. 15-20 illustrate side views of cross-sections of various memory devices, according to some aspects of the present disclosure.

FIGS. 23-30 illustrate a fabrication process for forming a memory device, according to some aspects of the present disclosure.

FIG. 31 illustrates a flowchart of a method for forming a memory device, according to some aspects of the present disclosure.

FIGS. 38-45 illustrate a fabrication process for forming a memory device, according to some aspects of the present disclosure.

FIG. 46 illustrates a flowchart of a method for forming a memory device, according to some aspects of the present disclosure.

FIGS. 53-61 illustrate a fabrication process for forming a memory device, according to some aspects of the present disclosure.

Figure 1A:
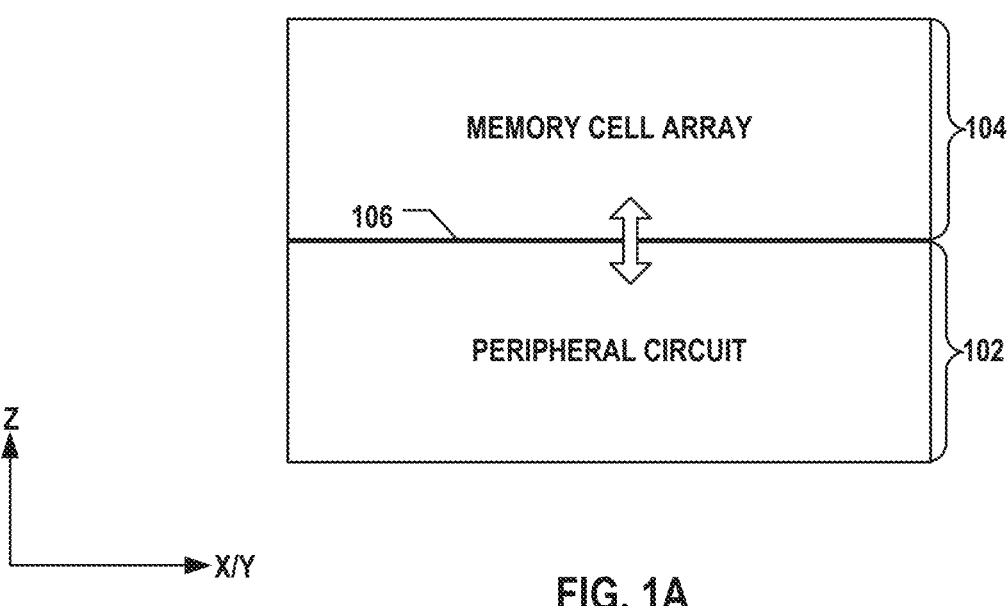
FIGS. 1A-1B illustrate schematic views of cross-sections of memory devices, according to some aspects of the present disclosure.

The present disclosure will be described with reference to the accompanying drawings.

DETAILED DESCRIPTION

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means perpendicular to the lateral surface of a substrate.

Transistors are used as the switch or selecting devices in the memory cells of some memory devices. However, the planar transistors commonly used in existing memory cells usually have a horizontal structure with buried word lines in the substrate and bit lines above the substrate. Since the source and drain of a planar transistor are disposed laterally at different locations, which increases the area occupied by the transistor. The design of planar transistors also complicates the arrangement of interconnected structures, such as word lines and bit lines, coupled to the memory cells, for example, limiting the pitches of the word lines and/or bit lines, thereby increasing the fabrication complexity and reducing the production yield. Moreover, because the bit lines and the storage units (e.g., capacitors) are arranged on the same side of the planar transistors (above the transistors and substrate), the bit line process margin is limited by the storage units, and the coupling capacitance between the bit lines and storage units, such as capacitors, are increased. Planar transistors may also suffer from a high leakage current as the saturated drain current keeps increasing, which is undesirable for the performance of memory devices.

On the other hand, as the number of memory cells keeps increasing, to maintain the same chip size, the dimensions of the components in the memory cell array, such as transistors, word lines, and/or bit lines, need to keep decreasing in order not to significantly reduce the memory cell array efficiency.

To address one or more of the aforementioned issues, the present disclosure introduces a memory device having a vertical arrangement of the source/drain terminals, and a word line gate and a plate line gate to select and store data in the memory device. Compared to the existing memory cells, the memory device in the present disclosure has vertically arranged transistors (i.e., the drain and source are overlapped in the plan view) that can reduce the area of the transistor as well as simplify the layout of the interconnect structures, e.g., metal wiring the word lines and bit lines, which can reduce the fabrication complexity and improve the yield. In addition, the memory device in the present disclosure does not need a capacitor storage device to store data in the memory device.

Furthermore, consistent with the scope of the present disclosure, according to some aspects of the present disclosure, the memory cell array having vertical transistors and the peripheral circuits of the memory cell array can be formed on the same wafer in a side-by-side manner, i.e., next to one another. The number of wafers needed to fabricate the same number of memory devices and the complexity involved in the bonding process can be reduced compared with the face-to-face bonding scheme.

In some implementations, the vertical transistors disclosed herein may include dynamic flash memories (DFM), which is a capacitor-less type of random access memory (RAM). The DFM uses a dual gate surrounding gate transistor (SGT) to eliminate capacitors and increase the bit density of the memory.

FIG. 1A illustrates a schematic view of a cross-section of a 3D memory device 100, according to some aspects of the present disclosure. 3D memory device 100 represents an example of a bonded chip. The components of 3D memory device 100 (e.g., memory cell array and peripheral circuits) can be formed separately on different substrates and then jointed to form a bonded chip. 3D memory device 100 can include a first semiconductor structure 102 including the peripheral circuits of a memory cell array. 3D memory device 100 can also include a second semiconductor structure 104 including the memory cell array. The peripheral circuits (a.k.a. control and sensing circuits) can include any suitable digital, analog, and/or mixed-signal circuits used for facilitating the operations of the memory cell array. For example, the peripheral circuit can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits in first semiconductor structure 102 use complementary metal-oxide-semiconductor (CMOS) technology, e.g., which can be implemented with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations.

As shown in FIG. 1A, 3D memory device 100 can also include first semiconductor structure 102 including an array of memory cells (memory cell array) that can use transistors as the switch and selecting devices. For ease of description, a DFM cell array may be used as an example for describing the memory cell array in the present disclosure. But it is understood that the memory cell array is not limited to DFM cell array and may include any other suitable types of memory cell arrays that can use transistors as selecting device and storage unit.

As shown in FIG. 1A, 3D memory device 100 further includes a bonding interface 106 vertically between (in the vertical direction, e.g., the z-direction in FIG. 1A) first semiconductor structure 102 and second semiconductor structure 104. As described below in detail, first and second semiconductor structures 102 and 104 can be fabricated separately (and in parallel in some implementations) such that the thermal budget of fabricating one of first and second semiconductor structures 102 and 104 does not limit the processes of fabricating another one of first and second semiconductor structures 102 and 104. Moreover, a large number of interconnects (e.g., bonding contacts) can be formed through bonding interface 106 to make direct, short-distance (e.g., micron-level) electrical connections between first semiconductor structure 102 and second semiconductor structure 104, as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer between the memory cell array in second semiconductor structure 104 and the peripheral circuits in first semiconductor structure 102 can be performed through the interconnects (e.g., bonding contacts) across bonding interface 106. By vertically integrating first and second semiconductor structures 102 and 104, the chip size can be reduced, and the memory cell density can be increased.

Figure 1B:
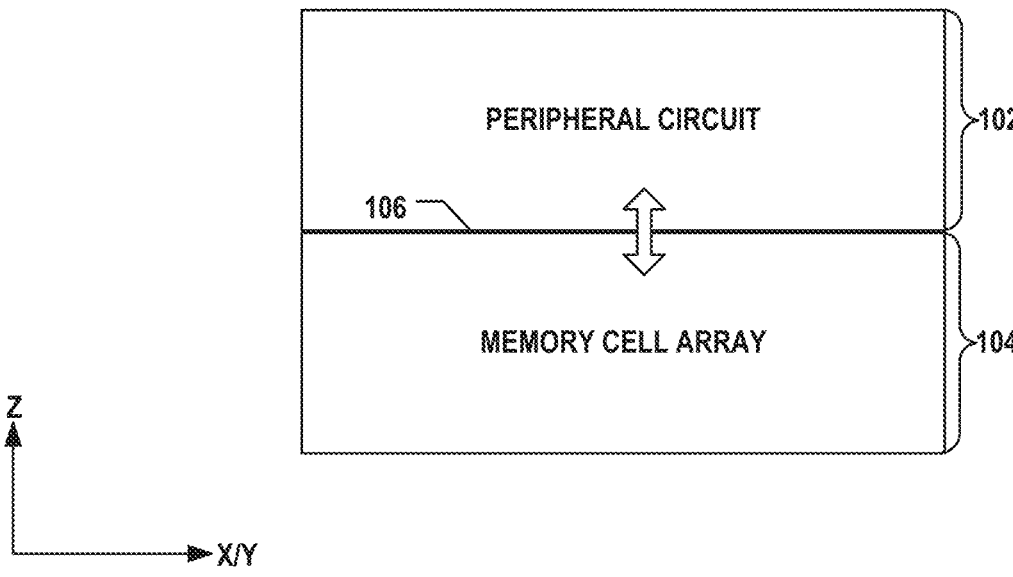

It is understood that the relative positions of stacked first and second semiconductor structures 102 and 104 are not limited. FIG. 1B illustrates a schematic view of a cross-section of another exemplary 3D memory device 101, according to some implementations. Different from 3D memory device 100 in FIG. 1A in which second semiconductor structure 104 including the memory cell array is above first semiconductor structure 102 including the peripheral circuits, in 3D memory device 101 in FIG. 1B, first semiconductor structure 102 including the peripheral circuit is above second semiconductor structure 104 including the memory cell array. Nevertheless, bonding interface 106 is formed vertically between first and second semiconductor structures 102 and 104 in 3D memory device 101, and first and second semiconductor structures 102 and 104 are jointed vertically through bonding (e.g., hybrid bonding) according to some implementations. Hybrid bonding, also known as "metal/dielectric hybrid bonding," is a direct bonding technology (e.g., forming bonding between surfaces without using intermediate layers, such as solder or adhesives) and can obtain metal-metal (e.g., copper-to-copper) bonding and dielectric-dielectric (e.g., silicon oxide-to-silicon oxide) bonding simultaneously. Data transfer between the memory cell array in second semiconductor structure 104 and the peripheral circuits in first semiconductor structure 102 can be performed through the interconnects (e.g., bonding contacts) across bonding interface 106.

It is noted that x, y, and z axes are included in FIGS. 1A and 1B to further illustrate the spatial relationship of the components in 3D memory devices 100 and 101. The substrate of the 3D memory device includes two lateral surfaces extending laterally in the x-y plane: a top surface on the front side of the wafer on which the semiconductor devices can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the 3D memory device is determined relative to the substrate of the 3D memory device in the z-direction (the vertical direction perpendicular to the x-y plane, e.g., the thickness direction of the substrate) when the substrate is positioned in the lowest plane of the 3D memory device in the z-direction. The same notion for describing the spatial relationships is applied throughout the present disclosure.

Figure 2:
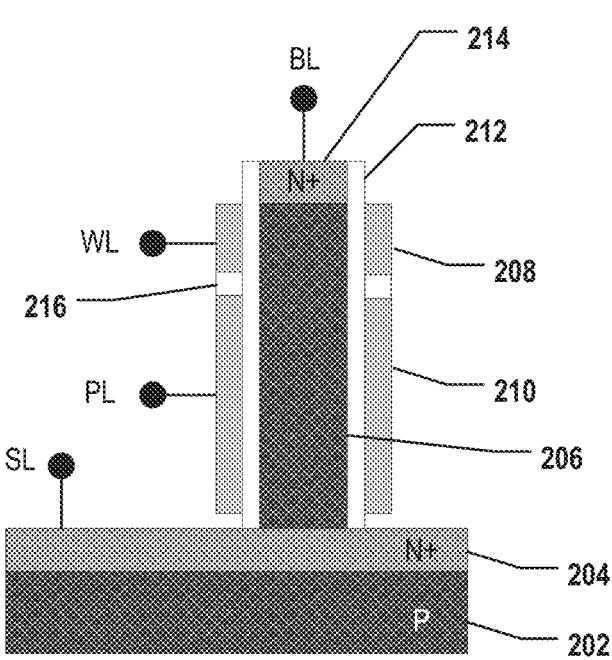
FIG. 2 illustrates a schematic view of a cross-section of a memory device, according to some aspects of the present disclosure.

FIG. 2 illustrates a schematic view of a cross-section of a memory cell 200, according to some aspects of the present disclosure. In some implementations, the memory cell array includes an array of memory cells 200. For ease of description, a DFM cell array may be used as an example for describing the memory cell array in the present disclosure. But it is understood that the memory cell array is not limited to DFM cell array and may include any other suitable types of memory cell arrays that can use transistors as selecting device and storage unit.

Memory cell 200 includes a semiconductor body 206 formed on a semiconductor layer 202, e.g., a semiconductor substrate. In some implementations, semiconductor body 206 may include P-type or intrinsic conductivity type silicon. In some implementations, semiconductor layer 202 may include a silicon substrate. A first end 204 and a second end 214 of semiconductor body 206 may include N+ layers. As described herein, the N+ layers are semiconductor regions that contain a donor impurity in high concentration. In some implementations, first end 204 and second end 214 function as the source and the drain of the transistor, e.g., the memory cell. Portions of semiconductor body 206 between first end 204 and second end 214 may function as the channel region of the transistor. Around semiconductor body 206, a dielectric layer 212 may be formed as a gate insulating layer of the transistor. A word line gate 208 and a plate line gate 210 may be formed around dielectric layer 212 and may function as gate conductor layers. In some implementations, word line gate 208 and plate line gate 210 may be further isolated from each other by a dielectric layer 216.

The channel region, which is a portion of semiconductor body 206 between first end 204 and second end 214, may be constituted by a first channel layer surrounded by plate line gate 210 and a second channel layer surrounded by word line gate 208. Accordingly, first end 204 and second end 214 that function as the source and the drain, the channel region, dielectric layer 212, word line gate 208, and plate line gate 210 constitute memory cell 200. First end 204 that functions as the source is connected to a source line SL, second end 214 that functions as the drain is connected to a bit line BL, plate line gate 210 is connected to a plate line PL, and word line gate 208 is connected to a word line WL. In some implementations, the structure is such that the gate capacitance of plate line gate 210 to which the plate line PL is connected is larger than the gate capacitance of word line gate 208 to which the word line WL is connected.

Figure 3A:
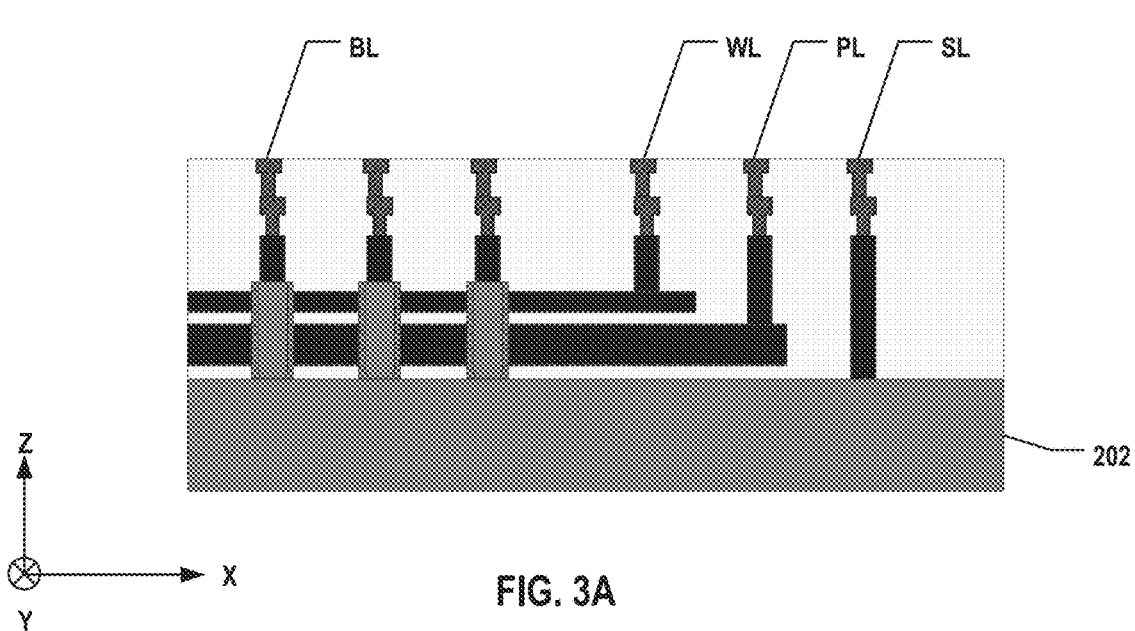
FIGS. 3A-3B illustrate schematic views of cross-sections of memory cells, according to some aspects of the present disclosure.
Figure 3B:
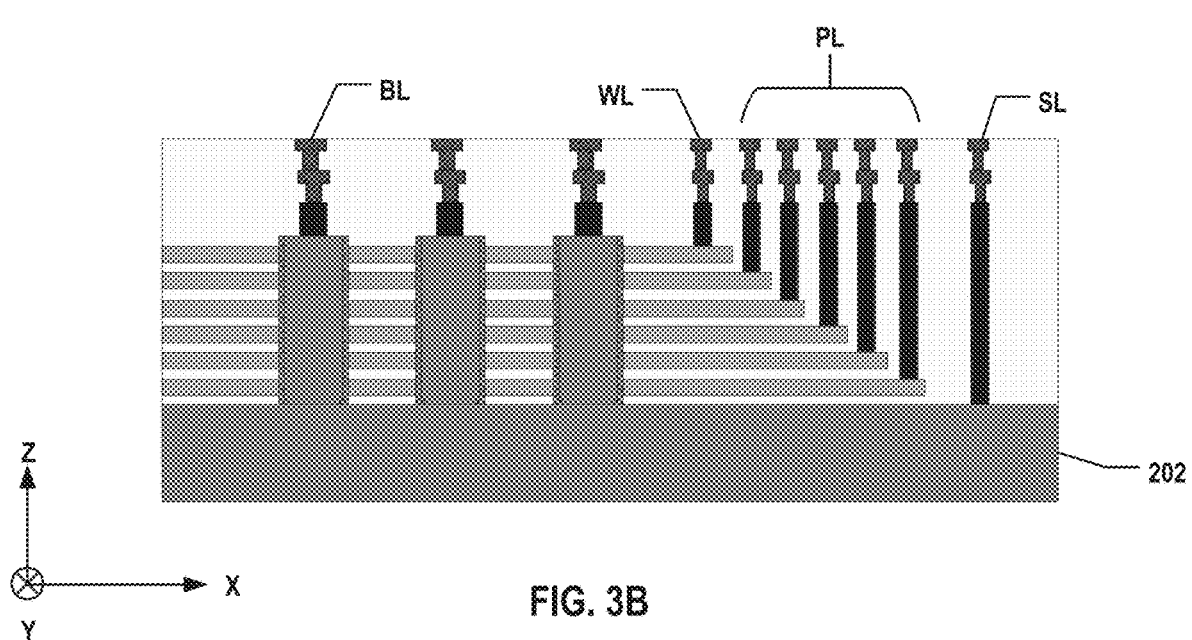

FIGS. 3A-3B illustrate schematic views of cross-sections of memory cells 300 and 301, according to some aspects of the present disclosure. In some implementations, to make the gate capacitance of plate line gate 210 to which the plate line PL is connected larger than the gate capacitance of word line gate 208 to which the word line WL is connected, the gate length of plate line gate 210 may be made longer than the gate length of word line gate 208, as shown in FIG. 3A. Alternatively, instead of making the gate length of plate line gate 210 longer than the gate length of word line gate 208, plate line gate 210 may be formed by a plurality of gates, as shown in FIG. 3B. The channel region between first end 204 and second end 214 is electrically isolated from semiconductor layer 202 and functions as a floating body.

Figure 4:
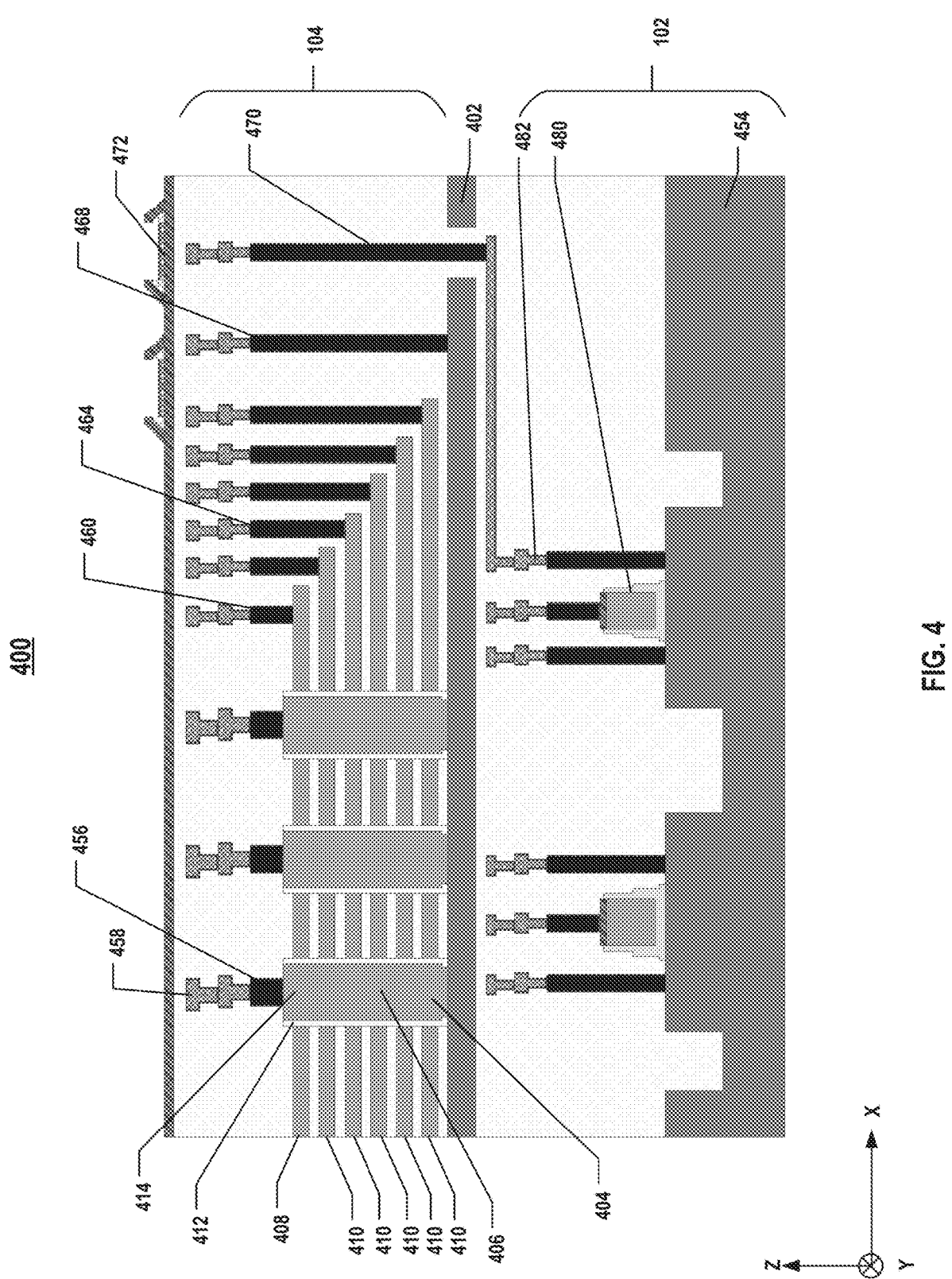
FIG. 4 illustrates a side view of a cross-section of a memory device, according to some aspects of the present disclosure.

FIG. 4 illustrates a side view of a cross-section of a memory device 400, according to some aspects of the present disclosure. As shown in FIG. 4, memory device 400 includes second semiconductor structure 104 formed on a first semiconductor layer 402, e.g., a silicon substrate, and first semiconductor structure 102 formed on a second semiconductor layer 454, e.g., a silicon substrate. One or more than one peripheral circuit including one or more than one peripheral device 480 is formed in first semiconductor structure 102 on second semiconductor layer 454. In some implementations, the peripheral circuits may include any suitable digital, analog, and/or mixed-signal circuits used for facilitating the operations of the memory cell array. In some implementations, first semiconductor layer 402 and second semiconductor layer 454 may be semiconductor layers, e.g., part of a carrier wafer, which can include silicon (e.g., single crystalline silicon, c-Si), silicon germanium (SiGe), gallium arsenide (GaAs), germanium (Ge), silicon-on-insulator (SOI), or any other suitable materials.

Memory device 400 further includes a plurality of memory cells formed in first semiconductor structures 102 on first semiconductor layer 402. Each memory cell includes a semiconductor body 406. In some implementations, semiconductor body 406 may include semiconductor materials, such as single crystalline silicon, polysilicon, amorphous silicon, Ge, any other semiconductor materials, or any combinations thereof. In one example, semiconductor body 406 may include single crystalline silicon.

A first end 404, e.g., a first terminal, and a second end 414, e.g., a second terminal, are formed at two sides of semiconductor body 406 and may include N+ layers. First end 404 and second end 414 function as the source and the drain of the memory cell. In some implementations, first end 404 and second end 414 may be doped with N-type dopants (e.g., P or As) or P-type dopants (e.g., B or Ga) at a desired doping level. In some implementations, a silicide layer, such as a metal silicide layer, may be formed between first end 404 and second end 414 (source and drain) and the bit line BL or source line SL contacts to reduce the contact resistance.

Portions of semiconductor body 406 between first end 404 and second end 414 may function as the channel region of the memory cell. Around semiconductor body 406, a dielectric layer 412 may be formed as a gate insulating layer of the memory cell. In some implementations, dielectric layer 412 (gate dielectric or gate insulating layer) may include dielectric materials, such as silicon oxide, silicon nitride, or high-k dielectrics including, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), or any combination thereof.

A word line 408 and one or more than one plate line 410 may be formed around dielectric layer 412 and may function as gate conductor layers. In some implementations, word line 408 and plate line 410 may be isolated from each other. It is understood that the word line gate electrodes (e.g., word line gate 208 in FIG. 2) may be part of word line 408 or extend in the word line direction (e.g., the x-direction) as word line 408, and the plate line gate electrodes (e.g., plate line gate 210 in FIG. 2) may be part of plate line 410 or extend in the plate line direction (e.g., the x-direction) as plate line 410.

In some implementations, word line 408 and plate line 410 (including the word line gate electrode and the plate line gate electrode) may include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, word line 408 and plate line 410 may include doped polysilicon, i.e., a gate poly. In some implementations, word line 408 and plate line 410 may include multiple conductive layers, such as a W layer over a TiN layer. In one example, the word line gate electrode and the plate line gate electrode may be a "gate oxide/gate poly" gate in which the gate dielectric includes silicon oxide, and the gate electrode includes doped polysilicon. In another example, the word line gate electrode and the plate line gate electrode may be a high-k metal gate (HKMG) in which the gate dielectric includes a high-k dielectric, and the gate electrode includes a metal.

As shown in FIG. 4, semiconductor body 406 extends along the z-direction, and first end 404 and second end 414, which function as the source/drain, are formed at the bottom and the top of semiconductor body 406. Word line 408 and plate line 410 may be parallel to each other and extend along the x-direction perpendicular to the z-direction. A contact 456 is formed above semiconductor body 406 in contact with second end 414, and a bit line 458 is formed above contact 456. As shown in FIG. 4, bit line 458 extends along the y-direction perpendicular to the x-direction and the z-direction. A contact 460 is formed above word line 408, a contact 464 is formed above plate line 410, and a contact 468 is formed above first semiconductor layer 402.

It is understood that, in FIG. 4, plate line 410 is illustrated by multiple conductive layers parallel to each other, but plate line 410 may also be formed by a single conductive layer having a width larger than word line 408. In some implementations, the first terminal, the second terminal, the word line, and the plate line are controlled by the peripheral circuit to collectively perform a memory write operation, a memory read operation, and a memory erase operation.

In some implementations, semiconductor body 406 may be formed from first semiconductor layer 402 (e.g., by etching or epitaxy) and thus, may have the same semiconductor material (e.g., single crystalline silicon) as first semiconductor layer 402. In some implementations, dielectric layer 412 may include silicon oxide, i.e., gate oxide. As shown in FIG. 4, second semiconductor structure 104 can further include a pad-out structure 472 and a contact structure 470. In some implementations, contact structure 470 electrically connects pad-out structures 472 and the peripheral circuit. Pad-out structure 472 is disposed above the array of memory cells.

In some implementations, pad-out structure 472 may include interconnects, e.g., contact pads, in one or more interlayer dielectric (ILD) layers. In some implementations, the interconnects in pad-out structure 472 may transfer electrical signals between memory device 400 and outside circuits, e.g., for pad-out purposes. In some implementations, contact structure 470 may penetrate first semiconductor layer 402 and in electrical contact with first semiconductor structure 102. In some implementations, pad-out structure 472 and contact structure 470 may include conductive materials including, but not limited to, W, Co, Cu, Al, silicides, or any combination thereof. In some implementations, contact structure 470 includes a via surrounded by a dielectric spacer (e.g., having silicon oxide) to electrically separate the via from first semiconductor layer 402. Depending on the thickness of first semiconductor layer 402, contact structure 470 may be an interlayer via (ILV) having a depth in the submicron-level (e.g., between 10 nm and 1 μm), or a through substrate via (TSV) having a depth in the micron- or tens micron-level (e.g., between 1 μm and 100 μm).

In some implementations, first semiconductor structure 102 may be bonded on top or bottom of second semiconductor structure 104 at bonding interface 106, as shown in FIG. 1. In some implementations, bonding interface 106 is an implementation of any suitable bonding technique, such as hybrid bonding, anodic bonding, fusion bonding, transfer bonding, adhesive bonding, eutectic bonding, etc. As shown in FIG. 4, second semiconductor structure 104 is formed on a first side of first semiconductor layer 402, and first semiconductor structure 102 is bonded to a second side of first semiconductor layer 402.

For example, As shown in FIG. 4, first semiconductor structure 102 may be bonded to the bottom of second semiconductor structure 104 by transfer bonding. In some implementations, after forming peripheral device 480 on second semiconductor layer 454, an interconnect layer 482 may be formed on peripheral device 480, and interconnect layer 482 is boned with first semiconductor layer 402 using any suitable substrate/wafer bonding process, including, for example, anodic bonding and fusion (direct) bonding, to form bonded interface 106 between first semiconductor structure 102 and second semiconductor structure 104. In one example, fusion bonding may be performed between layers of silicon and silicon, silicon and silicon oxide, or silicon oxide and silicon oxide using pressure and heat. In another example, anodic bonding may be performed between a silicon oxide layer (in an ionic glass) and a silicon layer using voltage, pressure, and heat.

Figure 5:
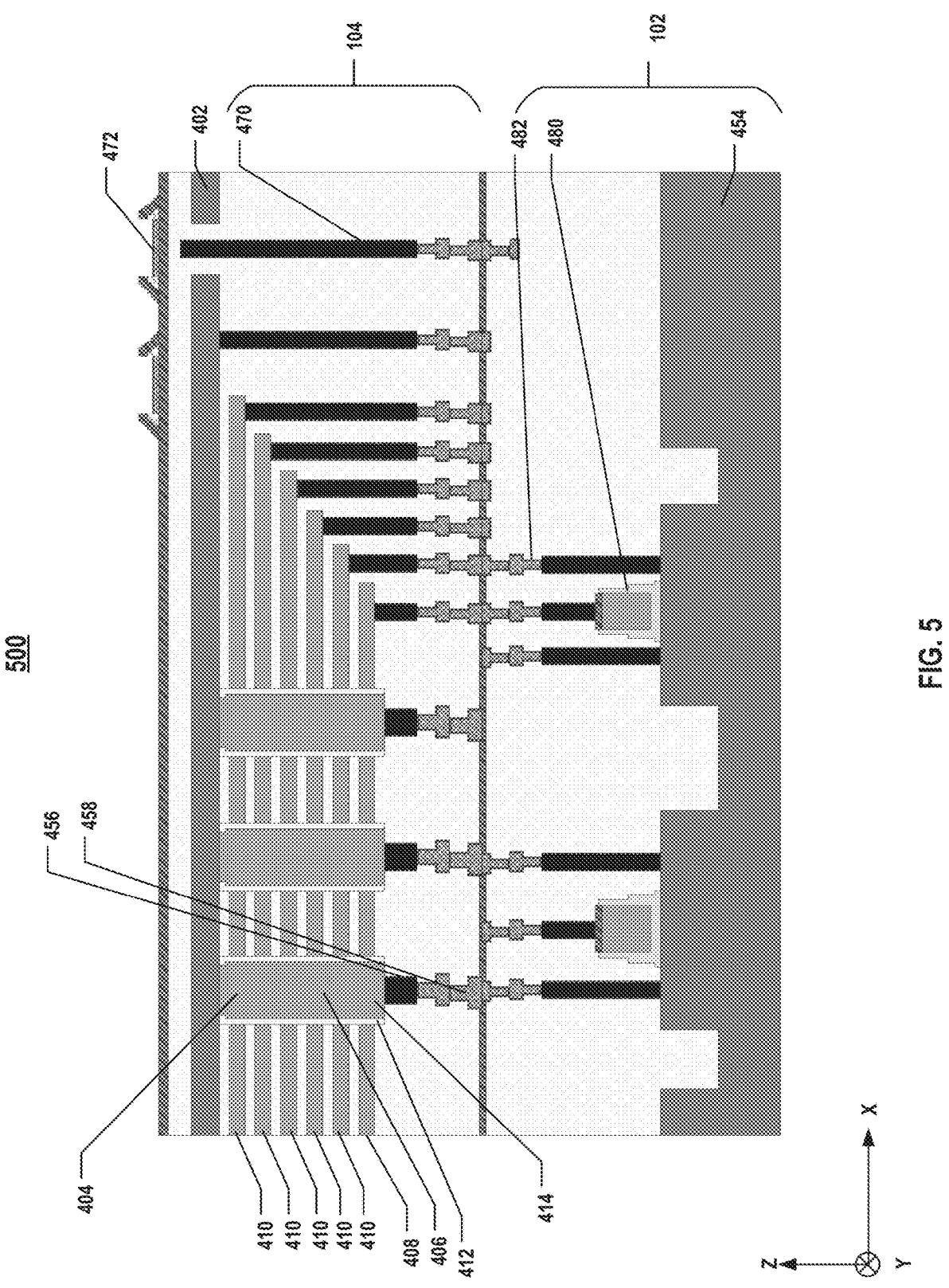
FIG. 5 illustrates a side view of a cross-section of a memory device, according to some aspects of the present disclosure.

FIG. 5 illustrates a side view of a cross-section of a memory device 500, according to some aspects of the present disclosure. As shown in FIG. 5, the structure of memory device 500 is similar to memory device 400, but first semiconductor structure 102 and second semiconductor structure 104 are bonded in a face-to-face manner. In some implementations, bonding interface 106 is an implementation of any suitable bonding technique, such as hybrid bonding, anodic bonding, fusion bonding, transfer bonding, adhesive bonding, eutectic bonding, etc. As shown in FIG. 5, first end 404, e.g., the first terminal, is in contact with first semiconductor layer 402 and second end 414, e.g., the second terminal, is bonded with the peripheral circuit. Contact structure 470 electrically connects pad-out structure 472 and the peripheral circuit, and pad-out structure 472 is disposed on the second side of first semiconductor layer 402.

For example, As shown in FIG. 5, first semiconductor structure 102 may be bonded to second semiconductor structure 104 by hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, bonding interface 106 is the place at which the bonding layers are met and bonded. In practice, bonding interface 106 can be a layer with a certain thickness that includes the bonding layers of first semiconductor structure 102 and second semiconductor structure 104.

Memory device 400 and memory device 500 may have a vertical arrangement of the source/drain terminals, which can reduce the area of the transistor as well as simplify the layout of the interconnect structures and reduce the fabrication complexity. In addition, memory device 400 and memory device 500 do not need a capacitor storage device to store data. Furthermore, the memory cell array and the peripheral circuits can be formed separately on different substrates to save the cycle time of fabrication.

FIGS. 6-13 illustrate a fabrication process for forming memory device 400 and memory device 500, according to some aspects of the present disclosure. FIG. 14 illustrates a flowchart of a method 1400 for forming memory device 400 and memory device 500, according to some aspects of the present disclosure. For the purpose of better describing the present disclosure, memory device 400 and memory device 500 in FIGS. 6-13 and method 1400 in FIG. 14 will be discussed together. It is understood that the operations shown in method 1400 are not exhaustive and that other operations may be performed as well before, after, or between any of the illustrated operations. Further, some of the operations may be performed simultaneously, or in a different order than shown in FIGS. 6-13 and FIG. 14. It is also understood that FIGS. 6-13 illustrate memory device

400 and memory device 500 as an example, and other implementations may also be suitable for the fabrication process.

Figure 6:
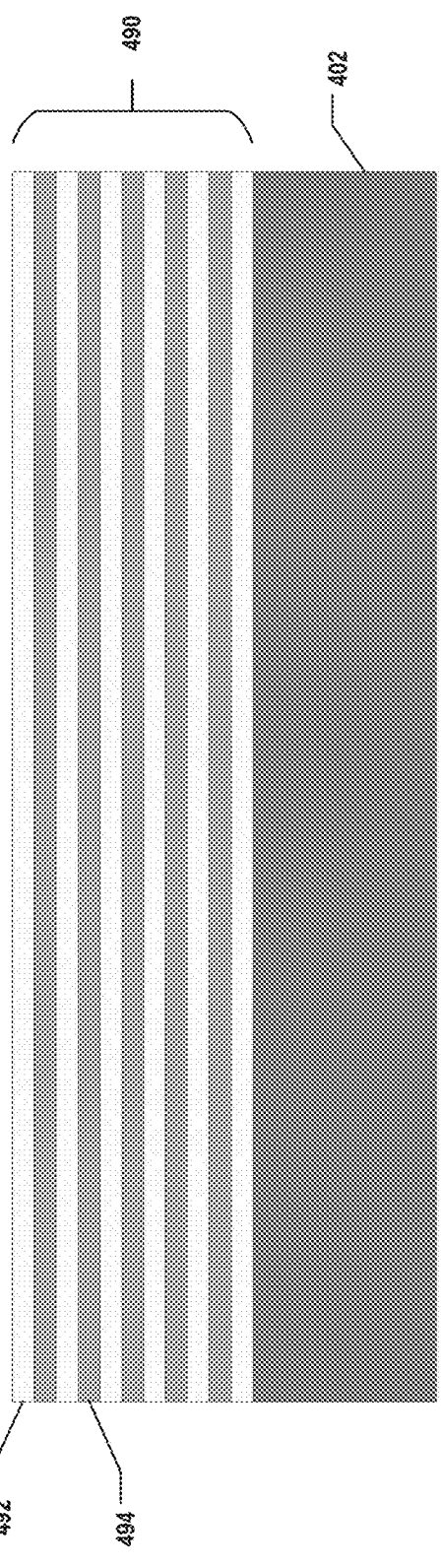

As shown in FIGS. 6-9 and operation 1402 in FIG. 14, an array of memory cells is formed on first semiconductor layer 402. As shown in FIG. 6, first semiconductor layer 402 is provided as a substrate of the fabrication process. In some implementations, first semiconductor layer 402 may be a silicon substrate. A stack 490 including interleaved first dielectric layers 492 and semiconductor layers 494 is formed on first semiconductor layer 402. In some implementations, first dielectric layers 492 may include silicon oxide. In some implementations, semiconductor layers 494 may include any suitable semiconductor or conductive materials, such as polysilicon, metals (e.g., W, Cu, Al, etc.), metal compounds (e.g., TiN, TaN, etc.), or silicides. In some implementations, first dielectric layers 492 and semiconductor layers 494 may be formed by one or more thin film deposition processes including, but not limited to, chemical vapor deposition (CVD), physical vapor deposition (PVD), atomic layer deposition (ALD), electroplating, electroless plating, or any combination thereof.

As shown in FIG. 7, a channel structure is formed in stack 490 extending in the z-direction on first semiconductor layer 402. In some implementations, a channel hole is formed penetrating stack 490 extending in the z-direction to expose first semiconductor layer 402. Then, dielectric layer 412 is formed on sidewalls of the channel hole, and semiconductor body 406 is formed in the channel hole.

Figure 8:
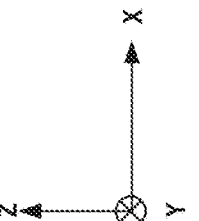

As shown in FIG. 8, a portion of stack 490 is removed, and a staircase structure at an edge of stack 490 is formed. In some implementations, the portion of stack 490 may be removed by a plurality of processes including, but not limited to, photolithography, dry/wet etch, chemical mechanical polishing (CMP), and any other suitable processes. After the removal of the portion of stack 490, word line 408 and plate line 410 are formed extending in the x-direction perpendicular to the z-direction.

Figure 9:
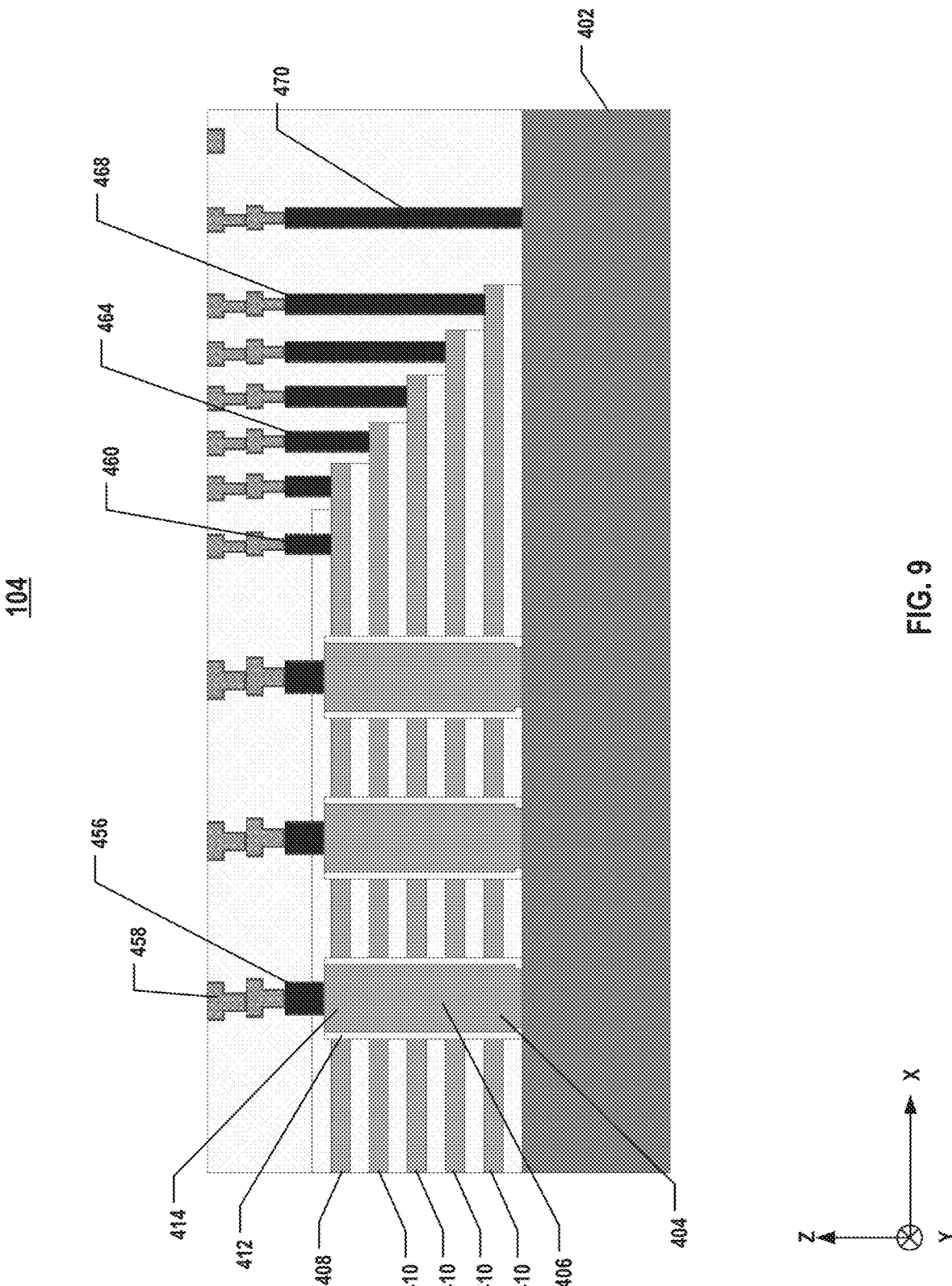

As shown in FIG. 9, a dielectric material may be filled on stack 490, and then contact 460 is formed above word line 408, contact 464 is formed above plate line 410, and contact 468 is formed above first semiconductor layer 402. In some implementations, contact structure 470 may be formed in the dielectric material extending in the z-direction in contact with first semiconductor layer 402.

Figure 10:
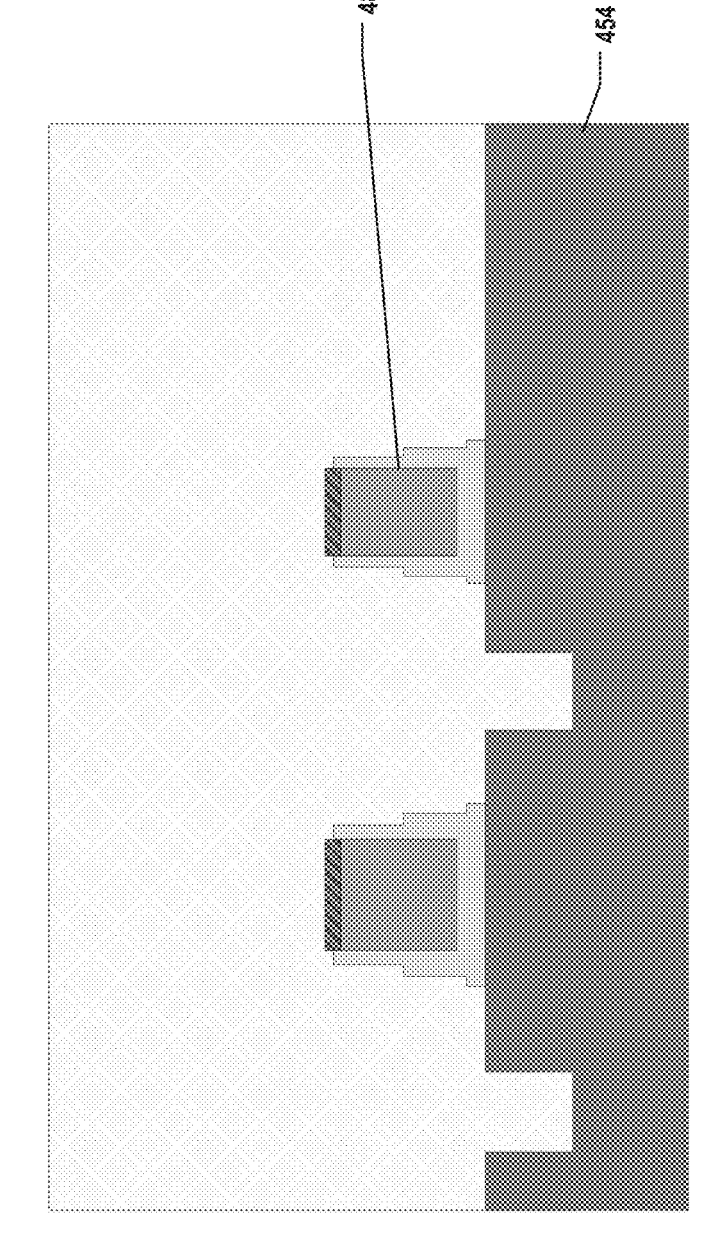

As shown in FIGS. 10-11 and operation 1404 in FIG. 14, a peripheral circuit is formed on a second semiconductor layer 454. As shown in FIG. 10, peripheral device 480 is formed on second semiconductor layer 454. In some implementations, peripheral device 480 is used to form the peripheral circuit including one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a subcircuit) of the functional circuits mentioned above, or any active or passive components of the circuit (e.g., transistors, diodes, resistors, or capacitors). The peripheral circuits may use CMOS technology which can be implemented with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations. As shown in FIG. 11, interconnect layer 482 is formed on peripheral device 480.

Figure 12:
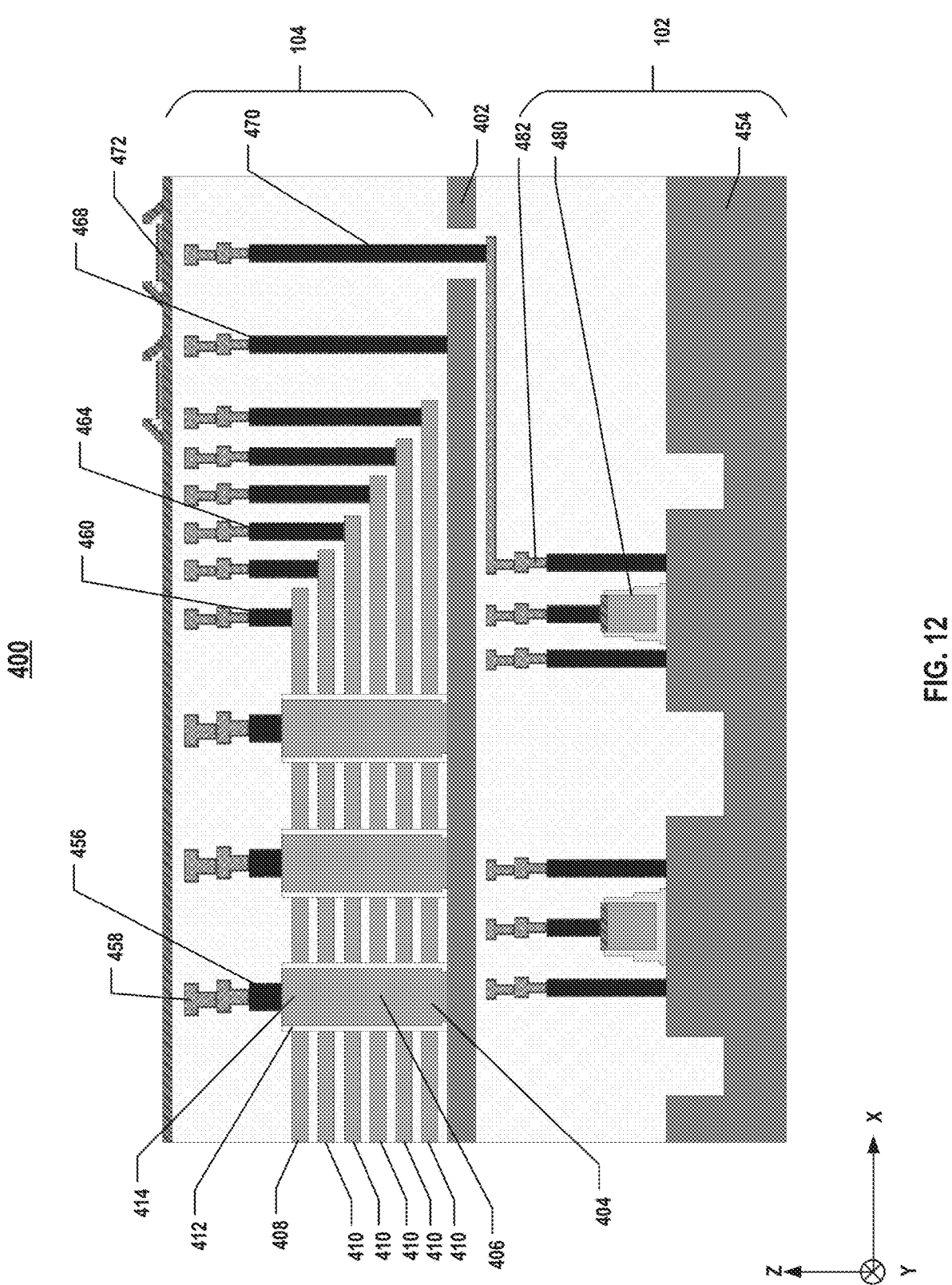
Figure 13:
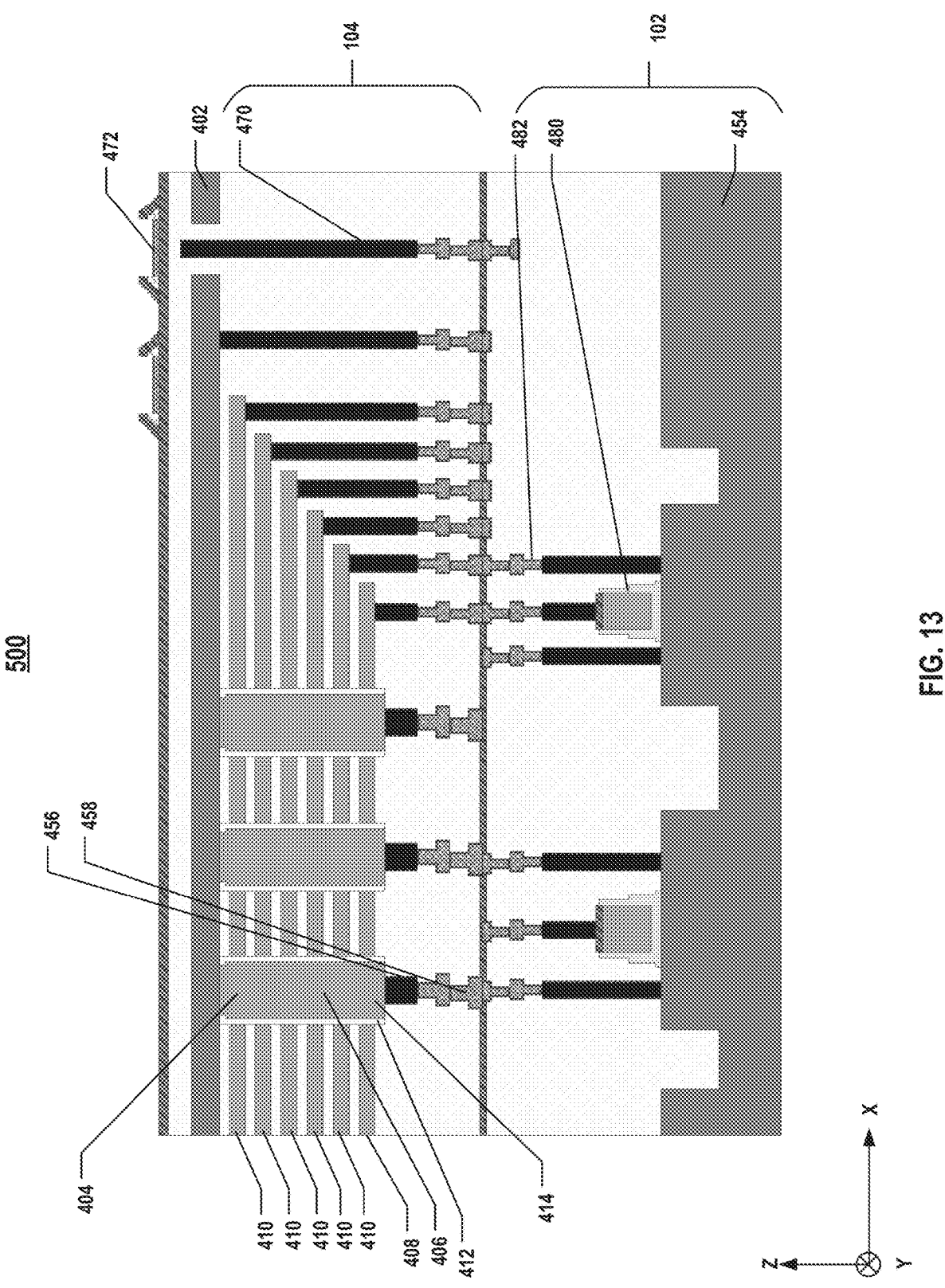

As shown in FIGS. 12-13 and operation 1406 in FIG. 14, the array of memory cells is bonded with the peripheral circuit. As shown in FIG. 12, first semiconductor structure

102 may be bonded on the bottom of second semiconductor structure 104. In some implementations, the bonding interface is an implementation of any suitable bonding technique, such as hybrid bonding, anodic bonding, fusion bonding, transfer bonding, adhesive bonding, eutectic bonding, etc. As shown in FIG. 12, second semiconductor structure 104 is formed on a first side of first semiconductor layer 402, and first semiconductor structure 102 is bonded to a second side of first semiconductor layer 402.

For example, As shown in FIG. 12, first semiconductor structure 102 may be bonded to the bottom of second semiconductor structure 104 by transfer bonding. In some implementations, after forming peripheral device 480 on second semiconductor layer 454, an interconnect layer 482 may be formed on peripheral device 480, and interconnect layer 482 is boned with first semiconductor layer 402 using any suitable substrate/wafer bonding process, including, for example, anodic bonding and fusion (direct) bonding, to form bonded interface 106 between first semiconductor structure 102 and second semiconductor structure 104. In one example, fusion bonding may be performed between layers of silicon and silicon, silicon and silicon oxide, or silicon oxide and silicon oxide using pressure and heat. In another example, anodic bonding may be performed between a silicon oxide layer (in an ionic glass) and a silicon layer using voltage, pressure, and heat.

As shown in FIG. 13, first semiconductor structure 102 and second semiconductor structure 104 are bonded in a face-to-face manner. In some implementations, the bonding interface is an implementation of any suitable bonding technique, such as hybrid bonding, anodic bonding, fusion bonding, transfer bonding, adhesive bonding, eutectic bonding, etc. As shown in FIG. 13, first end 404, e.g., the first terminal, is in contact with first semiconductor layer 402 and second end 414, e.g., the second terminal, is bonded with the peripheral circuit. Contact structure 470 electrically connects pad-out structures 472 and the peripheral circuit, and pad-out structure 472 is disposed on the second side of first semiconductor layer 402.

For example, As shown in FIG. 13, first semiconductor structure 102 may be bonded to second semiconductor structure 104 by hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, bonding interface 106 is the place at which the bonding layers are met and bonded. In practice, bonding interface 106 can be a layer with a certain thickness that includes the bonding layers of first semiconductor structure 102 and second semiconductor structure 104.

By utilizing the fabrication method 1400, memory device 400 and memory device 500 may have a vertical arrangement of the source/drain terminals, which can reduce the area of the transistor as well as simplify the layout of the interconnect structures and reduce the fabrication complexity. In addition, memory device 400 and memory device 500 do not need a capacitor storage device to store data. Furthermore, the memory cell array and the peripheral circuits can be formed separately on different substrates to save the cycle time of fabrication.

Figure 15:
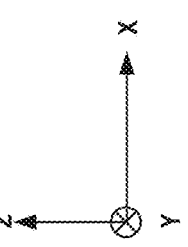

FIG. 15 illustrates a side view of a cross-section of a memory device 1500, according to some aspects of the present disclosure. As shown in FIG. 15, a semiconductor structure 1504 may be formed on a substrate 1502, and substrate 1502 may be a semiconductor layer, e.g., part of a carrier wafer, which can include silicon (e.g., single crystalline silicon, c-Si), silicon germanium (SiGe), gallium arsenide (GaAs), germanium (Ge), silicon-on-insulator (SOI), or any other suitable materials. Semiconductor structure 1504 may be the memory array including a plurality of memory cells 1506 formed on substrate 1502. A plurality of split structures 1508 may be disposed between two memory cells 1506. It is understood that the number of split structures 1508 and memory cells 1506 shown in FIG. 15 is for illustrative purposes only and may have a different design as required. For example, two or more split structures 1508 may be disposed between two memory cells 1506. For another example, two or more memory cells 1506 may be disposed between two split structures 1508.

Each memory cell 1506 includes a semiconductor body 1510. A first end 1512, e.g., a first terminal, and a second end 1514, e.g., a second terminal, are formed at two sides of semiconductor body 1510. In some implementations, semiconductor body 1510 may include semiconductor materials, such as single crystalline silicon, polysilicon, amorphous silicon, Ge, any other semiconductor materials, or any combinations thereof. In one example, semiconductor body 1510 may include single crystalline silicon.

First end 1512 and second end 1514 function as the source and the drain of memory cell 1506. Portions of semiconductor body 1510 between first end 1512 and second end 1514 may function as the channel region of memory cell 1506. In some implementations, first end 1512 and second end 1514 may be doped with N-type dopants (e.g., P or As) or P-type dopants (e.g., B or Ga) at a desired doping level. In some implementations, a silicide layer, such as a metal silicide layer, may be formed between first end 1512 and second end 1514 (source and drain) and the bit line BL or source line SL contacts to reduce the contact resistance.

Around semiconductor body 1510, a dielectric layer 1516 may be formed as a gate insulating layer of memory cell 1506. In some implementations, dielectric layer 1516 (gate dielectric or gate insulating layer) may include dielectric materials, such as silicon oxide, silicon nitride, or high-k dielectrics including, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), or any combination thereof.

A word line 1518 and a plate line 1520 may be formed around dielectric layer 1516 and may function as gate conductor layers. In some implementations, word line 1518 and plate line 1520 may be isolated from each other. It is understood that the word line gate electrodes (e.g., word line gate 208 in FIG. 2) may be part of word line 1518 or extend in the word line direction (e.g., the x-direction) as word line 1518, and the plate line gate electrodes (e.g., plate line gate 210 in FIG. 2) may be part of plate line 1520 or extend in the plate line direction (e.g., the x-direction) as plate line 1520.

In some implementations, word line 1518 and plate line 1520 (including the word line gate electrode and the plate line gate electrode) may include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, word line 1518 and plate line 1520 may include doped polysilicon, i.e., a gate poly. In some implementations, word line 1518 and plate line 1520 may include multiple conductive layers, such as a W layer over a TiN layer. In one example, the word line gate electrode and the plate line gate electrode may be a "gate oxide/gate poly" gate in which the gate dielectric includes silicon oxide, and the gate electrode includes doped polysilicon. In another example, the word line gate electrode and the plate line gate electrode may be a high-k metal gate (HKMG) in which the gate dielectric includes a high-k dielectric, and the gate electrode includes a metal.

As shown in FIG. 15, semiconductor body 1510 extends along the z-direction, and first end 1512 and second end 1514, which function as the source/drain, are formed at the bottom and the top of semiconductor body 1510. Word line 1518 and plate line 1520 may be parallel to each other and extend along the x-direction perpendicular to the z-direction. A contact is formed above semiconductor body 1510 in contact with second end 1514, and a bit line 1522 is formed above the contact. In some implementations, bit line 1522 extends along the y-direction perpendicular to the x-direction and the z-direction. In some implementations, semiconductor body 1510 may be formed from substrate 1502 (e.g., by etching or epitaxy) and thus, may have the same semiconductor material (e.g., single crystalline silicon) as substrate 1502.

In some implementations, memory device 1500 may further include one or more contact structures 1570 extending through semiconductor structures 1504. In some implementations, contact structure 1570 may be electrically coupled to a pad-out structure and/or a peripheral circuit in later operations. Contact structure 1570 can include conductive materials including, but not limited to, W, Co, Cu, Al, silicides, or any combination thereof.

Figure 16:
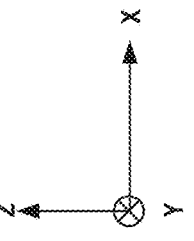

FIG. 16 illustrates a side view of a cross-section of a memory device 1600, according to some aspects of the present disclosure. In some implementations, the structures and materials of memory device 1600 may be similar to the structures and materials of memory device 1500. However, as shown in FIG. 16, there is no dielectric layer 1516 surrounding semiconductor body 1510 in memory device 1600. In other words, word line 1518 and plate line 1520 may be in direct contact with semiconductor body 1510.

In some implementations, each of word line 1518 and plate line 1520 may be formed by a conductive layer, an adhesion layer over the conductive layer, and a high dielectric constant (high-k) dielectric layer over the adhesion layer. In some implementations, the high-k dielectric layer may be in direct contact with semiconductor body 1510 of memory device 1600.

FIG. 17 illustrates a side view of a cross-section of a memory device 1700, according to some aspects of the present disclosure. In some implementations, the structures and materials of memory device 1700 may be similar to the structures and materials of memory device 1500. However, as shown in FIG. 17, there is no contact structures 1570 formed in semiconductor structures 1504.

FIG. 18 illustrates a side view of a cross-section of a memory device 1800, according to some aspects of the present disclosure. In some implementations, the structures and materials of memory device 1800 may be similar to the structures and materials of memory device 1700. However, as shown in FIG. 18, there is no dielectric layer 1516 surrounding semiconductor body 1510 in memory device 1800. In other words, word line 1518 and plate line 1520 may be in direct contact with semiconductor body 1510 of memory device 1800.

Figure 19:
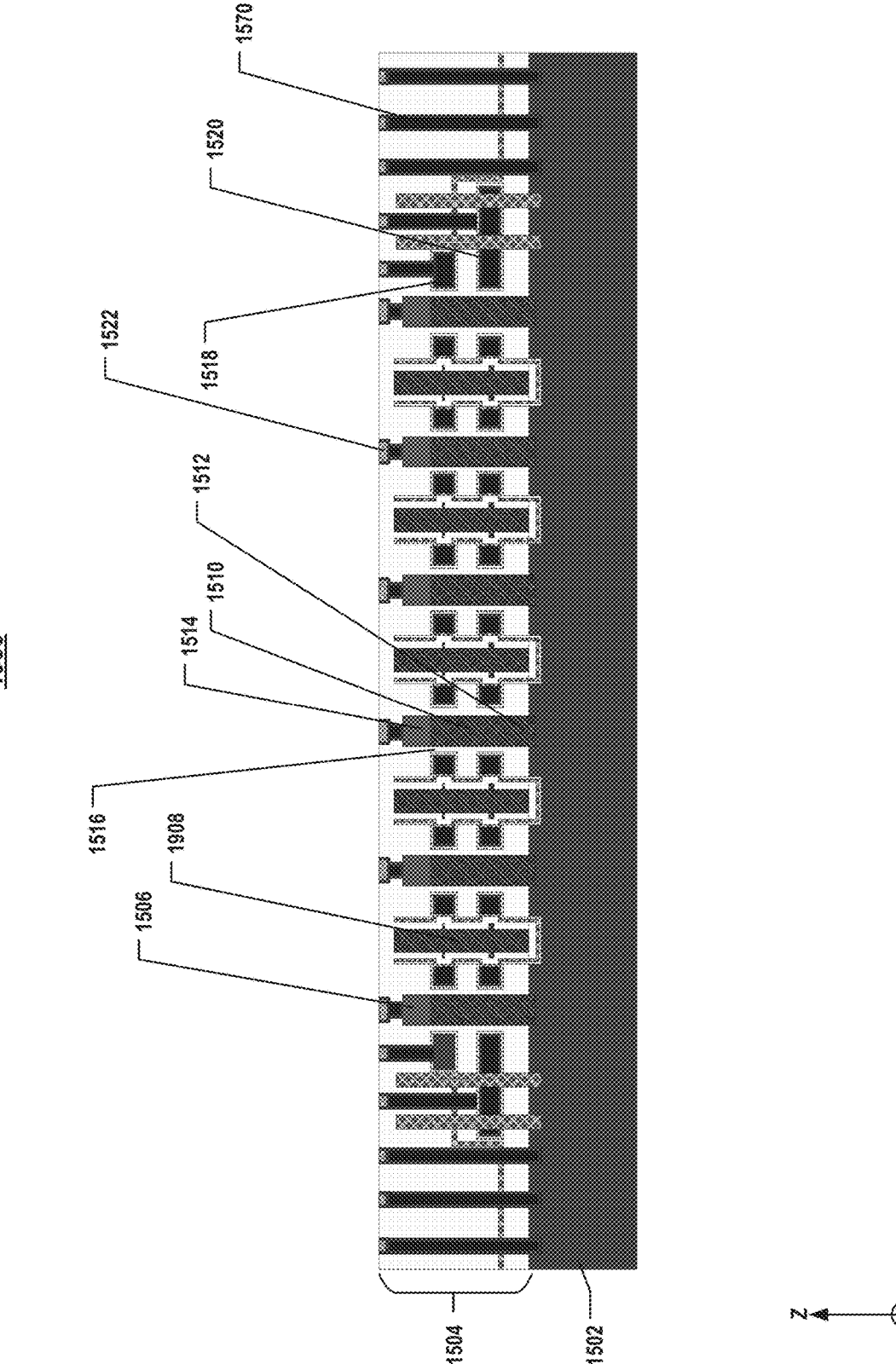

FIG. 19 illustrates a side view of a cross-section of a memory device 1900, according to some aspects of the present disclosure. In some implementations, the structures and materials of memory device 1900 may be similar to the structures and materials of memory device 1500. However, as shown in FIG. 19, two memory cells 1506 are separated by a split structure 1908. A plurality of split structures 1908 may be disposed between two memory cells 1506. It is understood that the number of split structures 1908 and memory cells 1506 shown in FIG. 19 is for illustrative purposes only and may have a different design as required. For example, two or more split structures 1908 may be disposed between two memory cells 1506. For another example, two or more memory cells 1506 may be disposed between two split structures 1908.

Figure 21B:
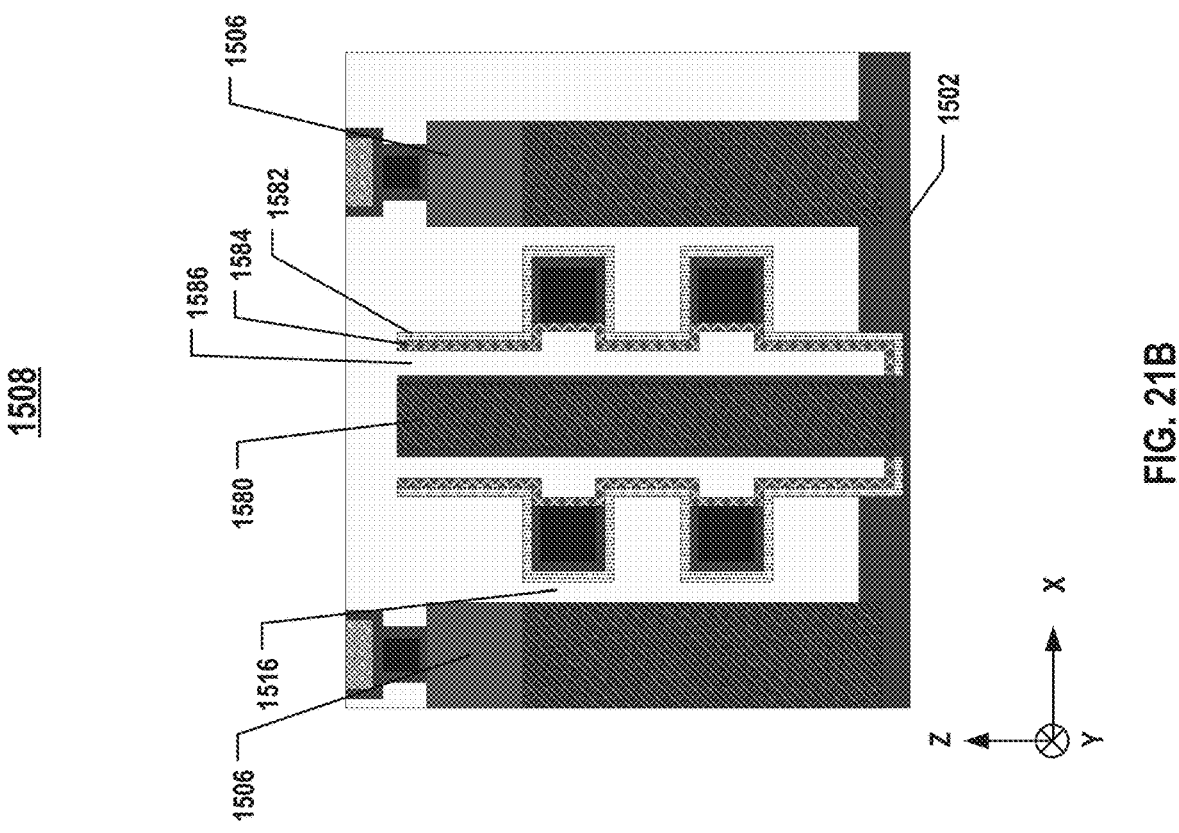
FIGS. 21A-21B illustrate side views of cross-sections of split structures, according to some aspects of the present disclosure.
Figure 21A:
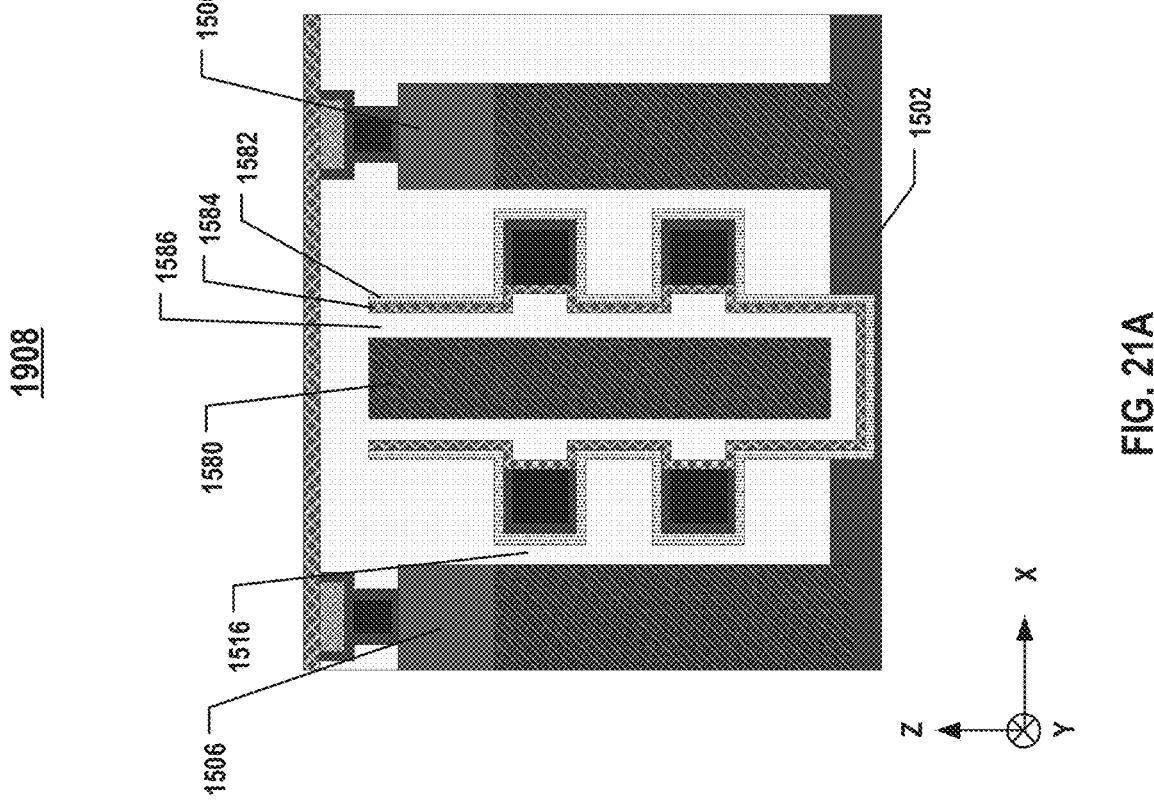

FIGS. 21A and 21B illustrate side views of cross-sections of split structure 1908 and 1508, according to some aspects of the present disclosure. As shown in FIG. 21A, split structure 1908 may be disposed between two memory cells 1506 and extend in the z-direction. In some implementations, split structure 1908 may extend in the z-direction and the y-direction. In some implementations, split structure 1908 may be formed by a dielectric material or a conductive material surrounded by dielectric spacers. In some implementations, split structure 1908 may separate memory cells 1506 into multiple memory blocks and/or memory fingers.

As shown in FIG. 21A, split structure 1908 may include a split core 1580 formed by filling the split opening with conductive materials including, but not limited to, W, Co, Cu, Al, polysilicon, silicides, or any combination thereof. Split structure 1908 may further include a dielectric spacer surrounding split core 1580. In some implementations, the dielectric spacer may include a first dielectric layer 1582, a barrier layer 1584, and a second dielectric layer 1586. In some implementations, first dielectric layer 1582 may be formed by materials including, but not limited to, silicon nitride, high-k dielectrics, such as aluminum oxide ($Al_2O_3$), hafnium oxide ($HfO_2$) or tantalum oxide ($Ta_2O_5$), or any combination thereof. Barrier layer 1584 may prevent the fluorine atoms and/or ions, left during the gate formation operation, from further corroding second dielectric layer 1586. In some implementations, barrier layer 1584 may be formed by high-k dielectric materials including, but not limited to, silicon nitride, aluminum oxide ($Al_2O_3$), hafnium oxide ($HfO_2$) tantalum oxide ($Ta_2O_5$), zirconium oxide ($ZrO_2$), titanium oxide ($TiO_2$), or any combination thereof. In some implementations, second dielectric layer 1586 may include silicon oxide.

As shown in FIG. 21A, first dielectric layer 1582, barrier layer 1584, and second dielectric layer 1586 may surround the side and the bottom of split core 1580. FIG. 21B illustrates a side view of a cross-section of split structure 1508, according to some aspects of the present disclosure. As shown in FIG. 21B, barrier layer 1584, and second dielectric layer 1586 may surround only the side of split core 1580, and the bottom of split core 1580 may be in contact with substrate 1502. A bottom surface of split core 1580 in FIG. 21B is below the top surface of substrate 1502.

FIG. 20 illustrates a side view of a cross-section of a memory device 2000, according to some aspects of the present disclosure. In some implementations, the structures and materials of memory device 2000 may be similar to the structures and materials of memory device 1900. However, as shown in FIG. 20, there is no dielectric layer 1516 surrounding semiconductor body 1510 in memory device 2000. In other words, word line 1518 and plate line 1520 may be in direct contact with semiconductor body 1510 of memory device 2000.

Figure 22A:
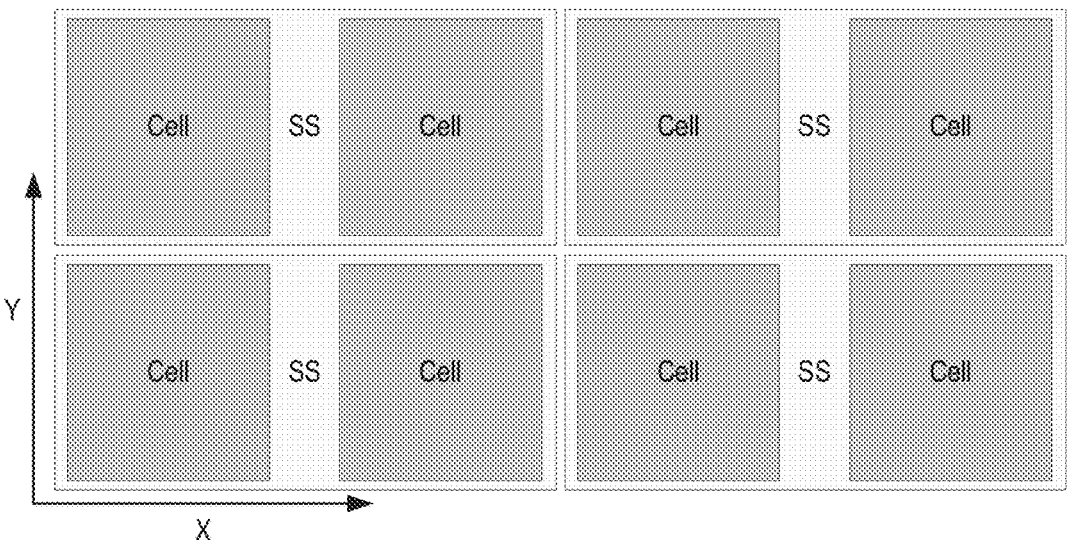
FIGS. 22A-22B illustrate plan views of memory devices, according to some aspects of the present disclosure.
Figure 22B:
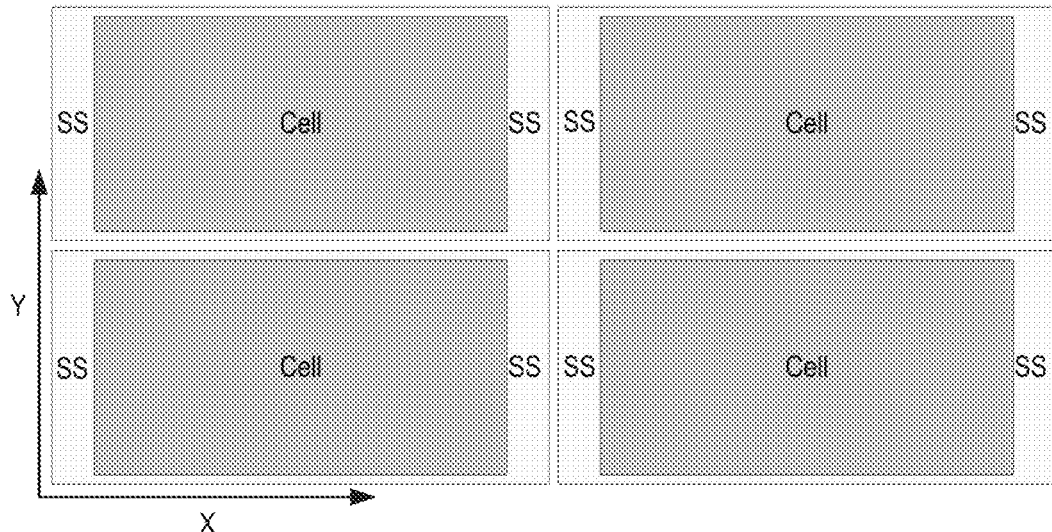

FIGS. 22A-22B illustrate plan views of memory devices 2200 and 2201, according to some aspects of the present disclosure. As shown in FIG. 22A, the staircase region SS may be disposed between two cell regions in a plan view of memory device 2200. As shown in FIG. 22B, the staircase region SS may be disposed at two sides of the cell regions in a plan view of memory devices 2201.

Memory devices 1500, 1600, 1700, 1800, 1900, and 2000 may have a vertical arrangement of the source/drain terminals, which can reduce the area of the transistor as well as simplify the layout of the interconnect structures and reduce the fabrication complexity. In addition, memory devices 1500, 1600, 1700, 1800, 1900, and 2000 do not need a capacitor storage device to store data. Furthermore, the memory cell array and the peripheral circuits can be formed separately on different substrates to save the cycle time of fabrication. Depending on different applications, the pad-out structure may be designed on the front side or the back side of the memory array.

FIGS. 23-30 illustrate a fabrication process for forming memory device 1500, according to some aspects of the present disclosure. FIG. 31 illustrates a flowchart of a method 3100 for forming memory device 1500, according to some aspects of the present disclosure. For the purpose of better describing the present disclosure, memory device 1500 in FIGS. 23-30 and method 3100 in FIG. 31 will be discussed together. It is understood that the operations shown in method 3100 are not exhaustive and that other operations may be performed as well before, after, or between any of the illustrated operations. Further, some of the operations may be performed simultaneously, or in a different order than shown in FIGS. 23-30 and FIG. 31. It is also understood that FIGS. 23-30 illustrate memory device 1500 as an example, and other implementations may also be suitable for the fabrication process.

As shown in FIG. 23 and operation 3102 in FIG. 31, a dielectric stack 1550 is formed on semiconductor layer 1502. In some implementations, semiconductor layer 1502 is provided as a substrate of the fabrication process. In some implementations, semiconductor layer 1502 may be a silicon substrate.

Dielectric stack 1550 may include interleaved first dielectric layers 1552 and second dielectric layers 1554 formed on semiconductor layer 1502. In some implementations, first dielectric layers 1552 may include silicon oxide and second dielectric layers 1554 may include silicon nitride. In some implementations, first dielectric layers 1552 and second dielectric layers 1554 may be formed by one or more thin film deposition processes including, but not limited to, CVD, PVD, ALD, electroplating, electroless plating, or any combination thereof.

As shown in FIG. 23 and operation 3104 in FIG. 31, channel holes 1556 are formed extending in the z-direction in dielectric stack 1550 to expose semiconductor layer 1502. In some implementations, channel holes 1556 penetrate dielectric stack 1550 to expose semiconductor layer 1502. In some implementations, channel holes 1556 may be formed by a plurality of processes including, but not limited to, photolithography, dry/wet etch, and any other suitable processes.

Figure 24:
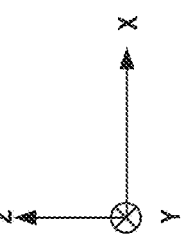

As shown in FIG. 24 and operation 3106 in FIG. 31, channel structures are formed in channel holes 1556 extending in the z-direction. In some implementations, dielectric layer 1516 is formed on sidewalls of channel hole 1556, and semiconductor body 1510 is formed in channel hole 1556. In some implementations, dielectric layer 1516 (gate dielectric or gate insulating layer) may include dielectric materials, such as silicon oxide, silicon nitride, or high-k dielectrics including, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), or any combination thereof. In some implementations, semiconductor body

1510 may include semiconductor materials, such as single crystalline silicon, polysilicon, amorphous silicon, Ge, any other semiconductor materials, or any combinations thereof. In one example, semiconductor body 1510 may include single crystalline silicon. Then, an implantation operation may be performed to form first end 1512 and second end 1514 in semiconductor body 1510.

Figure 25:
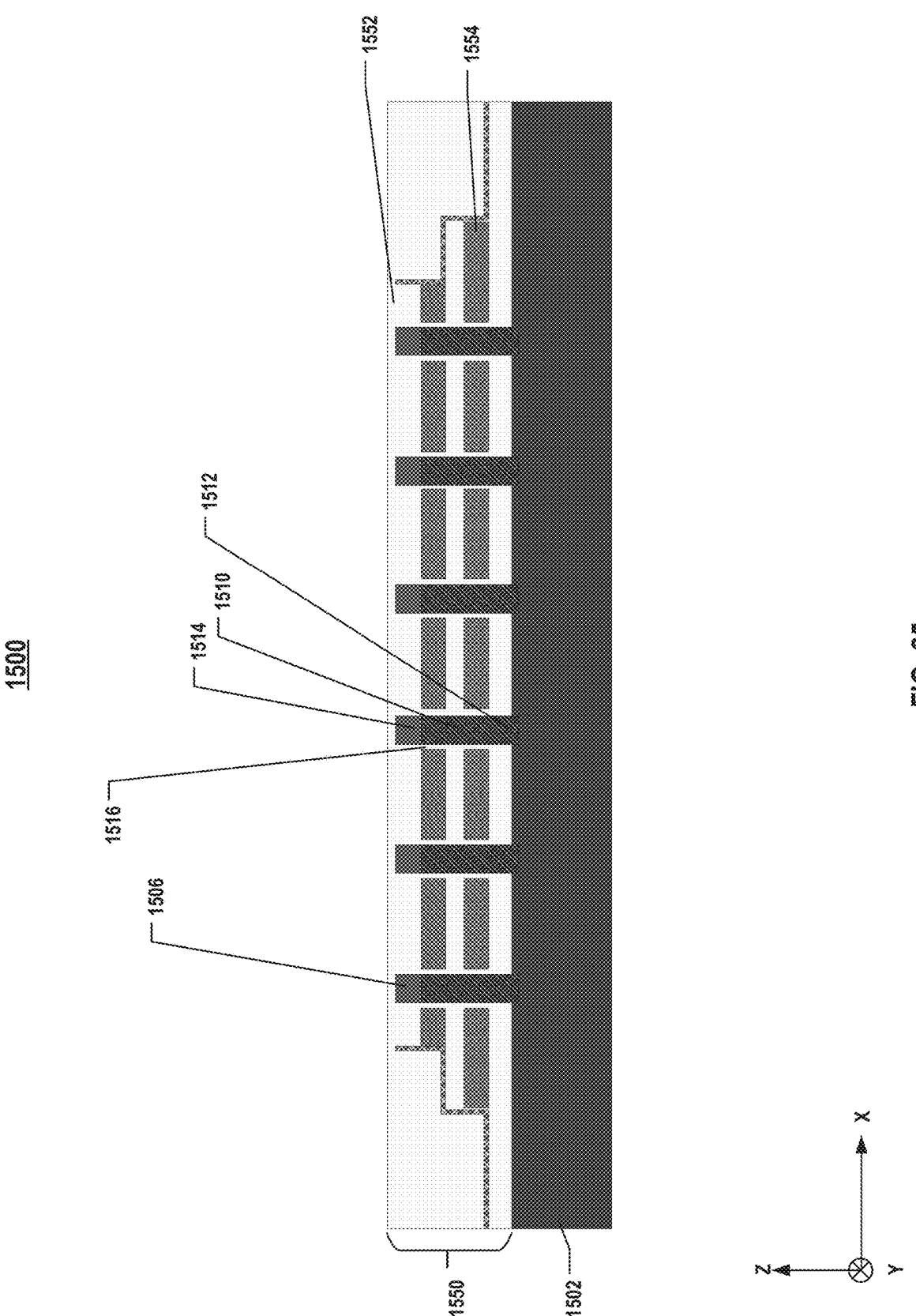

As shown in FIG. 25 and operation 3108 in FIG. 31, a staircase structure may be formed on at least one edge area of dielectric stack 1550. In some implementations, first dielectric layers 1552 and second dielectric layers 1554 may be removed by a plurality of processes including, but not limited to, photolithography, dry/wet etch, CMP, and any other suitable processes.

As shown in FIG. 26 and operation 3110 in FIG. 31, supporting structures 1558 may be formed extending in the z-direction in the edge area of dielectric stack 1550. In some implementations, supporting structures 1558 may include dielectric materials, such as silicon oxide, silicon nitride, or other suitable materials.

Figure 27:
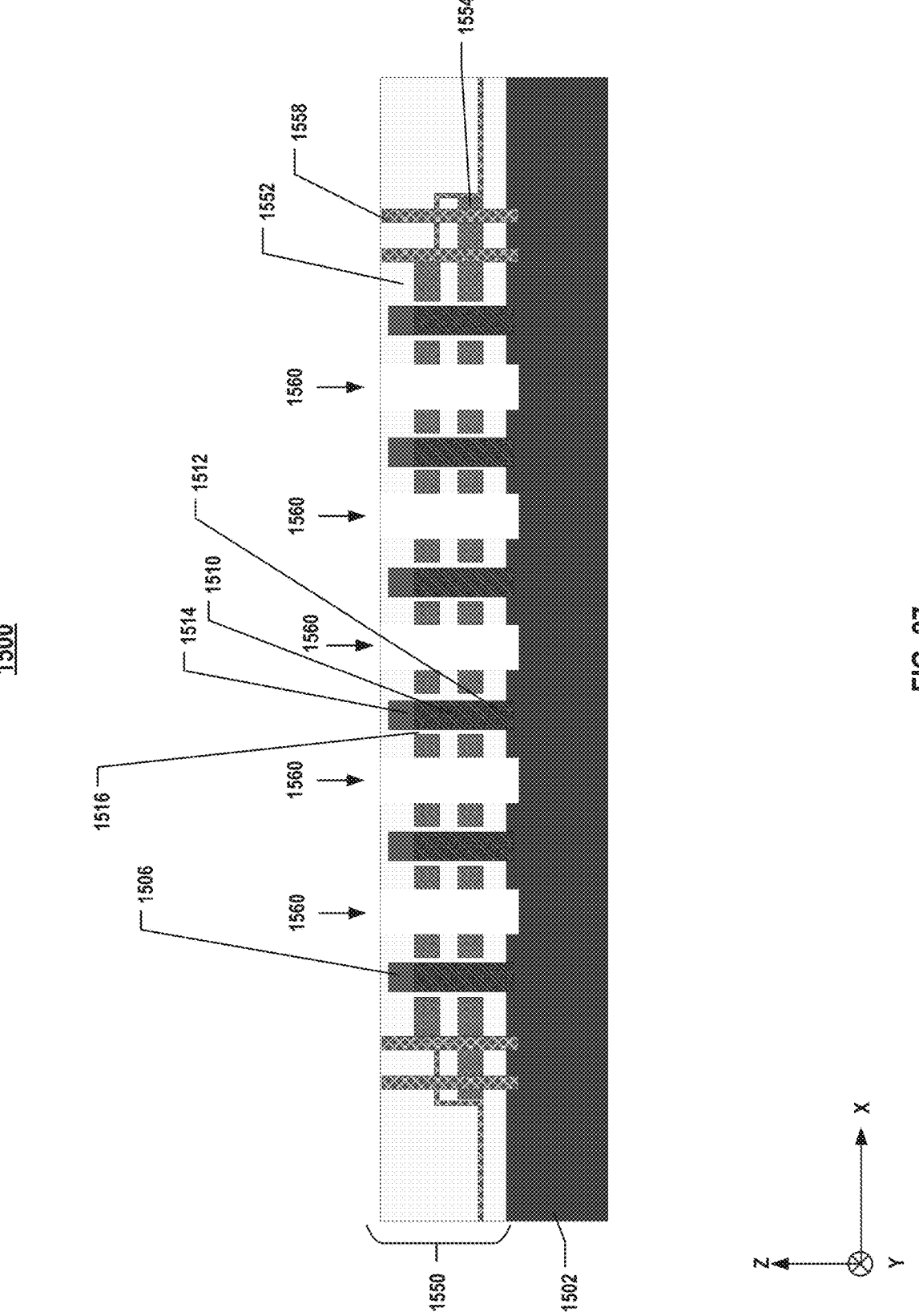

As shown in FIG. 27 and operation 3112 in FIG. 31, split openings 1560 may be formed extending in the z-direction in dielectric stack 1550 to expose semiconductor layer 1502. In some implementations, split openings 1560 penetrate dielectric stack 1550 to expose semiconductor layer 1502. In some implementations, split openings 1560 may be formed by a plurality of processes including, but not limited to, photolithography, dry/wet etch, and any other suitable processes.

Figure 28:
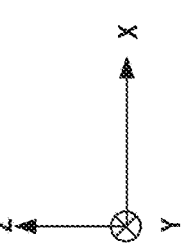
Figure 29:
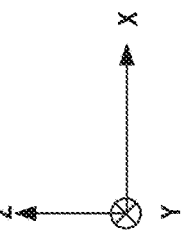

As shown in FIGS. 28-29 and operation 3114 in FIG. 31, second dielectric layers 1554 are replaced with word line 1518 and plate line 1520, extending in the x-direction perpendicular to the z-direction, through split openings 1560. As shown in FIG. 28, in some implementations, second dielectric layers 1554 are removed by dry/wet etch and any other suitable processes to form a plurality of cavities 1562. Then, as shown in FIG. 29, word line 1518 and plate line 1520 are formed in the plurality of cavities 1562. In some implementations, word line 1518 and plate line 1520 may be formed by thin film deposition, thermal growth, and any other suitable processes. In some implementations, word line 1518 and plate line 1520 may include any suitable conductive materials, such as polysilicon, metals (e.g., W, Cu, Al, etc.), metal compounds (e.g., TiN, TaN, etc.), or silicides. For example, word line 1518 and plate line 1520 may include doped polysilicon, i.e., a gate poly. In some implementations, word line 1518 and plate line 1520 may include multiple conductive layers, such as a W layer over a TiN layer.

As shown in FIG. 29 and operation 3116 in FIG. 31, split structures 1508 are formed in split openings 1560. As explained in FIG. 21B, split structure 1508 may include a split core 1580 formed by filling the split opening with conductive materials including, but not limited to, W, Co, Cu, Al, polysilicon, silicides, or any combination thereof. Split structure 1508 may further include a dielectric spacer surrounding split core 1580. In some implementations, the dielectric spacer may include first dielectric layer 1582, barrier layer 1584, and second dielectric layer 1586. In some implementations, first dielectric layer 1582 may be formed by materials including, but not limited to, silicon nitride, high-k dielectrics, such as aluminum oxide ($Al_2O_3$), hafnium oxide ($HfO_2$) or tantalum oxide ($Ta_2O_5$), or any combination thereof. Barrier layer 1584 may prevent the fluorine atoms and/or ions, left during the gate formation operation, from further corroding second dielectric layer 1586. In some implementations, barrier layer 1584 may be formed by high-k dielectric materials including, but not limited to, silicon nitride, aluminum oxide ($Al_2O_3$), hafnium oxide ($HfO_2$) tantalum oxide ($Ta_2O_5$), zirconium oxide ($ZrO_2$), titanium oxide ($TiO_2$), or any combination thereof. In some implementations, second dielectric layer 1586 may include silicon oxide.

Figure 30:
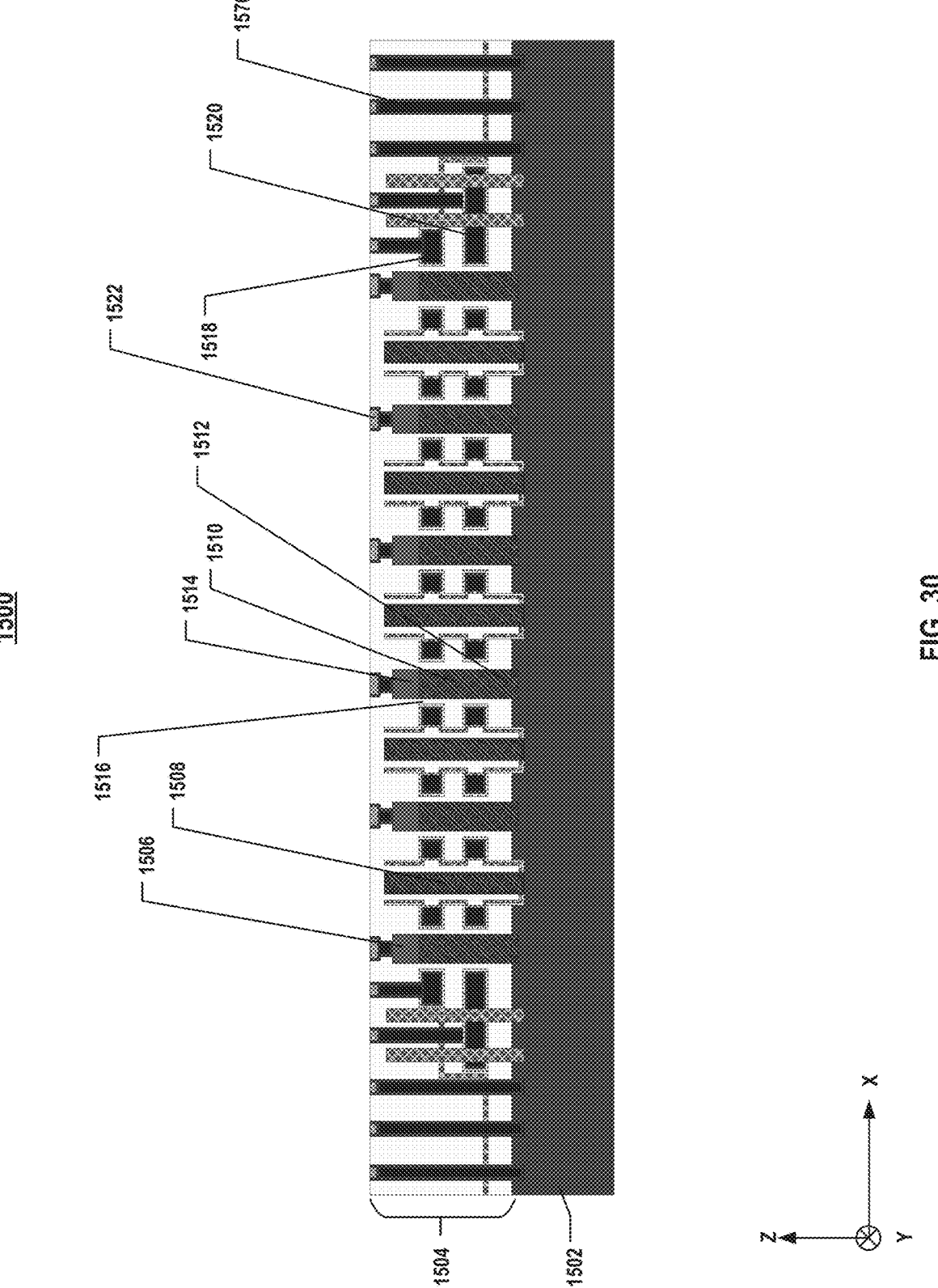

Then, as shown in FIG. 30 and operation 3118 in FIG. 31, an interconnection structure may be formed on memory cells 1506.

By utilizing method 3100, memory device 1500 may have a vertical arrangement of the source/drain terminals, which can reduce the area of the transistor as well as simplify the layout of the interconnect structures and reduce the fabrication complexity. In addition, memory device 1500 does not need a capacitor storage device to store data. Furthermore, the memory cell array and the peripheral circuits can be formed separately on different substrates to save the cycle time of fabrication. Depending on different applications, the pad-out structure may be designed on the front side or the back side of the memory array. It is understood that method 3100 may also be applied for the fabrication of memory devices 1600, 1700, 1800, 1900, and 2000 as well.

Figure 32:
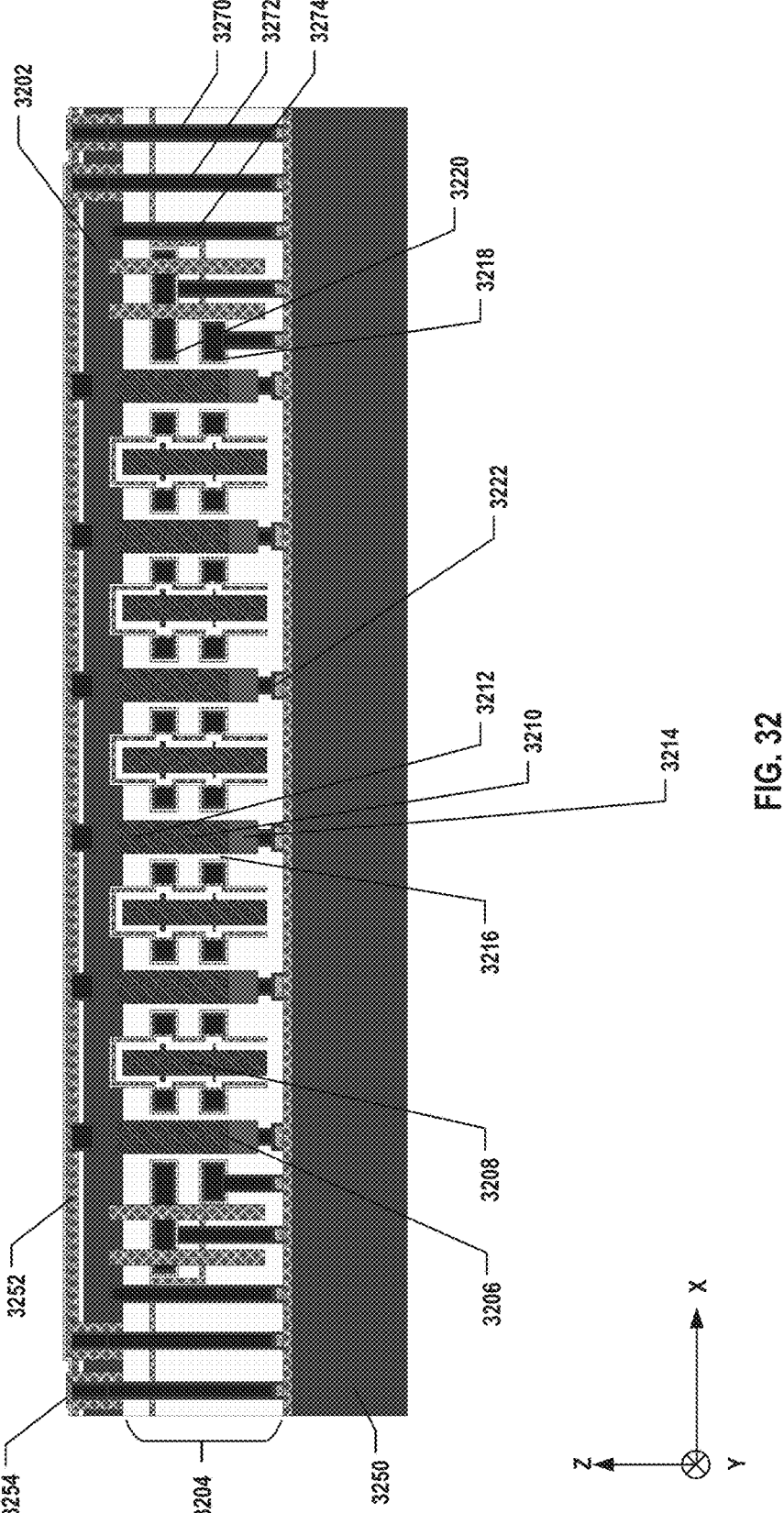
FIGS. 32-37 illustrate side views of cross-sections of various memory devices, according to some aspects of the present disclosure.

FIG. 32 illustrates a side view of a cross-section of a memory device 3200, according to some aspects of the present disclosure. As shown in FIG. 32, a semiconductor structure 3204 may be formed on a substrate 3202, and substrate 3202 may be a semiconductor layer, e.g., part of a carrier wafer, which can include silicon (e.g., single crystalline silicon, c-Si), SiGe, GaAs, Ge, SOI, or any other suitable materials. Semiconductor structure 3204 may be the memory array including a plurality of memory cells 3206 formed on substrate 3202. A plurality of split structures 3208 may be disposed between two memory cells 3206. It is understood that the number of split structures 3208 and memory cells 3206 shown in FIG. 32 is for illustrative purposes only and may have a different design as required. For example, two or more split structures 3208 may be disposed between two memory cells 3206. For another example, two or more memory cells 3206 may be disposed between two split structures 3208.

Each memory cell 3206 includes a semiconductor body 3210. A first end 3212, e.g., a first terminal, and a second end 3214, e.g., a second terminal, are formed at two sides of semiconductor body 3210. In some implementations, semiconductor body 3210 may include semiconductor materials, such as single crystalline silicon, polysilicon, amorphous silicon, Ge, any other semiconductor materials, or any combinations thereof. In one example, semiconductor body 3210 may include single crystalline silicon.

First end 3212 and second end 3214 function as the source and the drain of memory cell 3206. Portions of semiconductor body 3210 between first end 3212 and second end 3214 may function as the channel region of memory cell 3206. In some implementations, first end 3212 and second end 3214 may be doped with N-type dopants (e.g., P or As) or P-type dopants (e.g., B or Ga) at a desired doping level. In some implementations, a silicide layer, such as a metal silicide layer, may be formed between first end 3212 and second end 3214 (source and drain) and the bit line BL or source line SL contacts to reduce the contact resistance.

Around semiconductor body 3210, a dielectric layer 3216 may be formed as a gate insulating layer of memory cell 3206. In some implementations, dielectric layer 3216 (gate dielectric or gate insulating layer) may include dielectric materials, such as silicon oxide, silicon nitride, or high-k dielectrics including, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), or any combination thereof.

A word line 3218 and a plate line 3220 may be formed around dielectric layer 3216 and may function as gate conductor layers. In some implementations, word line 3218 and plate line 3220 may be isolated from each other. It is understood that the word line gate electrodes (e.g., word line gate 208 in FIG. 2) may be part of word line 3218 or extend in the word line direction (e.g., the x-direction) as word line 3218, and the plate line gate electrodes (e.g., plate line gate 210 in FIG. 2) may be part of plate line 3220 or extend in the plate line direction (e.g., the x-direction) as plate line 3220.

In some implementations, word line 3218 and plate line 3220 (including the word line gate electrode and the plate line gate electrode) may include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, word line 3218 and plate line 3220 may include doped polysilicon, i.e., a gate poly. In some implementations, word line 3218 and plate line 3220 may include multiple conductive layers, such as a W layer over a TiN layer. In one example, the word line gate electrode and the plate line gate electrode may be a "gate oxide/gate poly" gate in which the gate dielectric includes silicon oxide, and the gate electrode includes doped polysilicon. In another example, the word line gate electrode and the plate line gate electrode may be a high-k metal gate (HKMG) in which the gate dielectric includes a high-k dielectric, and the gate electrode includes a metal.

As shown in FIG. 32, semiconductor body 3210 extends along the z-direction, and first end 3212 and second end 3214, which function as the source/drain, are formed at the bottom and the top of semiconductor body 3210. Word line 3218 and plate line 3220 may be parallel to each other and extend along the x-direction perpendicular to the z-direction. A contact is formed above semiconductor body 3210 in contact with second end 3214, and a bit line 3222 is formed above the contact. In some implementations, bit line 3222 extends along the y-direction perpendicular to the x-direction and the z-direction. In some implementations, semiconductor body 3210 may be formed from substrate 3202 (e.g., by etching or epitaxy) and thus, may have the same semiconductor material (e.g., single crystalline silicon) as substrate 3202.

In some implementations, memory device 3200 may further include one or more contact structures 3270, 3272, and 3274 extending through semiconductor structures 3204. In some implementations, contact structures 3270 and 3272 may be electrically coupled to interconnection structures 3252 and 3254 and/or a peripheral circuit in later operations. In some implementations, contact structures 3274 may be electrically coupled to substrate 3202 and substrate 3250. Contact structures 3270, 3272, and 3274 can include conductive materials including, but not limited to, W, Co, Cu, Al, silicides, or any combination thereof.

As shown in FIG. 32, semiconductor structures 3204 may be flipped over and bonded on a substrate 3250, e.g., a semiconductor layer, and bit line 3222 is bonded facing substrate 3250. Interconnection structure 3252 may be deposited on substrate 3202, and bit line 3222 and interconnection structure 3252 may be in electric contact through contact structures 3270.

Figure 33:

FIG. 33 illustrates a side view of a cross-section of a memory device 3300, according to some aspects of the present disclosure. In some implementations, the structures and materials of memory device 3300 may be similar to the structures and materials of memory device 3200. However, as shown in FIG. 33, there is no dielectric layer 3216 surrounding semiconductor body 3210 in memory device 3300. In other words, word line 3218 and plate line 3220 may be in direct contact with semiconductor body 3210.

In some implementations, each of word line 3218 and plate line 3220 may be formed by a conductive layer, an adhesion layer over the conductive layer, and a high dielectric constant (high-k) dielectric layer over the adhesion layer. In some implementations, the high-k dielectric layer may be in direct contact with semiconductor body 3210 of memory device 3300.

Figure 34:
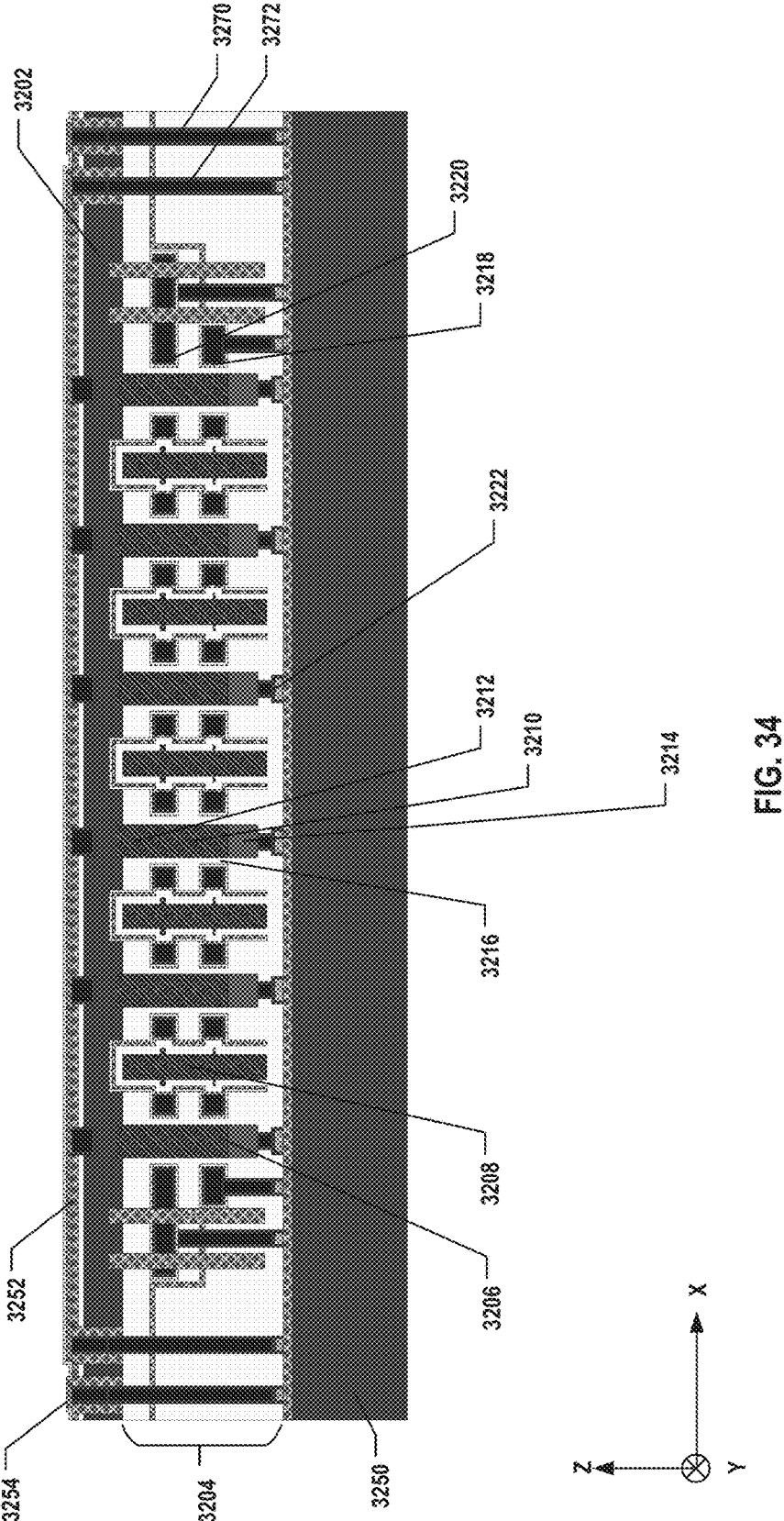

FIG. 34 illustrates a side view of a cross-section of a memory device 3400, according to some aspects of the present disclosure. In some implementations, the structures and materials of memory device 3400 may be similar to the structures and materials of memory device 3200. However, as shown in FIG. 34, there are no contact structures 3274 between substrate 3202 and substrate 3250. In other words, contact structures 3274 may be omitted in some implementations based on various design requirements.

Figure 35:

FIG. 35 illustrates a side view of a cross-section of a memory device 3500, according to some aspects of the present disclosure. In some implementations, the structures and materials of memory device 3500 may be similar to the structures and materials of memory device 3400. However, as shown in FIG. 35, there is no dielectric layer 3216 surrounding semiconductor body 3210 in memory device 3500. In other words, word line 3218 and plate line 3220 may be in direct contact with semiconductor body 3210.

Figure 36:
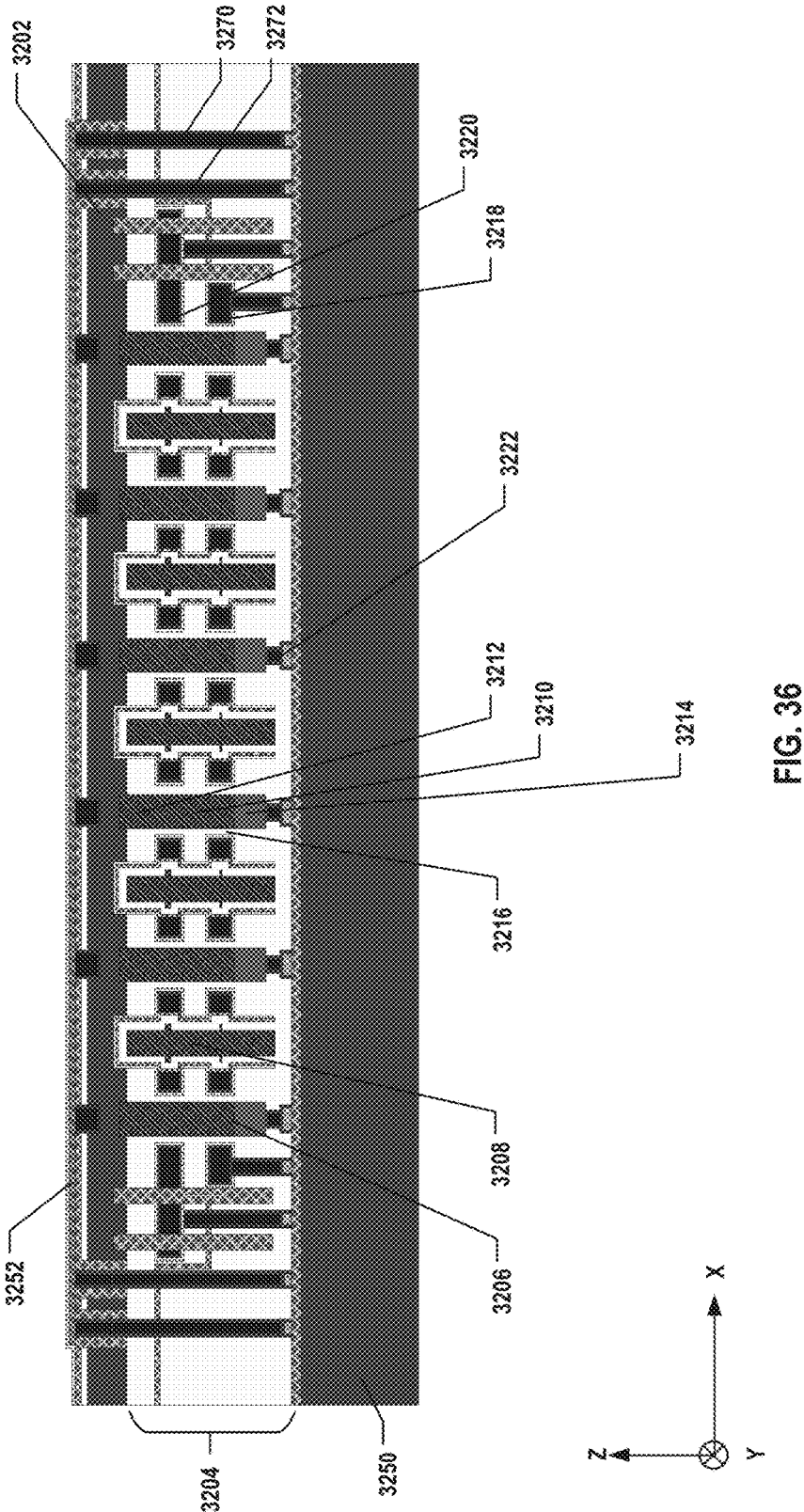

FIG. 36 illustrates a side view of a cross-section of a memory device 3600, according to some aspects of the present disclosure. In some implementations, the structures and materials of memory device 3600 may be similar to the structures and materials of memory device 3200. However, as shown in FIG. 36, contact structures 3270 and 3272 may be electrically coupled to the same interconnection structures 3252 in some implementations based on various design requirements.

Figure 37:
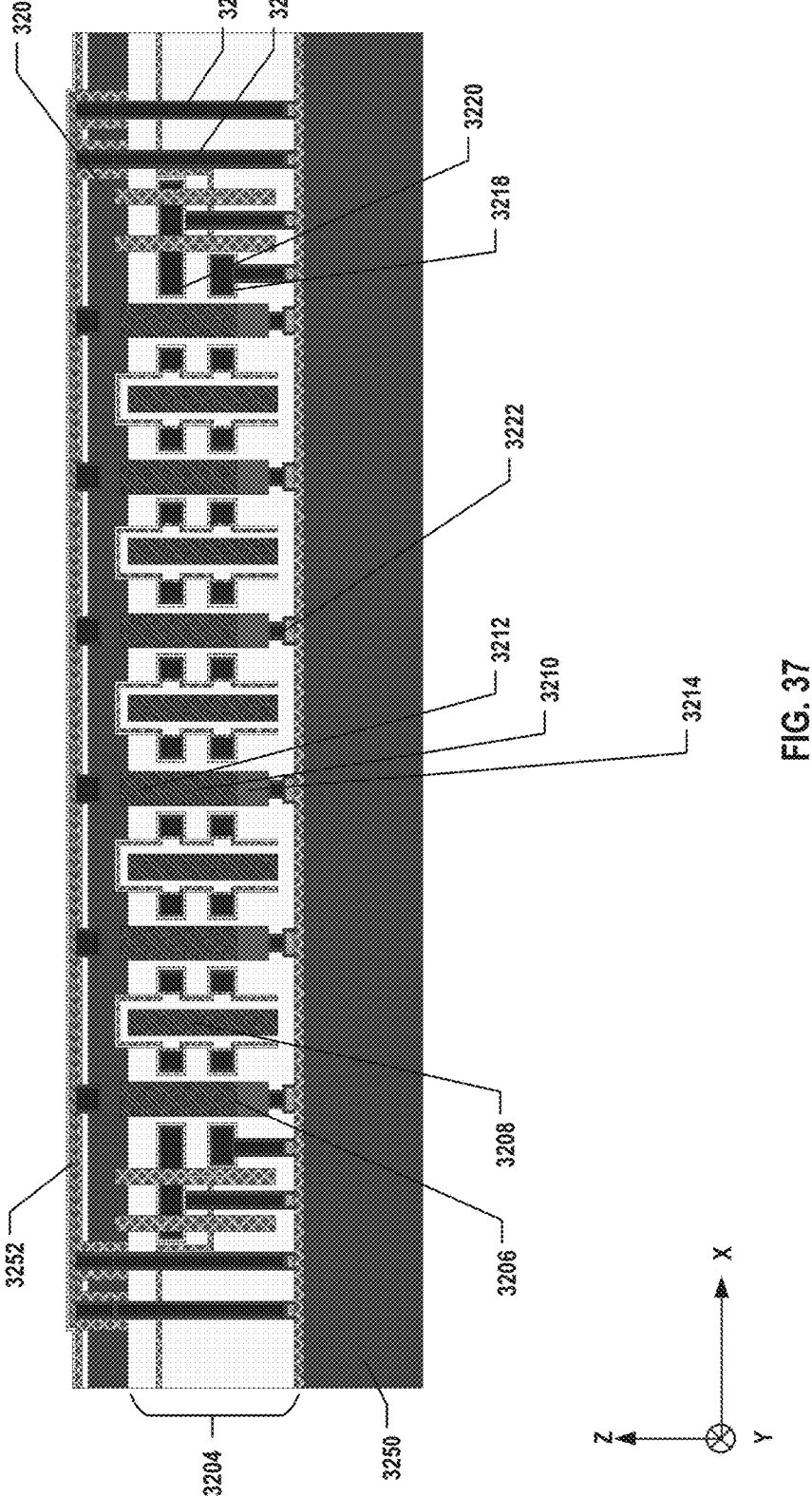

FIG. 37 illustrates a side view of a cross-section of a memory device 3700, according to some aspects of the present disclosure. In some implementations, the structures and materials of memory device 3700 may be similar to the structures and materials of memory device 3600. However, as shown in FIG. 37, there is no dielectric layer 3216 surrounding semiconductor body 3210 in memory device 3700. In other words, word line 3218 and plate line 3220 may be in direct contact with semiconductor body 3210.

FIGS. 38-45 illustrate a fabrication process for forming memory device 3200, according to some aspects of the present disclosure. FIG. 46 illustrates a flowchart of a method 4600 for forming memory device 3200, according to some aspects of the present disclosure. For the purpose of better describing the present disclosure, memory device 3200 in FIGS. 38-45 and method 4600 in FIG. 46 will be discussed together. It is understood that the operations shown in method 4600 are not exhaustive and that other operations may be performed as well before, after, or between any of the illustrated operations. Further, some of the operations may be performed simultaneously, or in a different order than shown in FIGS. 38-45 and in FIG. 46. It is also understood that FIGS. 38-45 illustrate memory device 3200 as an example, and other implementations may also be suitable for the fabrication process.

As shown in FIG. 38 and operation 4602 in FIG. 46, a dielectric stack 3251 is formed on a first side of semiconductor layer 3202, e.g., a first side of a first semiconductor layer. In some implementations, semiconductor layer 3202 is provided as a substrate of the fabrication process. In some implementations, semiconductor layer 3202 may be a silicon substrate.

Dielectric stack 3251 may include interleaved first dielectric layers 3253 and second dielectric layers 3255 formed on semiconductor layer 3202. In some implementations, first dielectric layers 3253 may include silicon oxide, and second dielectric layers 3255 may include silicon nitride. In some implementations, first dielectric layers 3253 and second dielectric layers 3255 may be formed by one or more thin film deposition processes including, but not limited to, CVD, PVD, ALD, electroplating, electroless plating, or any combination thereof.

As shown in FIG. 38 and operation 4604 in FIG. 46, channel holes 3256 are formed extending in the z-direction in dielectric stack 3251 to expose semiconductor layer 3202. In some implementations, channel holes 3256 penetrate dielectric stack 3251 to expose semiconductor layer 3202. In some implementations, channel holes 3256 may be formed by a plurality of processes including, but not limited to, photolithography, dry/wet etch, and any other suitable processes.

Figure 39:
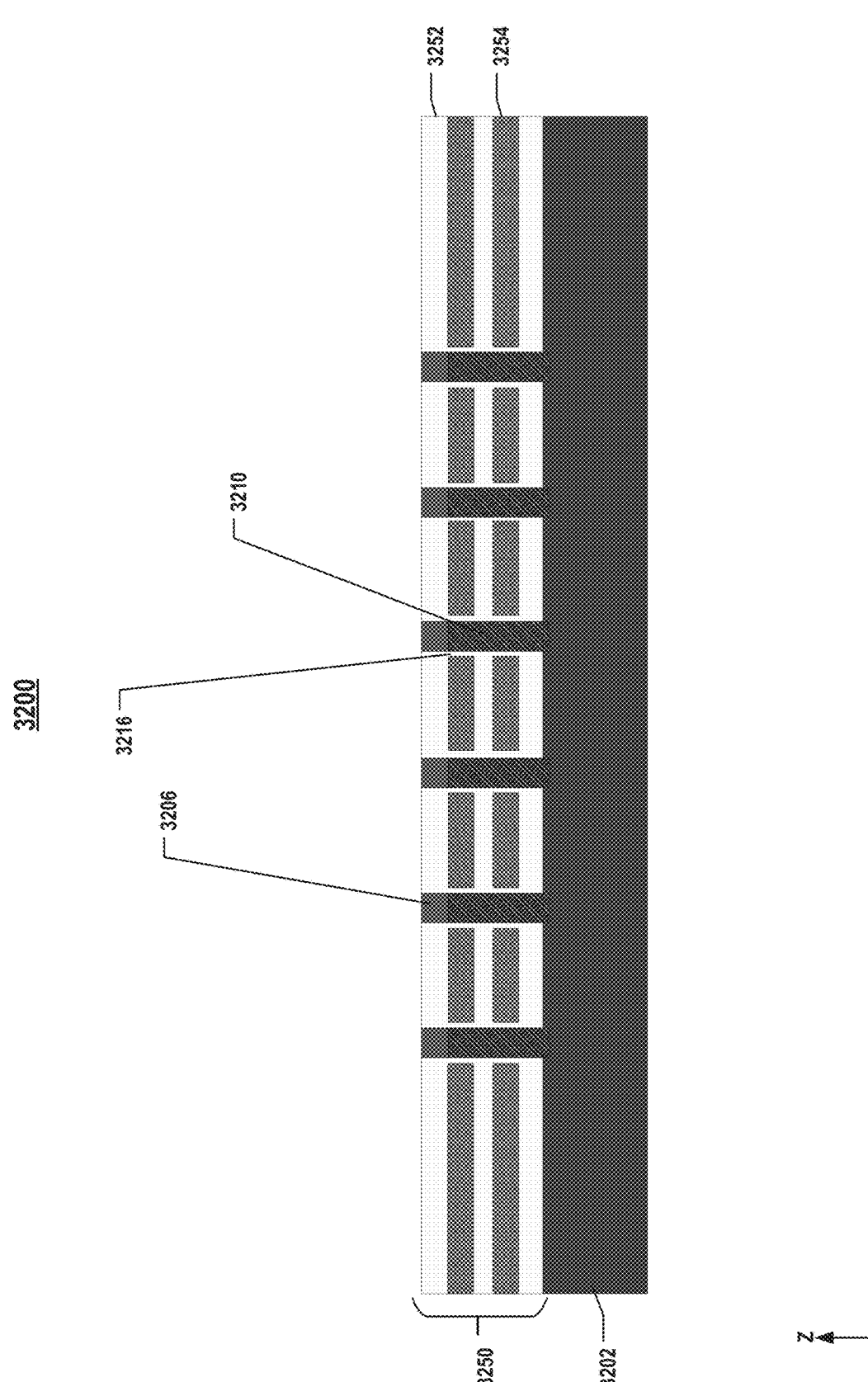

As shown in FIG. 39 and operation 4606 in FIG. 46, channel structures are formed in channel holes 3256 extending in the z-direction. In some implementations, dielectric layer 3216 is formed on sidewalls of channel hole 3256, and semiconductor body 3210 is formed in channel hole 3256. In some implementations, dielectric layer 3216 (gate dielectric or gate insulating layer) may include dielectric materials, such as silicon oxide, silicon nitride, or high-k dielectrics including, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), or any combination thereof. In some implementations, semiconductor body 3210 may include semiconductor materials, such as single crystalline silicon, polysilicon, amorphous silicon, Ge, any other semiconductor materials, or any combinations thereof. In one example, semiconductor body 3210 may include single crystalline silicon. Then, an implantation operation may be performed to form first end 3212 and second end 3214 in semiconductor body 3210.

Figure 40:
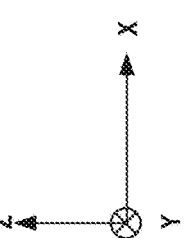

As shown in FIG. 40 and operation 4608 in FIG. 46, a staircase structure may be formed on at least one edge area of dielectric stack 3251. In some implementations, first dielectric layers 3253 and second dielectric layers 3255 may be removed by a plurality of processes including, but not limited to, photolithography, dry/wet etch, CMP, and any other suitable processes.

As shown in FIG. 40 and operation 4610 in FIG. 46, supporting structures 3258 may be formed extending in the z-direction in the edge area of dielectric stack 3251. In some implementations, supporting structures 3258 may include dielectric materials, such as silicon oxide, silicon nitride, or other suitable materials.

As shown in FIG. 40 and operation 4612 in FIG. 46, split openings 3260 may be formed extending in the z-direction in dielectric stack 3251 to expose semiconductor layer 3202. In some implementations, split openings 3260 penetrate dielectric stack 3251 to expose semiconductor layer 3202. In some implementations, split openings 3260 may be formed by a plurality of processes including, but not limited to, photolithography, dry/wet etch, and any other suitable processes.

Figure 41:
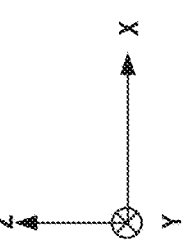
Figure 42:
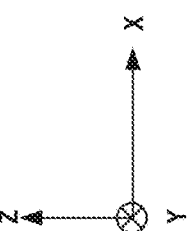

As shown in FIGS. 41-42 and operation 4614 in FIG. 46, second dielectric layers 3255 are replaced with word line 3218 and plate line 3220, extending in the x-direction perpendicular to the z-direction, through split openings 3260. As shown in FIG. 41, in some implementations, second dielectric layers 3255 are removed by dry/wet etch and any other suitable processes to form a plurality of cavities 3262. Then, as shown in FIG. 42, word line 3218 and plate line 3220 are formed in the plurality of cavities 3262. In some implementations, word line 3218 and plate line 3220 may be formed by thin film deposition, thermal growth, and any other suitable processes. In some implementations, word line 3218 and plate line 3220 may include any suitable conductive materials, such as polysilicon, metals (e.g., W, Cu, Al, etc.), metal compounds (e.g., TiN, TaN, etc.), or silicides. For example, word line 3218 and plate line 3220 may include doped polysilicon, i.e., a gate poly. In some implementations, word line 3218 and plate line 3220 may include multiple conductive layers, such as a W layer over a TiN layer.

As shown in FIG. 42 and operation 4616 in FIG. 46, split structures 3208 are formed in split openings 3260. As explained in FIG. 21B, split structure 1508, which is similar to split structure 3208 in FIG. 42, may include a split core 1580 formed by filling the split opening with conductive materials including, but not limited to, W, Co, Cu, Al, polysilicon, silicides, or any combination thereof. Split structure 1508 may further include a dielectric spacer surrounding split core 1580. In some implementations, the dielectric spacer may include first dielectric layer 1582, barrier layer 1584, and second dielectric layer 1586. In some implementations, first dielectric layer 1582 may be formed by materials including, but not limited to, silicon nitride, high-k dielectrics, such as aluminum oxide ($Al_2O_3$), hafnium oxide ($HfO_2$) or tantalum oxide ($Ta_2O_5$), or any combination thereof. Barrier layer 1584 may prevent the fluorine atoms and/or ions, left during the gate formation operation, from further corroding second dielectric layer 1586. In some implementations, barrier layer 1584 may be formed by high-k dielectric materials including, but not limited to, silicon nitride, aluminum oxide ($Al_2O_3$), hafnium oxide ($HfO_2$) tantalum oxide ($Ta_2O_5$), zirconium oxide ($ZrO_2$), titanium oxide ($TiO_2$), or any combination thereof. In some implementations, second dielectric layer 1586 may include silicon oxide.

Then, as shown in FIG. 43 and operation 4618 in FIG. 46, an interconnection structure may be formed on memory cells 1506. In some implementations, the interconnection structure may include contacts and bit lines 3222.

Figure 44:
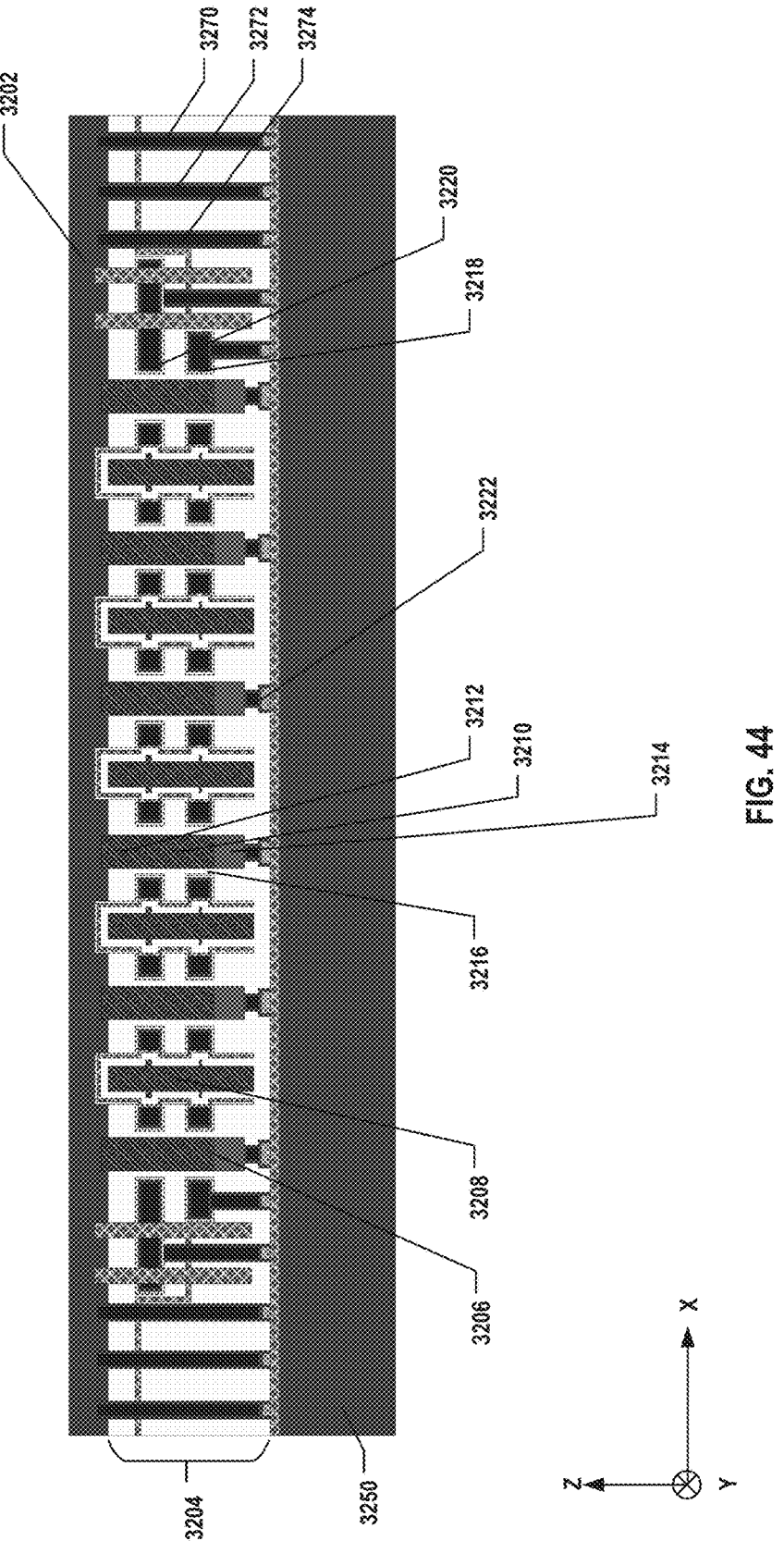

As shown in FIG. 44 and operation 4620 in FIG. 46, semiconductor structures 3204 and substrate 3202 may be flipped over and bonded to substrate 3250, e.g., a second semiconductor layer. In some implementations, as shown in FIG. 44, a thinning operation may be further performed to thin substrate 3202.

Figure 45:

As shown in FIG. 45 and operation 4622 in FIG. 46, interconnection structures 3252 and 3254 may be formed on a second side of substrate 3202. In some implementations, interconnection structures 3252 and 3254 may include the pad-out structure.

By utilizing method 4600, memory device 3200 may have a vertical arrangement of the source/drain terminals, which can reduce the area of the transistor as well as simplify the layout of the interconnect structures and reduce the fabrication complexity. In addition, memory device 3200 does not need a capacitor storage device to store data. Furthermore, the memory cell array and the peripheral circuits can be formed separately on different substrates to save the cycle time of fabrication. Depending on different applications, the pad-out structure may be designed on the front side or the back side of the memory array. It is understood that method 4600 may also be applied for the fabrication of memory devices 3300, 3400, 3500, 3600, and 3700 as well.

Figure 47:
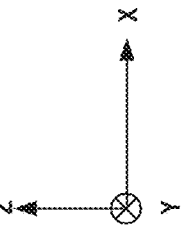
FIGS. 47-52 illustrate side views of cross-sections of various memory devices, according to some aspects of the present disclosure.

FIG. 47 illustrates a side view of a cross-section of a memory device 4700, according to some aspects of the present disclosure. As shown in FIG. 47, a semiconductor structure 4704 may be formed on a first side of a substrate 4702, and substrate 4702 may be a semiconductor layer, e.g., part of a carrier wafer, which can include silicon (e.g., single crystalline silicon, c-Si), SiGe, GaAs, Ge, SOI, or any other suitable materials. Semiconductor structure 4704 may be the memory array including a plurality of memory cells 4706 formed on substrate 4702. A plurality of split structures 4708 may be disposed between two memory cells 4706. It is understood that the number of split structures 4708 and memory cells 4706 shown in FIG. 47 is for illustrative purposes only and may have a different design as required. For example, two or more split structures 4708 may be disposed between two memory cells 4706. For another example, two or more memory cells 4706 may be disposed between two split structures 4708.

Each memory cell 4706 includes a semiconductor body 4710. A first end 4712, e.g., a first terminal, and a second end 4714, e.g., a second terminal, are formed at two sides of semiconductor body 4710. In some implementations, semiconductor body 4710 may include semiconductor materials, such as single crystalline silicon, polysilicon, amorphous silicon, Ge, any other semiconductor materials, or any combinations thereof. In one example, semiconductor body 4710 may include single crystalline silicon.

First end 4712 and second end 4714 function as the source and the drain of memory cell 4706. Portions of semiconductor body 4710 between first end 4712 and second end 4714 may function as the channel region of memory cell 4706. In some implementations, first end 4712 and second end 4714 may be doped with N-type dopants (e.g., P or As) or P-type dopants (e.g., B or Ga) at a desired doping level. In some implementations, a silicide layer, such as a metal silicide layer, may be formed between first end 4712 and second end 4714 (source and drain) and the bit line BL or source line SL contacts to reduce the contact resistance.

Around semiconductor body 4710, a dielectric layer 4716 may be formed as a gate insulating layer of memory cell 4706. In some implementations, dielectric layer 4716 (gate dielectric or gate insulating layer) may include dielectric materials, such as silicon oxide, silicon nitride, or high-k dielectrics including, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), or any combination thereof.

A word line 4718 and a plate line 4720 may be formed around dielectric layer 4716 and may function as gate conductor layers. In some implementations, word line 4718 and plate line 4720 may be isolated from each other. It is understood that the word line gate electrodes (e.g., word line gate 208 in FIG. 2) may be part of word line 4718 or extend in the word line direction (e.g., the x-direction) as word line 4718, and the plate line gate electrodes (e.g., plate line gate 210 in FIG. 2) may be part of plate line 4720 or extend in the plate line direction (e.g., the x-direction) as plate line 4720.

In some implementations, word line 4718 and plate line 4720 (including the word line gate electrode and the plate line gate electrode) may include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, word line 4718 and plate line 4720 may include doped polysilicon, i.e., a gate poly. In some implementations, word line 4718 and plate line 4720 may include multiple conductive layers, such as a W layer over a TiN layer. In one example, the word line gate electrode and the plate line gate electrode may be a "gate oxide/gate poly" gate in which the gate dielectric includes silicon oxide, and the gate electrode includes doped polysilicon. In another example, the word line gate electrode and the plate line gate electrode may be a high-k metal gate (HKMG) in which the gate dielectric includes a high-k dielectric, and the gate electrode includes a metal.

As shown in FIG. 47, semiconductor body 4710 extends along the z-direction, and first end 4712 and second end 4714, which function as the source/drain, are formed at the bottom and the top of semiconductor body 4710. Word line 4718 and plate line 4720 may parallel to each other and extend along the x-direction perpendicular to the z-direction. A contact is formed above semiconductor body 4710 in contact with second end 4714, and a bit line 4722 is formed above the contact. In some implementations, bit line 4722 extends along the y-direction perpendicular to the x-direction and the z-direction. In some implementations, semiconductor body 4710 may be formed from substrate 4702 (e.g., by etching or epitaxy) and thus, may have the same semiconductor material (e.g., single crystalline silicon) as substrate 4702.

In some implementations, memory device 4700 may further include one or more contact structures 4770 and 4772 extending through semiconductor structures 4704. In some implementations, contact structures 4770 and 4772 may be electrically coupled to pad-out structures 4752 and 4754 and/or a peripheral circuit in later operations. Contact structures 4770 and 4772 can include conductive materials including, but not limited to, W, Co, Cu, Al, silicides, or any combination thereof.

As shown in FIG. 47, semiconductor structures 4704 may be flipped over and bonded on a first side of a substrate 4750, e.g., a semiconductor layer, and bit line 4722 is bonded facing substrate 4750. Pad-out structures 4752 and 4754 may be deposited on a second side of substrate 4702, and bit line 4722 and pad-out structure 4752 may be in electric contact through contact structures 4770.

A peripheral circuit including a plurality of peripheral devices 4782 may be deposited on a second side of substrate 4750, and the peripheral circuit may be bonded to a supporting substrate 4780. The peripheral circuits (a.k.a. control and sensing circuits) can include any suitable digital, analog, and/or mixed-signal circuits used for facilitating the operations of the memory cell array. For example, the peripheral circuit can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits use complementary metal-oxide-semiconductor (CMOS) technology, e.g., which can be implemented with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations.

As shown in FIG. 47, pad-out structures 4752 and 4754 are formed above substrate 4702. In other words, pad-out structures 4752 and 4754 are formed on the second side of substrate 4702.

Figure 48:

FIG. 48 illustrates a side view of a cross-section of a memory device 4800, according to some aspects of the present disclosure. In some implementations, the structures and materials of memory device 4800 may be similar to the structures and materials of memory device 4700. However, as shown in FIG. 48, a supporting substrate 4784 is formed above substrate 4702, and pad-out structures 4786 are formed beneath the peripheral circuit. In other words, the supporting substrate may be formed beneath memory device, e.g., memory device 4700, or above memory device, e.g., memory device 4800, depending on the various design requirements.

Figure 49:
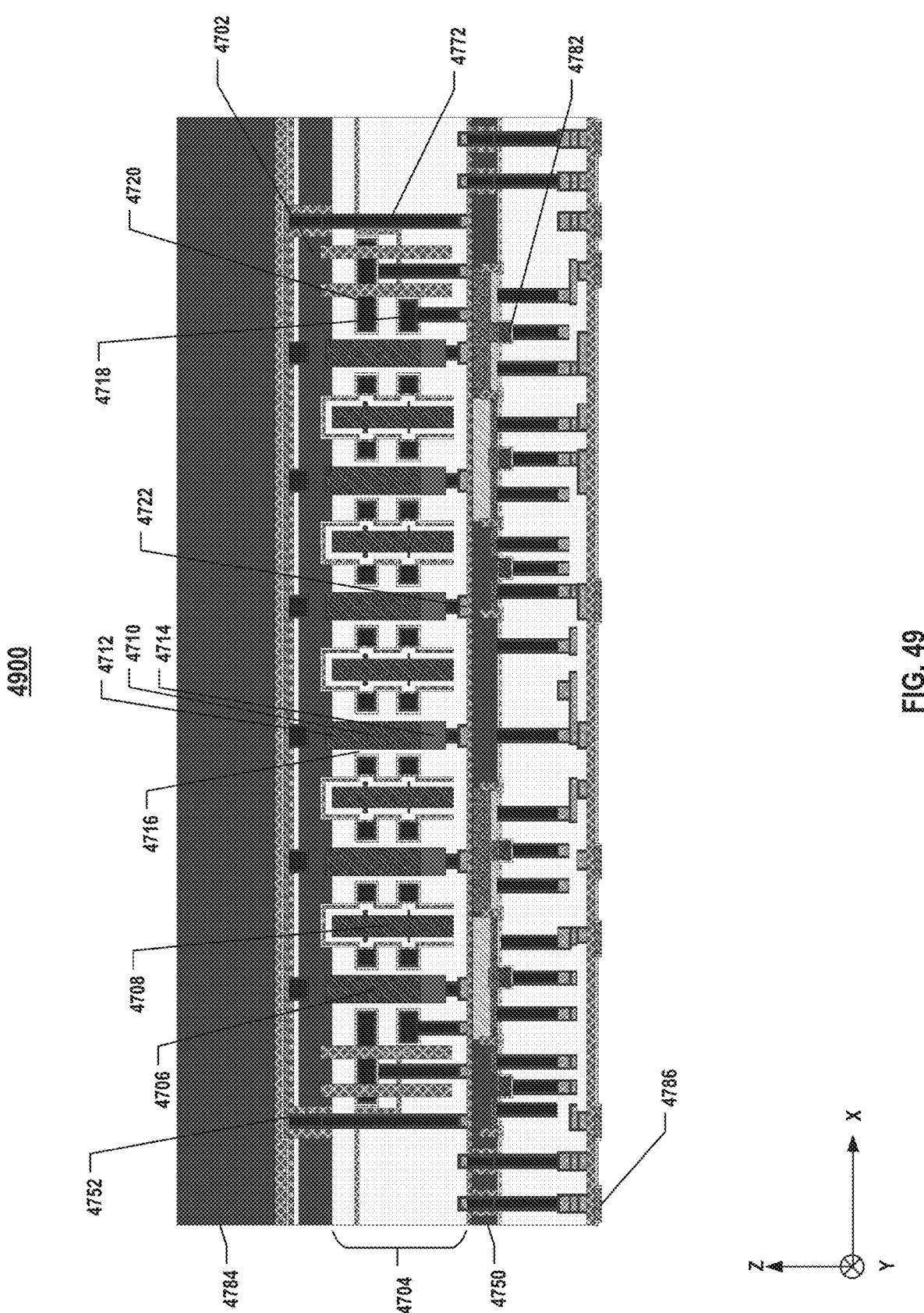

FIG. 49 illustrates a side view of a cross-section of a memory device 4900, according to some aspects of the present disclosure. In some implementations, the structures and materials of memory device 4900 may be similar to the structures and materials of memory device 4800. However, as shown in FIG. 49, only contact structure 4772 is formed in semiconductor structure 4704. In other words, the number of contact structures 4770 and/or 4772 may be changed based on different design requirements.

Figure 50:
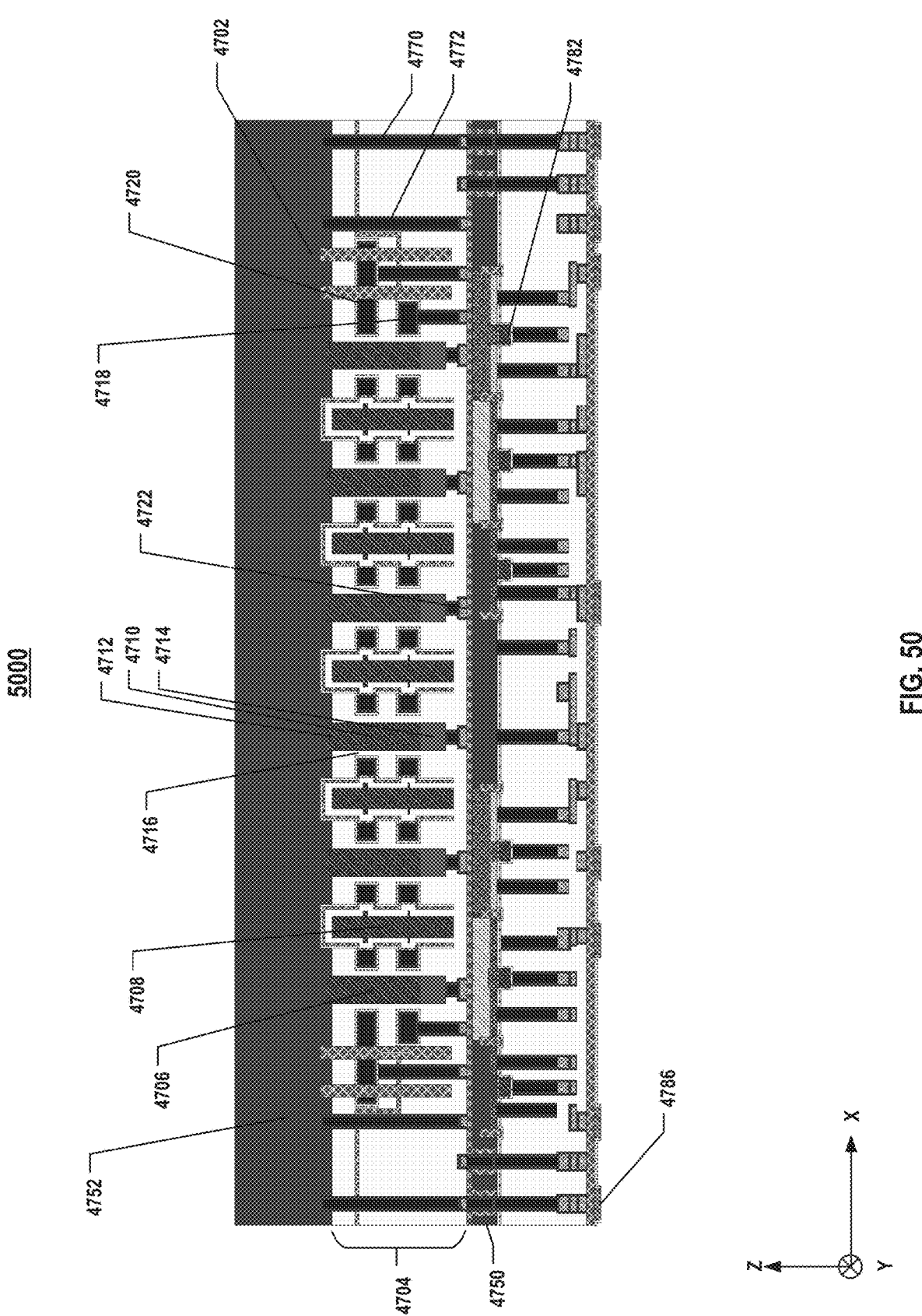

FIG. 50 illustrates a side view of a cross-section of a memory device 5000, according to some aspects of the present disclosure. In some implementations, the structures and materials of memory device 5000 may be similar to the structures and materials of memory device 4800. However, as shown in FIG. 50, there is no supporting substrate 4784 formed above substrate 4702, and pad-out structure 4786 is formed beneath the peripheral circuit. In other words, the pad-out structures may be designed on only one side of the memory device, or on both sides of the memory device based on different design requirements.

Figure 51:
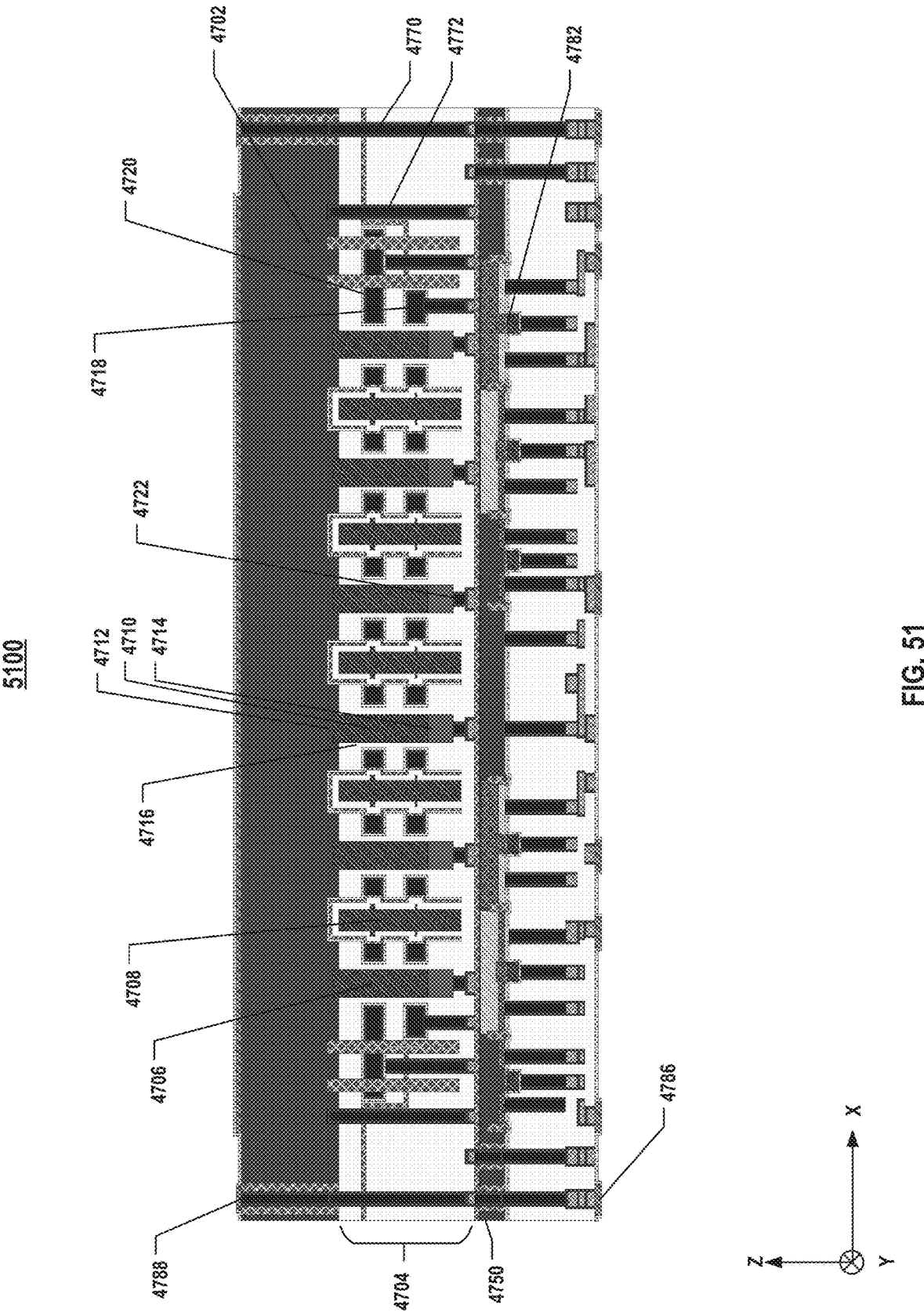

FIG. 51 illustrates a side view of a cross-section of a memory device 5100, according to some aspects of the present disclosure. In some implementations, the structures and materials of memory device 5100 may be similar to the structures and materials of memory device 5000. However, as shown in FIG. 51, a pad-out structure 4788 may be further formed above substrate 4702, e.g., the second side of substrate 4702. In other words, the pad-out structures may be designed on only one side of the memory device, or on both sides of the memory device based on different design requirements.

Figure 52:
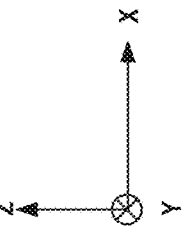

FIG. 52 illustrates a side view of a cross-section of a memory device 5200, according to some aspects of the present disclosure. In some implementations, the structures and materials of memory device 5200 may be similar to the structures and materials of memory device 5100. However, as shown in FIG. 52, only pad-out structure 4788 is formed above substrate 4702, e.g., the second side of substrate 4702, and pad-out structure 4786 is omitted in memory device 5200. In other words, the pad-out structures may be designed on only one side of the memory device, or on both sides of the memory device based on different design requirements.

FIGS. 53-61 illustrate a fabrication process for forming memory device 4700, according to some aspects of the present disclosure. FIG. 62 illustrates a flowchart of a method 6200 for forming memory device 4700, according to some aspects of the present disclosure. For the purpose of better describing the present disclosure, memory device 4700 in FIGS. 53-61 and method 6200 in FIG. 62 will be discussed together. It is understood that the operations shown in method 6200 are not exhaustive and that other operations may be performed as well before, after, or between any of the illustrated operations. Further, some of the operations may be performed simultaneously, or in a different order than shown in FIGS. 53-61 and in FIG. 62. It is also understood that FIGS. 53-61 illustrate memory device 4700 as an example, and other implementations may also be suitable for the fabrication process.

As shown in FIGS. 53-57 and operation 6202 in FIG. 62, an array of memory cells 4706 is formed on a first side of substrate 4702, e.g., a first semiconductor layer. As shown in FIG. 53, a dielectric stack 4751 is formed on a first side of semiconductor layer 4702, e.g., a first side of a first semiconductor layer. In some implementations, semiconductor layer 4702 is provided as a substrate of the fabrication process. In some implementations, semiconductor layer 4702 may be a silicon substrate.

Dielectric stack 4751 may include interleaved first dielectric layers 4753 and second dielectric layers 4755 formed on semiconductor layer 4702. In some implementations, first dielectric layers 4753 may include silicon oxide and second dielectric layers 4755 may include silicon nitride. In some implementations, first dielectric layers 4753 and second dielectric layers 4755 may be formed by one or more thin film deposition processes including, but not limited to, CVD, PVD, ALD, electroplating, electroless plating, or any combination thereof.

As shown in FIG. 53, channel holes 4756 are formed extending in the z-direction in dielectric stack 4751 to expose semiconductor layer 4702. In some implementations, channel holes 4756 penetrate dielectric stack 4751 to expose semiconductor layer 4702. In some implementations, channel holes 4756 may be formed by a plurality of processes including, but not limited to, photolithography, dry/wet etch, and any other suitable processes.

Figure 54:
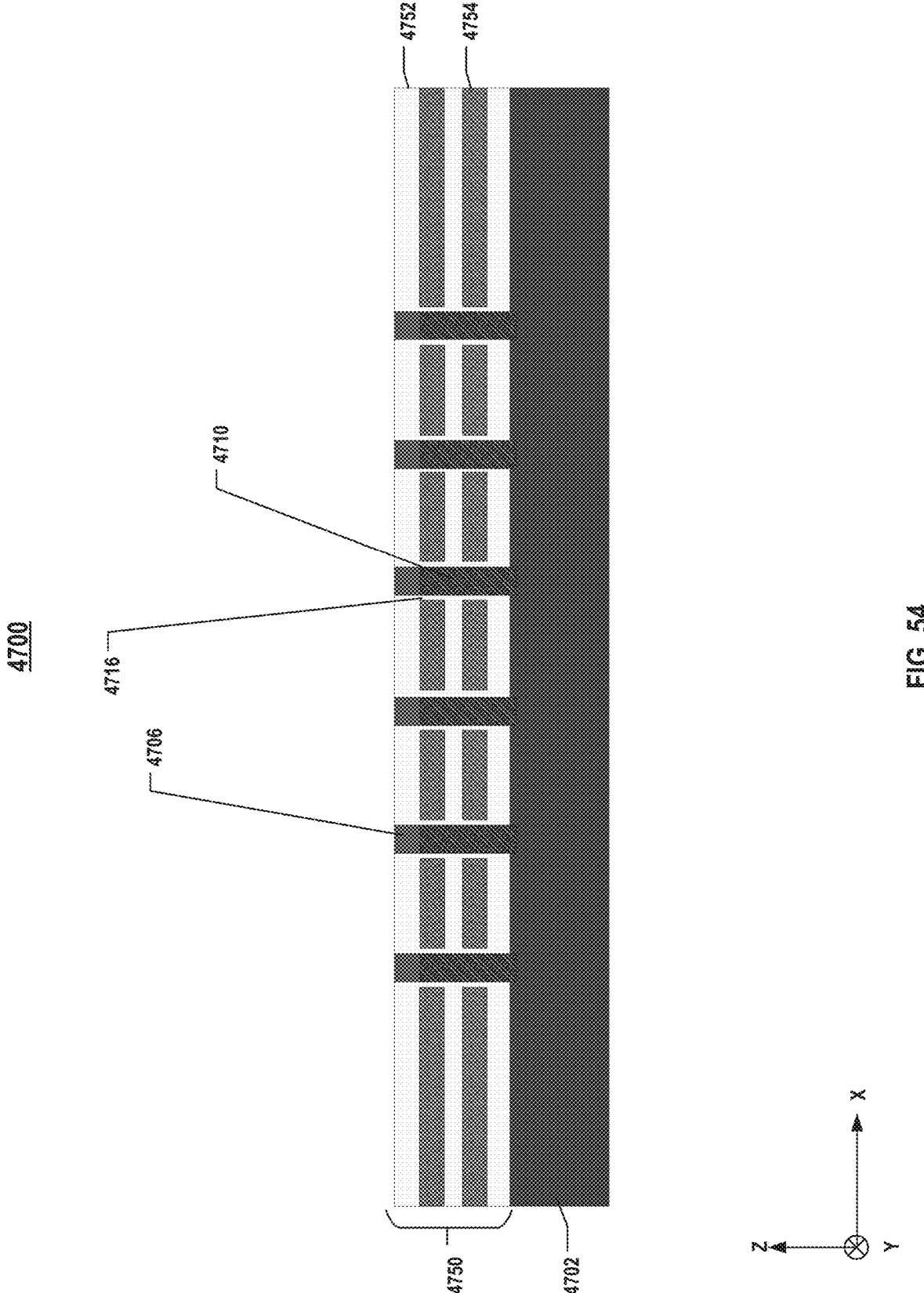

As shown in FIG. 54, channel structures are formed in channel holes 4756 extending in the z-direction. In some implementations, dielectric layer 4716 is formed on sidewalls of channel hole 4756, and semiconductor body 4710 is formed in channel hole 4756. In some implementations, dielectric layer 4716 (gate dielectric or gate insulating layer) may include dielectric materials, such as silicon oxide, silicon nitride, or high-k dielectrics including, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), or any combination thereof. In some implementations, semiconductor body 4710 may include semiconductor materials, such as single crystalline silicon, polysilicon, amorphous silicon, Ge, any other semiconductor materials, or any combinations thereof. In one example, semiconductor body 4710 may include single crystalline silicon. Then, an implantation operation may be performed to form first end 4712 and second end 4714 in semiconductor body 4710.

Figure 55:
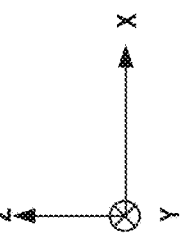

As shown in FIG. 55, a staircase structure may be formed on at least one edge area of dielectric stack 4751. In some implementations, first dielectric layers 4753 and second dielectric layers 4755 may be removed by a plurality of processes including, but not limited to, photolithography, dry/wet etch, CMP, and any other suitable processes.

As shown in FIG. 55, supporting structures 4758 may be formed extending in the z-direction in the edge area of dielectric stack 4751. In some implementations, supporting structures 4758 may include dielectric materials, such as silicon oxide, silicon nitride, or other suitable materials.

As shown in FIG. 55, split openings 4760 may be formed extending in the z-direction in dielectric stack 4751 to expose semiconductor layer 4702. In some implementations, split openings 4760 penetrate dielectric stack 4751 to expose semiconductor layer 4702. In some implementations, split openings 4760 may be formed by a plurality of processes including, but not limited to, photolithography, dry/wet etch, and any other suitable processes.

Figure 56:
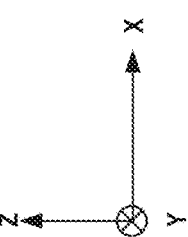

As shown in FIGS. 55-56, second dielectric layers 4755 are replaced with word line 4718 and plate line 4720, extending in the x-direction perpendicular to the z-direction, through split openings 4760. As shown in FIG. 55, in some implementations, second dielectric layers 4755 are removed by dry/wet etch and any other suitable processes to form a plurality of cavities 4762. Then, as shown in FIG. 56, word line 4718 and plate line 4720 are formed in the plurality of cavities 4762. In some implementations, word line 4718 and plate line 4720 may be formed by thin film deposition, thermal growth, and any other suitable processes. In some implementations, word line 4718 and plate line 4720 may include any suitable conductive materials, such as polysilicon, metals (e.g., W, Cu, Al, etc.), metal compounds (e.g., TiN, TaN, etc.), or silicides. For example, word line 4718 and plate line 4720 may include doped polysilicon, i.e., a gate poly. In some implementations, word line 4718 and plate line 4720 may include multiple conductive layers, such as a W layer over a TiN layer.

As shown in FIG. 56, split structures 4708 are formed in split openings 4760. As explained in FIG. 21B, split structure 1508, which is similar to split structure 4708 in FIG. 56, may include a split core 1580 formed by filling the split opening with conductive materials including, but not limited to, W, Co, Cu, Al, polysilicon, silicides, or any combination thereof. Split structure 1508 may further include a dielectric spacer surrounding split core 1580. In some implementations, the dielectric spacer may include first dielectric layer 1582, barrier layer 1584, and second dielectric layer 1586. In some implementations, first dielectric layer 1582 may be formed by materials including, but not limited to, silicon nitride, high-k dielectrics, such as aluminum oxide ($Al_2O_3$), hafnium oxide ($HfO_2$) or tantalum oxide ($Ta_2O_5$), or any combination thereof. Barrier layer 1584 may prevent the fluorine atoms and/or ions, left during the gate formation operation, from further corroding second dielectric layer 1586. In some implementations, barrier layer 1584 may be formed by high-k dielectric materials including, but not limited to, silicon nitride, aluminum oxide ($Al_2O_3$), hafnium oxide ($HfO_2$) tantalum oxide ($Ta_2O_5$), zirconium oxide ($ZrO_2$), titanium oxide ($TiO_2$), or any combination thereof. In some implementations, second dielectric layer 1586 may include silicon oxide.

Figure 57:
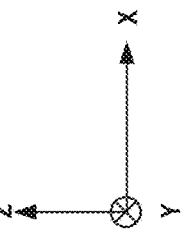

Then, as shown in FIG. 57, an interconnection structure may be formed on memory cells 4706. In some implementations, the interconnection structure may include contacts and bit lines 4722.

Figure 58:
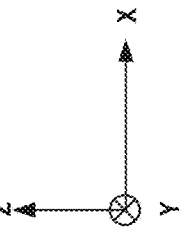

As shown in FIG. 58 and operation 6204 in FIG. 62, substrate 4750, e.g., a second semiconductor layer, is formed on semiconductor structure 4704. In some implementations, a first side of substrate 4750 is in contact with semiconductor structure 4704. In some implementations, the first side of substrate 4750 is in electric contact with second end 4714. In some implementations, the first side of substrate 4750 is in electric contact with bit line 4722.

As shown in FIG. 59 and operation 6206 in FIG. 62, a peripheral circuit is formed on a second side of substrate 4750. In some implementations, the peripheral circuit may include a plurality of peripheral devices 4782. The peripheral circuits (a.k.a. control and sensing circuits) can include any suitable digital, analog, and/or mixed-signal circuits used for facilitating the operations of the memory cell array. For example, the peripheral circuit can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits use complementary metal-oxide-semiconductor (CMOS) technology, e.g., which can be implemented with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations.

Figure 60:
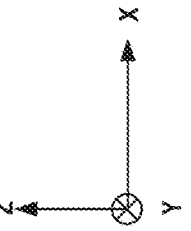

As shown in FIG. 60, supporting substrate 4780 may be formed on the peripheral circuit, and the whole structure may be flipped over to perform the following operations.

Figure 61:
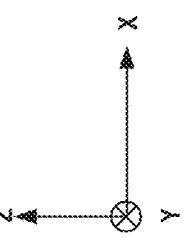
Figure 62:
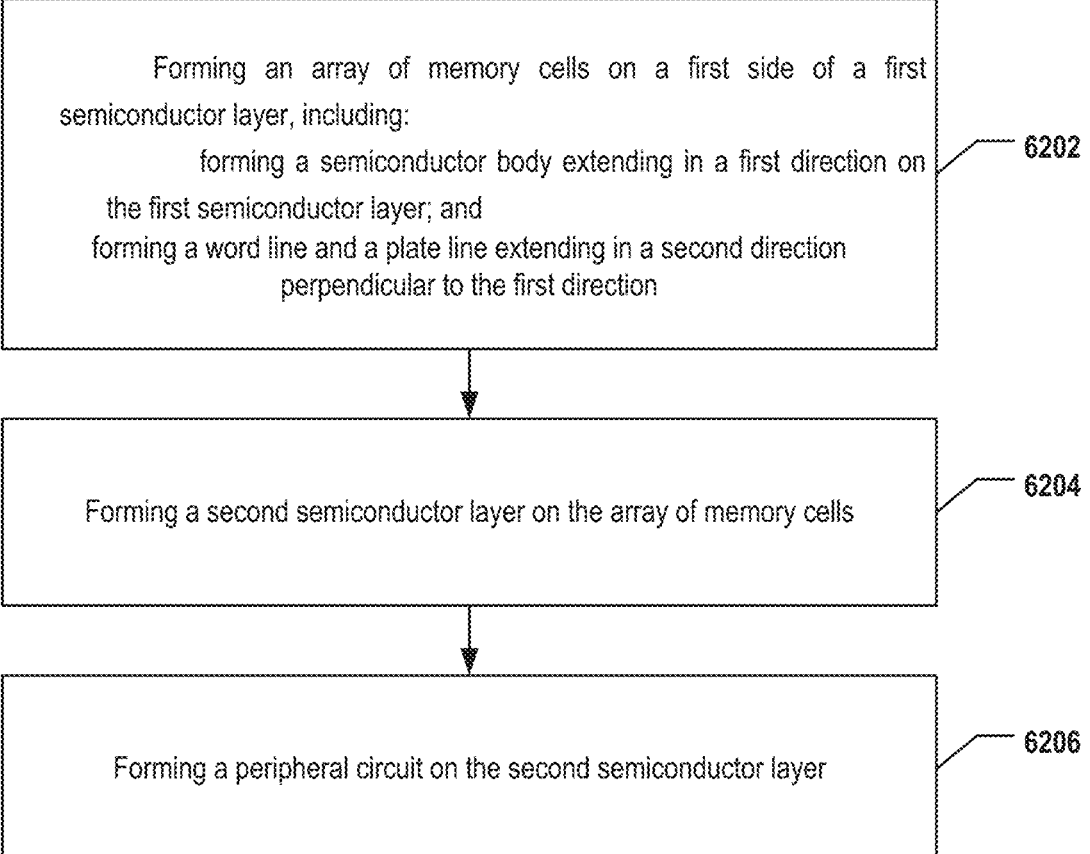
FIG. 62 illustrates a flowchart of a method for forming a memory device, according to some aspects of the present disclosure.

As shown in FIG. 61, a removal operation, e.g., a CMP process, may be performed on the second side of substrate 4702 to thin substrate 4702. In some implementations, pad-out structures 4752 and 4754 may be formed on the second side of substrate 4702.

By utilizing method 6200, memory device 4700 may have a vertical arrangement of the source/drain terminals, which can reduce the area of the transistor as well as simplify the layout of the interconnect structures and reduce the fabrication complexity. In addition, memory device 4700 does not need a capacitor storage device to store data. Furthermore, the memory cell array and the peripheral circuits can be formed separately on different substrates to save the cycle time of fabrication. Depending on different applications, the pad-out structure may be designed on the front side or the back side of the memory array. It is understood that method 6200 may also be applied for the fabrication of memory devices 4800, 4900, 5000, 5100, and 5200 as well.

Figure 63:
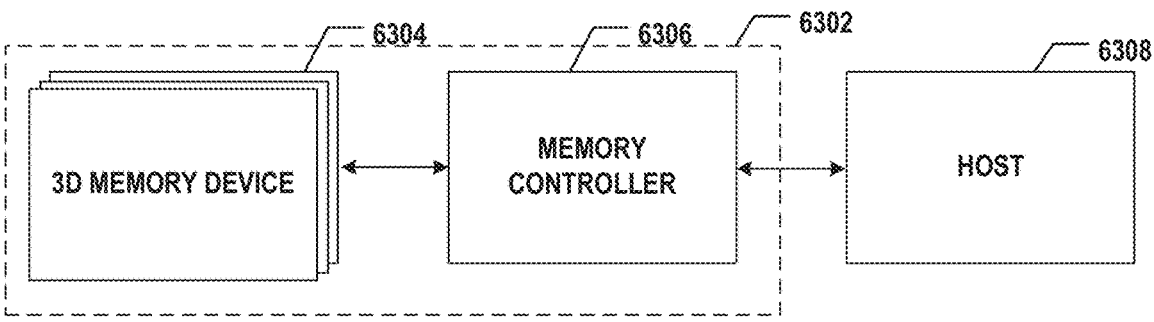
FIG. 63 illustrates a block diagram of an exemplary system having a memory device, according to some aspects of the present disclosure.

FIG. 63 illustrates a block diagram of an exemplary system 6300 having a memory device, according to some aspects of the present disclosure. System 6300 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 63, system 6300 can include a host 6308 and a memory system 6302 having one or more memory devices 6304 and a memory controller 6306. Host 6308 can be a processor of an electronic device, such as a central processing unit (CPU), or a system-on-chip (SoC), such as an application processor (AP). Host 6308 can be configured to send or receive data to or from memory devices 6304.

Memory device 6304 can be any memory device disclosed in the present disclosure. As disclosed above in detail, memory device 6304, such as a DFM device, may have a controlled and predefined discharge current in the discharge operation of discharging the bit lines. Memory controller 6306 is coupled to memory device 6304 and host 6308 and is configured to control memory device 6304, according to some implementations. Memory controller 6306 can manage the data stored in memory device 6304 and communicate with host 6308. For example, memory controller 6306 may be coupled to memory device 6304, such as memory devices described above, and memory controller 6306 may be configured to control the operations of the memory cell, e.g., the DFM cell, through the peripheral device.

In some implementations, memory controller 6306 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 6306 is designed for operating in a high duty-cycle environment SSDs or embedded multi-media-cards (eMMCs) used as data storage for mobile devices, such as smartphones, tablets, laptop computers, etc., and enterprise storage arrays. Memory controller 6306 can be configured to control operations of memory device 6304, such as read, erase, and program operations. Memory controller 6306 can also be configured to manage various functions with respect to the data stored or to be stored in memory device 6304 including, but not limited to bad-block management, garbage collection, logical-to-physical address conversion, wear leveling, etc. In some implementations, memory controller 6306 is further configured to process error correction codes (ECCs) with respect to the data read from or written to memory device 6304. Any other suitable functions may be performed by memory controller 6306 as well, for example, formatting memory device 6304. Memory controller 6306 can communicate with an external device (e.g., host 6308) according to a particular communication protocol. For example, memory controller 6306 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 64A:
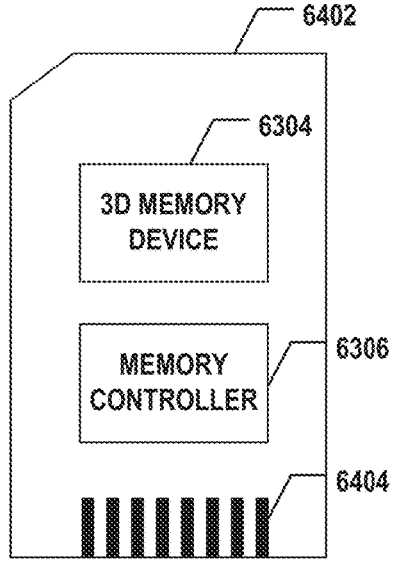
FIG. 64A illustrates a diagram of an exemplary memory card having a memory device, according to some aspects of the present disclosure.
Figure 64B:
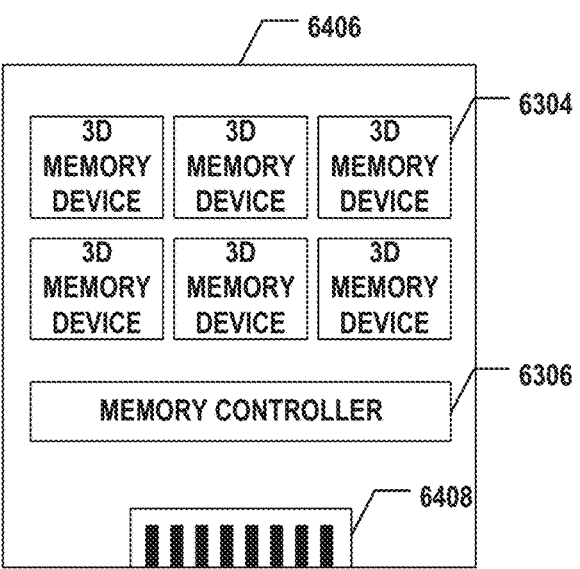
FIG. 64B illustrates a diagram of an exemplary solid-state drive (SSD) having a memory device, according to some aspects of the present disclosure.

Memory controller 6306 and one or more memory devices 6304 can be integrated into various types of storage devices, for example, be included in the same package, such as a universal Flash storage (UFS) package or an eMMC package. That is, memory system 6302 can be implemented and packaged into different types of end electronic products. In one example as shown in FIG. 64A, memory controller 6306 and a single memory device 6304 may be integrated into a memory card 6402. Memory card 6402 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 6402 can further include a memory card connector 6404 coupling memory card 6402 with a host (e.g., host 6308 in FIG. 63). In another example as shown in FIG. 64B, memory controller 6306 and multiple memory devices 6304 may be integrated into an SSD 6406. SSD 6406 can further include an SSD connector 6408 coupling SSD 6406 with a host (e.g., host 6308 in FIG. 63). In some implementations, the storage capacity and/or the operation speed of SSD 6406 is greater than those of memory card 6402.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A memory device, comprising:
an array of memory cells disposed on a first side of a first semiconductor layer, wherein each of the memory cells comprises:
a semiconductor body extending in a first direction, wherein a first terminal in contact with the first side of the first semiconductor layer and a second terminal are formed at both ends of the semiconductor body;
a word line extending in a second direction perpendicular to the first direction; and
a plate line extending in the second direction; and
a pad-out structure disposed on the array of memory cells, wherein the second terminal is in contact with a second semiconductor layer.

2. The memory device of claim 1, wherein the pad-out structure is in contact with the second terminal.

3. The memory device of claim 2, wherein the pad-out structure is in contact with the second terminal through a contact structure extending in the first direction.

4. The memory device of claim 3, wherein the contact structure extends through the first semiconductor layer.

5. The memory device of claim 1, wherein the pad-out structure is disposed on a second side of the first semiconductor layer.

6. The memory device of claim 1, further comprising:
a first dielectric layer disposed between the semiconductor body and the word line and the plate line.

7. The memory device of claim 1, further comprising:
a split structure extending in the first direction between two memory cells.

8. The memory device of claim 7, wherein the split structure comprises:
a split core; and
a second dielectric layer surrounding the split core, wherein the second dielectric layer is disposed between a first end of the split core and the first semiconductor layer.

9. The memory device of claim 1, further comprising:
a peripheral circuit disposed on the second semiconductor layer.

10. The memory device of claim 9, wherein the peripheral circuit is disposed on a first side of the second semiconductor layer, and the second terminal is in contact with a second side of the second semiconductor layer.

11. A memory device, comprising:
an array of memory cells disposed on a first side of a first semiconductor layer, wherein each of the memory cells comprises:
a semiconductor body extending in a first direction, wherein a first terminal in contact with the first side of the first semiconductor layer and a second terminal are formed at both ends of the semiconductor body;
a word line extending in a second direction perpendicular to the first direction; and
a plate line extending in the second direction; and
a peripheral circuit disposed on a first side of a second semiconductor layer,
wherein a second side of the second semiconductor layer is in contact with the array of memory cells.

12. The memory device of claim 11, wherein the second side of the second semiconductor layer is in contact with the second terminal.

13. The memory device of claim 11, further comprising:
a pad-out structure disposed on a second side of the first semiconductor layer.

14. The memory device of claim 13, wherein the pad-out structure is in contact with the second terminal through a contact structure extending in the first direction.

15. The memory device of claim 14, wherein the contact structure extends through the first semiconductor layer.

16. The memory device of claim 14, wherein the array of memory cells and the pad-out structure are disposed on two opposite sides of the first semiconductor layer.

17. The memory device of claim 11, further comprising:
a split structure extending in the first direction between two memory cells.

18. A method for forming a memory device, comprising:
forming an array of memory cells on a first side of a first semiconductor layer, wherein forming each of the array of memory cells comprises:
forming a semiconductor body extending in a first direction on the first semiconductor layer; and
forming a word line and a plate line extending in a second direction perpendicular to the first direction; and
forming a second semiconductor layer on the array of memory cells, comprising:
forming a first terminal in contact with the first semiconductor layer and a second terminal away from the first semiconductor layer at both ends of the semiconductor body; and
forming the second semiconductor layer on the array of memory cells, wherein a first side of the second semiconductor layer is in contact with the second terminal; and
forming a peripheral circuit on the second semiconductor layer.

19. The method of claim 18, further comprising:
forming a pad-out structure on a second side of the first semiconductor layer.

20. The method of claim 18, further comprising:
forming a split structure extending in the first direction between two memory cells.

* * * * *